US010078712B2

(12) United States Patent
Bacon et al.

(10) Patent No.: US 10,078,712 B2
(45) Date of Patent: Sep. 18, 2018

(54) DIGITAL PROXY SIMULATION OF ROBOTIC HARDWARE

(71) Applicant: Energid Technologies Corporation, Cambridge, MA (US)

(72) Inventors: James A. Bacon, Bourbonnais, IL (US); Douglas E. Barker, Watertown, MA (US); Xi Chen, Waltham, MA (US); James D. English, Newton, MA (US)

(73) Assignee: ENERGID TECHNOLOGIES CORPORATION, Cambridge, MA (US)

( * ) Notice: Subject to any disclaimer, the term of this patent is extended or adjusted under 35 U.S.C. 154(b) by 0 days.

(21) Appl. No.: 14/154,873

(22) Filed: Jan. 14, 2014

(65) Prior Publication Data

US 2015/0199458 A1    Jul. 16, 2015

(51) Int. Cl.
*G06F 17/50* (2006.01)
*G05B 19/04* (2006.01)
*B25J 9/16* (2006.01)

(52) U.S. Cl.
CPC ..... *G06F 17/5009* (2013.01); *G05B 19/0405* (2013.01); *B25J 9/163* (2013.01); *B25J 9/1605* (2013.01); *B25J 9/1664* (2013.01); *B25J 9/1671* (2013.01); *G05B 2219/37092* (2013.01); *G05B 2219/40131* (2013.01); *Y10S 901/41* (2013.01)

(58) Field of Classification Search
None
See application file for complete search history.

(56) References Cited

U.S. PATENT DOCUMENTS

| | | | | |
|---|---|---|---|---|
| 4,987,527 A | * | 1/1991 | Hamada | G05B 19/425 345/157 |
| 5,526,254 A | * | 6/1996 | Sato et al. | 700/56 |
| 5,598,076 A | * | 1/1997 | Neubauer et al. | 318/568.22 |
| 6,445,964 B1 | * | 9/2002 | White et al. | 700/61 |
| 7,653,522 B2 | | 1/2010 | Peralta et al. | |
| 8,024,682 B2 | | 9/2011 | McConaghy et al. | |
| 8,301,421 B2 | * | 10/2012 | Bacon et al. | 703/2 |
| 9,643,314 B2 | * | 5/2017 | Guerin | B25J 9/1605 |

(Continued)

OTHER PUBLICATIONS

Baillieul, John, "Kinematic Programming Alternatives for Redundant Manipulators," Boston University, 1985, pp. 722-728.

(Continued)

*Primary Examiner* — Kibrom K Gebresilassie
(74) *Attorney, Agent, or Firm* — Mark H. Whittenberger, Esq.; Holland & Knight LLP

(57) ABSTRACT

A computer-implemented method, computer program product, and computing system is provided for a digital proxy simulation of robotic hardware. In an implementation, a method may include creating a digital proxy simulation for a robotic hardware wherein the digital simulation and the robotic hardware may share a network interface. a user may be provided with an option to switch between the robotic hardware and the digital proxy simulation. The switch may be executed, upon receiving a user selection, between the robotic hardware and the digital proxy simulation, wherein executing the switch includes transferring input and output signals between the digital proxy simulation and the robotic hardware.

28 Claims, 33 Drawing Sheets

(56) References Cited

U.S. PATENT DOCUMENTS

| | | | | |
|---|---|---|---|---|
| 2002/0133264 | A1* | 9/2002 | Maiteh | G05B 19/4097 700/182 |
| 2003/0120391 | A1* | 6/2003 | Saito | B25J 9/1671 700/264 |
| 2004/0030449 | A1* | 2/2004 | Solomon | 700/245 |
| 2004/0199288 | A1* | 10/2004 | Watanabe | B25J 9/1671 700/245 |
| 2004/0254771 | A1* | 12/2004 | Riener et al. | 703/7 |
| 2006/0111811 | A1* | 5/2006 | Okamoto et al. | 700/214 |
| 2006/0184275 | A1* | 8/2006 | Hosokawa et al. | 700/245 |
| 2006/0274070 | A1* | 12/2006 | Herman | A63F 13/10 345/474 |
| 2007/0071310 | A1* | 3/2007 | Kobayashi | B25J 9/1666 382/153 |
| 2007/0073442 | A1* | 3/2007 | Aghili | 700/245 |
| 2007/0150104 | A1* | 6/2007 | Jang et al. | 700/245 |
| 2007/0233280 | A1* | 10/2007 | Bacon et al. | 700/1 |
| 2007/0244599 | A1* | 10/2007 | Tsai et al. | 700/245 |
| 2007/0250212 | A1* | 10/2007 | Halloran et al. | 700/245 |
| 2007/0282485 | A1* | 12/2007 | Nagatsuka | B25J 9/1671 700/245 |
| 2008/0013825 | A1* | 1/2008 | Nagatsuka | B25J 9/1671 382/153 |
| 2008/0094408 | A1* | 4/2008 | Yin | G06T 15/005 345/581 |
| 2008/0103639 | A1* | 5/2008 | Troy | G05D 1/0027 701/2 |
| 2008/0301072 | A1* | 12/2008 | Nagatsuka | B25J 9/1669 706/12 |
| 2009/0182844 | A1* | 7/2009 | Barton | G06F 17/30905 709/219 |
| 2010/0152899 | A1* | 6/2010 | Chang et al. | 700/262 |
| 2010/0174422 | A1* | 7/2010 | Jacobsen | G05D 1/0044 701/2 |
| 2010/0315416 | A1* | 12/2010 | Pretlove | G06T 7/001 345/419 |
| 2011/0046783 | A1* | 2/2011 | Benchikh | B25J 9/1671 700/254 |
| 2011/0216179 | A1* | 9/2011 | Dialameh | G06F 17/30247 348/62 |
| 2012/0166165 | A1* | 6/2012 | Nogami | B25J 9/1671 703/6 |
| 2012/0290130 | A1* | 11/2012 | Kapoor | B25J 9/1671 700/247 |
| 2013/0147944 | A1* | 6/2013 | Zhang | B25J 9/1661 348/95 |
| 2013/0211587 | A1* | 8/2013 | Stephens, Jr. | 700/246 |
| 2013/0211594 | A1* | 8/2013 | Stephens, Jr. | B25J 9/1689 700/259 |
| 2014/0267273 | A1* | 9/2014 | Kontkanen | G06T 15/04 345/426 |
| 2015/0057801 | A1* | 2/2015 | Stephens, Jr. | B25J 9/1689 700/259 |
| 2015/0336267 | A1* | 11/2015 | Sun | B25J 9/163 700/161 |
| 2015/0364060 | A1* | 12/2015 | Gupta | B25J 9/0081 434/118 |
| 2016/0046023 | A1* | 2/2016 | Nagendran | B25J 9/1689 700/248 |
| 2016/0054868 | A1* | 2/2016 | Roy | G06T 15/005 345/520 |
| 2016/0257000 | A1* | 9/2016 | Guerin | B25J 9/1605 |
| 2017/0203438 | A1* | 7/2017 | Guerin | B25J 9/1605 |

OTHER PUBLICATIONS

Baraff, David, "Coping with Friction for Non-penetrating Rigid Body Simulation," Computer Graphics, vol. 25, No. 4, Jul. 1991, pp. 31-40.

Bergen, Gino van den, "Proximity Queries and Penetration Depth Computation on 3D Game Objects," pp. 1-17.

Bergen, Gino van den, "A Fast and Robust GJK Implementation for Collision Detection of Convex Objects," Department of Mathematics and Computing Science, Endhoven University of Technology, Jul. 6, 1999, pp. 1-20.

Bui, Ha H., et al., "SPH-Based Numerical Simulations for Large Deformation of Geomaterial Considering Soil-Structure Interaction," The 12th International Conference of International Association for Computer Methods and Advances in Geomechanics (IACMAG), Oct. 1-6, 2008, pp. 570-578.

Dai, Ran, "Path Planning of Solar-Powered Unmanned Aerial Vehicles at Low Altitude," Invited Paper, Aerospace Engineering Department, Iowa State University, 2013, pp. 693-696.

Donzé, Frédéric V., et al., "Advances in Discrete Element Method Applied to Soil, Rock and Concrete Mechanics," EJGE, 2009, pp. 1-44.

Doty, Keith L., et al., "A Theory of Generalized Inverses Applied to Robotics," The International Journal of Robotics Research, vol. 12, No. 1, Feb. 1993, pp. 1-19.

Egeland, Olav, "Task-Space Tracking with Redundant Manipulators," The Journal of Robotics and Automation, vol. RA-3, No. 5, Oct. 1987, pp. 471-475.

English, James D., et al., "Numerical Integration and Digital-Model Updates in the AIM-9X Simulation," 1998, pp. 1-8.

English, James D., et al., "On the Implementation of Velocity Control for Kinematically Redundant Manipulators," IEEE Transactions on Systems, Man, and Cybernetics—Part A: Systems and Humans, vol. 30, No. 3, May 2000, pp. 233-237.

Featherstone, Roy, "Robot Dynamics Algorithms," The Kluwer International Series in Engineering and Computer Science, Robotics: Vision, Manipulation and Sensors, 1987, pp. 1-211.

Fijany, Amir, et al. "An Efficient Algorithm for Computation of Manipulator Inertia Matrix," 1990, pp. 57-80.

Gao, Yudong, et al., "Design and Development of Hardware-in-Loop Simulation of Spacecraft Attitude Control System Based on Wireless Ad Hoc Networking," 2012 International Conference on Industrial Control and Electronics Engineering, 2012, pp. 584-587.

Holz, Daniel, et al., "Soil Deformation Models for Real-Time Simulation: A Hybrid Approach," Workshop on Virtual Reality Interaction and Physical Simulation VRIPHYS, 2009, pp. 1-10.

Homen-de-Mello, Tito, et al., "Monte Carlo Sampling-Based Methods for Stochastic Optimization," Mar. 14, 2013, pp. 1-72.

Hooke, Robert, et al., "Direct Search Solution of Numerical and Statistical Problems," Westinghouse Research Laboratories, 1961, pp. 212-229.

Huang, Ming Z., et al., "Optimal Rate Allocation in Kinematically Redundant Manipulators—The Dual Projection Method," Proceedings of the 1991 IEEE International Conference on Robotics and Automation, Apr. 1991, pp. 702-707.

Iscen, Atil, et al., "Controlling Tensegrity Robots through Evolution," 2013, pp. 1-8.

Ishigami, Genya, et al., "Terramechanics-based Model for Steering Maneuver of Planetary Exploration Rovers on Loose Soil," 2007, pp. 1-24.

Jakob, Christian, et al., "Particle Methods," Oct. 23, 2012, pp. 1-23.

Kenyon, Astrid S., et al., "Stochastic Vehicle Routing with Random Travel Times," Transportation Science, vol. 37, No. 1, Feb. 2003, pp. 69-82.

Klein, Charles A., et al., "Review of Pseudoinverse Control for Use with Kinematically Redundant Manipulators," IEEE Transactions on Systems, Man, and Cybernetics, vol. SMC-13, No. 3, Mar./Apr. 1983, pp. 245-250.

Klesh, Andrew T., et al., "Solar-Powered Aircraft: Energy-Optimal Path Planning and Perpetual Endurance," Journal of Guidance, Control, and Dynamics, vol. 32, No. 4, Jul.-Aug. 2009, pp. 1320-1329.

Lane, John E., et al., "A Review of Discrete Element Method (DEM) Particle Shapes and Size Distributions for Lunar Soil," Dec. 2010, pp. 1-36.

Lichtenheldt, Roy, et al., "Locomotion on Soft Granular Soils: A Discrete Element Based Approach for Simulations in Planetary Exploration," 2013, pp. 1-8.

(56) References Cited

OTHER PUBLICATIONS

Loftin, Kathleen, et al., "Integration and Ruggedization of a Commercially Available Gas Chromatograph and Mass Spectrometer (GCMS) for the Resource Prospector Mission (RPM)," Presentation to HEMS, Sep. 2013, pp. 1-83.
Luding, Stefan, "Basics of Contact Force Models and how to perform the Micro-Macro Transition to Continuum Theory," Introduction to Discrete Element Methods, Dec. 2008, pp. 785-826.
Marhefka, Duane W., et al., "A Compliant Contact Model with Nonlinear Damping for Simulation of Robotic Systems," IEEE Transactions of Systems, Man, and Cybernetics—Part A: Systems and Humans, vol. 29, No. 6, Nov. 1999, pp. 566-572.
Nelder, J.A., et al., "A simplex method for function minimization," 1965, pp. 308-313.
Obermayr, Martin, et al., "Prediction of draft forces in cohesionless soil with the Discrete Element Method," Journal of Terramechanics 48, 2011, pp. 347-358.
Ohki, Takeshi, et al., "Path Planning for Mobile Robot on Rough Terrain based on Sparse Transition Cost Propagation in Extended Elevation Maps," Proceedings of 2013 IEEE International Conference on Mechatronics and Automation, Aug. 4-7, 2013, pp. 494-499.
Patel, Nildeep, et al., "Application of Bekker Theory for Planetary Exploration through Wheeled, Tracked and Legged Vehicle Locomotion," American Institute of Aeronautics and Astronautics, 2004, pp. 1-9.
Qinsen, Yang, et al., "A Soil-Tool Interaction Model for Bulldozer Blades," Journal of Terramechanics, vol. 31, No. 2, 1994, pp. 55-65.
Seraji, Homayoun, "Configuration Control of Redundant Manipulators: Theory and Implementation," IEEE Transactions on Robotics and Automation, vol. 5, No. 4, Aug. 1989, pp. 472-490.
Seraji, Homayoun, et al., "Improved Configuration Control for Redundant Robots," Journal of Robotic Systems, 1990, pp. 897-928.
Torczon, Virginia, "On the Convergence of Pattern Search Algorithms," CRPC-TR93322, Jun. 1993, pp. 1-31.
Urbán, Márton, et al., "Investigation of the soil-tool interaction by SPH (Smooth Particle Hydrodynamics) based simulation," 2013, pp. 1-6.
Walker, M.W., et al., "Efficient Dynamic Computer Simulation of Robotic Mechanisms," Journal of Dynamic Systems, Measurement, and Control, vol. 104, Sep. 1982, pp. 205-211.
Wei, R., et al., "High Fidelity Distributed Hardware-in-the-Loop Simulation for Space Robot on CAN-based Network," Proceedings of the 2006 IEEE/RSJ International Conference on Intelligent Robots and Systems, Oct. 9-15, 2006, pp. 5106-5111.
Yamane, Katsu, et al., "Stable Penalty-Based Model of Frictional Contacts," Proceedings of the 2006 IEEE International Conference on Robotics and Automation, May 2006, pp. 1904-1909.
Yoshida, Kazuya, et al., "Steering Characteristics of a Rigid Wheel for Exploration on Loose Soil," Proceedings of 2004 IEEE/RSJ International Conference on Intelligent Robots and Systems, Sep. 28-Oct. 2, 2004, pp. 3995-4000.
Yuan, Xie, et al., "Dynamic Mission-level Path Planning for Lunar Rovers," International Conference on Control, Automation and Systems, Oct. 27-30, 2010, pp. 56-61.
Zghal, H., et al., "Efficient Gradient Projection Optimization for Manipulators with Multiple Degrees of Redundancy," 1990, pp. 1006-1011.

* cited by examiner

No noise           0.007 m and 0.008 m

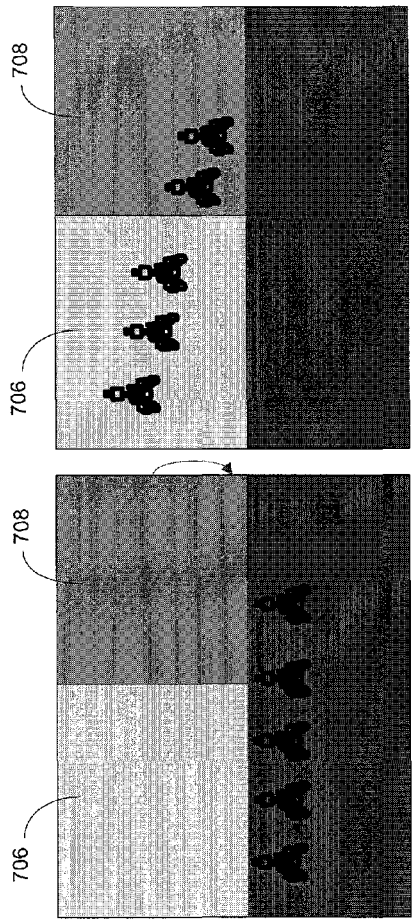
FIG. 36
FIG. 37
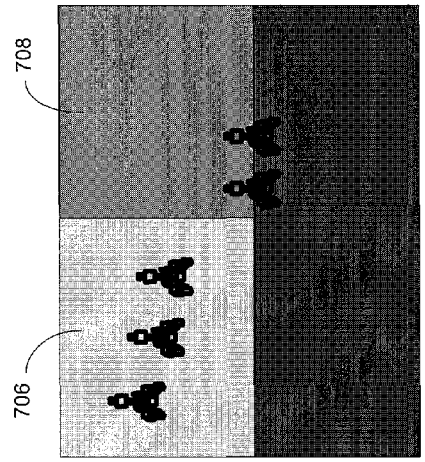
FIG. 38

DIGITAL PROXY SIMULATION OF ROBOTIC HARDWARE

GOVERNMENT LICENSE RIGHTS TO CONTRACTOR-OWNED INVENTIONS MADE UNDER FEDERALLY SPONSORED RESEARCH AND DEVELOPMENT

The U.S. Government has a paid-up license in this invention and the right in limited circumstances to require the patent owner to license others on reasonable terms as provided for by the terms of NASA contracts NNX10CC40P and NNX11CA22C.

TECHNICAL FIELD

The present disclosure generally relates to robotic systems and methods. More specifically, the present disclosure is directed towards robotic simulation.

BACKGROUND

It is a common practice to perform field tests in preparation for lunar and planetary missions. A robot field test for robotic lunar and planetary missions performed by NASA may involve a number of people. There are many obstacles that NASA may need to overcome in order to achieve a reasonably close environment as that encountered in these lunar and planetary missions. Maintaining a group of people that perform the robot field test in remote locations may be taxing on the individuals and the institution that supports them. Also, the use of a real-world location may impose some undesirable constraints on the field tests.

SUMMARY OF DISCLOSURE

According to an implementation, a computer-implemented method may include creating, by one or more processors, a digital proxy simulation for a robotic hardware wherein the digital simulation and the robotic hardware may share a network interface. The method may also include providing a user with an option to switch between the robotic hardware and the digital proxy simulation. The method may also include upon receiving a user selection, executing the switch between the robotic hardware and the digital proxy simulation, wherein executing the switch includes transferring input and output signals between the digital proxy simulation and the robotic hardware.

One or more of the following features may be included. The robotic hardware may be at least one of a mobile robot, a fixed base articulated serial manipulator, a moving base articulated serial manipulator, a fixed base articulated robot with branching links, and a moving base articulated robot with branching links. The digital proxy simulation includes, at least in part, a sensor simulation, a kinematic simulation, a dynamic simulation, and an environment simulation. The method may further include executing the digital proxy simulation using at least one of network communications and network communications over the Internet. The network communications and the network communication over the Internet may be provided using Data Distribution Service (DDS) for real-time systems. The robotic hardware and the digital proxy simulation have the same network interface. The environment simulation may include, at least in part, a terrain simulation and an interaction with the robotic hardware. The movement of the robotic hardware may be rendered at least on one of a computer and a handheld electronic device. The dynamic simulation may include numerical integration of Newton's and Euler's dynamic equations for moving parts.

According to another implementation, a computer program product may include a computer readable medium having a plurality of instructions stored thereon. When executed by a processor, the instructions may cause the processor to perform operations including creating a digital proxy simulation for a robotic hardware wherein the digital proxy simulation and the robotic hardware share a network interface. Instructions may be included for providing a user with an option to switch between the robotic hardware and the digital proxy simulation. Instructions may be included for, upon receiving a user selection, executing the switch between the robotic hardware and the digital proxy simulation, wherein executing the switch includes transferring input and output signals between the digital proxy simulation and the robotic hardware.

One or more of the following features may be included. The robotic hardware may be at least one of a mobile robot, a fixed base articulated serial manipulator, a moving base articulated serial manipulator, a fixed base articulated robot with branching links, and a moving base articulated robot with branching links. The digital proxy simulation includes, at least in part, a sensor simulation, a kinematic simulation, a dynamic simulation, and an environment simulation. The instructions may further be included for executing the digital proxy simulation using at least one of network communications and network communications over the Internet. The network communications and the network communication over the Internet may be provided using Data Distribution Service (DDS) for real-time systems. The robotic hardware and the digital proxy simulation have the same network interface. The environment simulation may include, at least in part, a terrain simulation and an interaction with the robotic hardware. The movement of the robotic hardware may be rendered at least on one of a computer and a handheld electronic device. The dynamic simulation may include numerical integration of Newton's and Euler's dynamic equations for moving parts.

According to another aspect of the disclosure, a computing system may include at least one processor device and at least one memory architecture coupled with the at least one processor device. The at least one processor device may be configured to create a digital proxy simulation for a robotic hardware wherein the digital proxy simulation and the robotic hardware share a network interface. The at least one processor device may also be configured to provide a user with an option to switch between the robotic hardware and the digital proxy simulation. The at least one processor device may also be configured to, upon receiving a user selection, execute the switch between the robotic hardware and the digital proxy simulation, wherein executing the switch includes transferring input and output signals between the digital proxy simulation and the robotic hardware.

One or more of the following features may be included. The robotic hardware may be at least one of a mobile robot, a fixed base articulated serial manipulator, a moving base articulated serial manipulator, a fixed base articulated robot with branching links, and a moving base articulated robot with branching links. The digital proxy simulation includes, at least in part, a sensor simulation, a kinematic simulation, a dynamic simulation, and an environment simulation. The at least one processor device may be configured to further include executing the digital proxy simulation using at least one of network communications and network communications over the Internet. The network communications and the network communication over the Internet may be provided using Data Distribution Service (DDS) for real-time systems. The robotic hardware and the digital proxy simulation have the same network interface. The environment simulation may include, at least in part, a terrain simulation and an interaction with the robotic hardware. The movement of the robotic hardware may be rendered at least on one of a computer and a handheld electronic device. The dynamic simulation may include numerical integration of Newton's and Euler's dynamic equations for moving parts.

The details of one or more implementations are set forth in the accompanying drawings and the description below. Other features and advantages will become apparent from the description, the drawings, and the claims.

BRIEF DESCRIPTION OF THE DRAWINGS

FIG. 36 depicts a diagram consistent with the processes of the present disclosure;

FIG. 37 depicts a diagram consistent with the processes of the present disclosure;

FIG. 38 depicts a diagram consistent with the processes of the present disclosure;

Like reference symbols in the various drawings indicate like elements.

DETAILED DESCRIPTION

Figure 1:
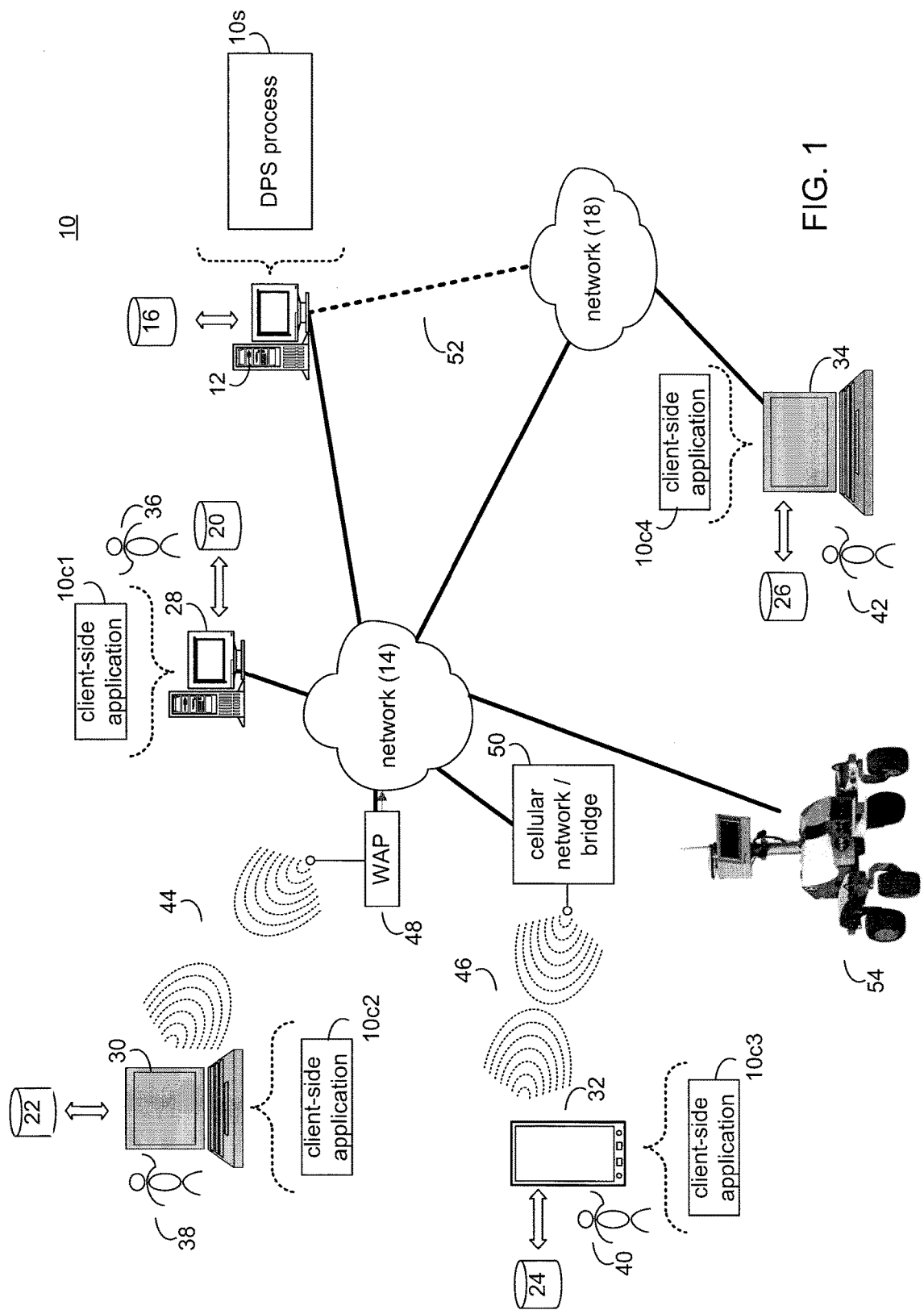
FIG. 1 is a diagrammatic view of a distributed computing network including a computing device that executes an DPS process according to an implementation of the present disclosure.

Generally, the present disclosure provides systems and apparatuses for replacing robotic vehicles in field tests and similar scenarios with a simulation. Specifically, in some embodiments, the present disclosure may be used to switch between a digital proxy simulation for a physical robotic device and the actual robotic device. In other words, an operator of the robotic hardware may be able to either operate the robotic hardware or operate the digital proxy simulation of that robotic hardware. The software system may replace robotic devices (e.g. robotic vehicles) in field tests (and similar scenarios) with a digital simulation. A digital simulation may allow a user to perform an action on a computing device in order to seamlessly switch between the robotic hardware and the digital proxy simulation of that robotic hardware. For example, during robotic hardware field tests, validation of the robotic hardware or training using the robotic hardware, a user may be able to switch back and forth between the robotic hardware, where the user now is able to control the robotic hardware operations and the digital proxy simulation, where the user is able to control the digital proxy simulation of the robotic hardware.

In some embodiments, the simulation may be triggered with an action (e.g., double-click execution) on a networked user device (e.g., client electronic devices 28, 30, 32, 34) to seamlessly serve as a replacement for robot communications, actuation, control systems, power systems, sensors, environmental interactions, and behavior. The simulation may incorporate physics-based modeling of wheel-terrain interaction and obstacle collisions. The software used for the simulation may be generic and may work with other existing robotic devices (e.g., NASA's mobile robotic vehicles, such as the K10 and the ATHLETE and with new early and experimental systems).

For illustration purposes, NASA will be used as an example of a provider of robotic hardware to be seamlessly replaced by a simulation using software, however, other providers of robotic hardware may be used. Although the NASA is an example of a provider of robotic hardware (e.g., K10 and ATHLETE) the applicability of DPS process 10, may be used outside of NASA robotic hardware and may support robotic systems developers across the spectrum of robotics domains, including, but not limited to, defense, home use, etc. DPS process 10 may also be integrated as an add-on to one or more software applications. Additionally/alternatively, by linking the software libraries into third-party code, developers may have full access to all the capability provided by the toolkit. The new capability may allow developers to leverage terrains and remote-control technologies into new applications.

Using the NASA example, NASA may hold field tests to prepare for lunar and planetary missions. A robot field test may involve three groups of 10-20 people depending on the application. The first group may plan the mission—a process that includes (often animated) debate among scientists, discussion of the state of the robot, analysis of sensor data, including lidar and visual sensor data (stitched into mosaics) on personal and group-level screens, and prediction of robot performance. The second group may control the operation of the robot. This group may transition between autonomous operation and direct control as needed, may analyze diagnostic data, and may monitor communications. The third group may travel to a remote location with terrain matching the needs of the test—such as the desert southwest, the Arctic, or Antarctica—with robot hardware. This third group may monitor the robot, may maintain and may repair it, and may move it to locations that support the needs of scientists.

A digital proxy simulation may simulate the robot and may replace the robot in the field. Maintaining the remote field group may be taxing on the individuals and the institution that supports them, and organizing a field test without this component will be easier and more efficient. Also, the use of a real-world location imposes some undesirable constraints on the tests. Terrain in Arizona or Antarctica may not fit NASA's goals for simulating the lunar and planetary missions because constraints such as gravity, soil, and communications. And physical operation is deficient in truth data. A digital simulation may represent any number of robots on a terrain that may be relevant to NASA and may provide ground data for comparison with sensor data during analysis.

It is understood that DPS process 10 may be implemented in any programming language, such as Java, C, C++, C#, or Python. DPS process 10 may interface over a variety of network protocols, such as TCP, UDP, or others. Other operating systems besides Linux, Windows, or Mac OS may be used. DPS process 10, may be physics-based and may rely on the fundamental equations of motion (Newton's and Euler's formulas). It is understood that the engineering specifications will vary from robot to robot. It is also understood that DPS process 10, may apply to any robot. It is understood that DPS process 10, may executes on a computer with Linux, Windows, or Mac OS. DPS process 10 may require maintenance for upgrades to new operating systems or new robot control systems.

According to an embodiment, methods and systems may be provided for digital proxy simulation of a robot.

Referring to FIG. 1, there is shown a Digital Proxy Simulation (DPS) process 10 for simulating a robotic physical device. For the following discussion, it is intended to be understood that DPS process 10 may be implemented in a variety of ways. For example, DPS process 10 may be implemented as a server-side process, a client-side process, or a hybrid server-side/client-side process.

For example, DPS process 10 may be implemented as a purely server-side process via DPS process 10s. Alternatively, DPS process 10 may be implemented as a purely client-side process via one or more of client-side application 10c1, client-side application 10c2, client-side application 10c3, and client-side application 10c4. Alternatively still, DPS process 10 may be implemented as a server-side/client-side process via screen DPS process 10s in combination with one or more of client-side application 10c1, client-side application 10c2, client-side application 10c3, and client-side application 10c4. In such an example, at least a portion of the functionality of DPS process 10 may be performed by DPS process 10s and at least a portion of the functionality of DPS process 10 may be performed by one or more of client-side application 10c1, 10c2, 10c3, and 10c4.

Accordingly, DPS process 10 as used in disclosure may include any combination of DPS process 10s, client-side application 10c1, client-side application 10c2, client-side application 10c3, and client-side application 10c4.

Figure 2:
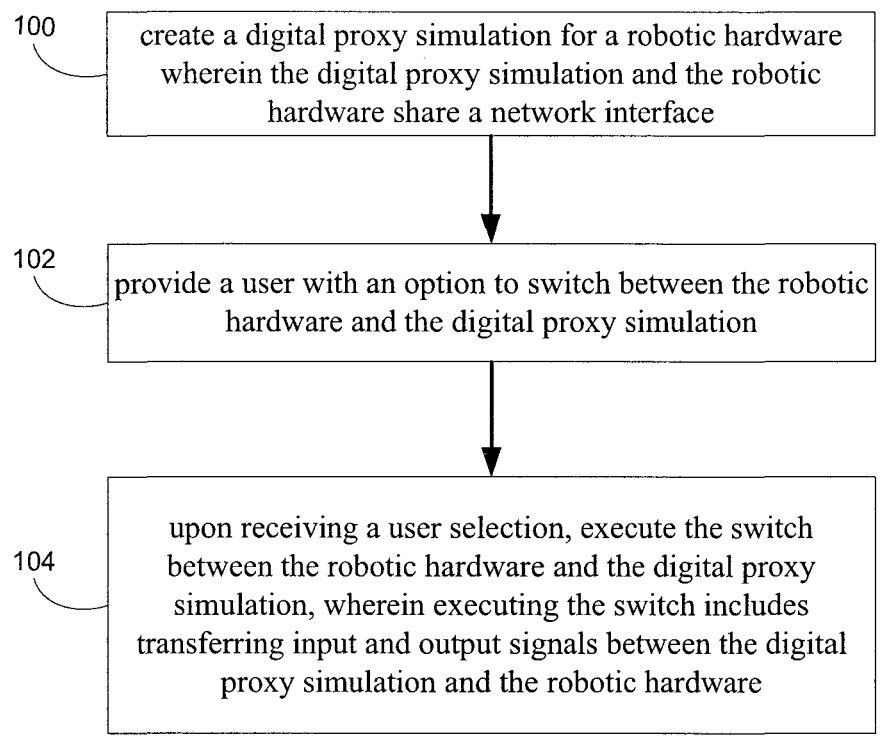
FIG. 2 is a flowchart of the DPS process of FIG. 1, according to an implementation of the present disclosure.

Referring also to FIG. 2, and as will be discussed in greater detail below, DPS process 10, may create 100 a digital proxy simulation for a robotic hardware wherein the digital proxy simulation and the robotic hardware share a network interface. The method may also provide 102 a user with an option to switch between the robotic hardware and the digital proxy simulation. The method may also, upon receiving a user selection, execute 104 the switch between the robotic hardware and the digital proxy simulation, wherein executing the switch includes transferring input and output signals between the digital proxy simulation and the robotic hardware.

DPS process 10s may be a server application and may reside on and may be executed by computing device 12, which may be connected to network 14 (e.g., the Internet or a local area network). Examples of computing device 12 may include, but are not limited to: a personal computer, a server computer, a series of server computers, a mini computer, a mainframe computer, or a dedicated network device.

The instruction sets and subroutines of DPS process 10s, which may be stored on storage device 16 coupled to computing device 12, may be executed by one or more processors (not shown) and one or more memory architectures (not shown) included within computing device 12. Examples of storage device 16 may include but are not limited to: a hard disk drive; a tape drive; an optical drive; a RAID device; an NAS device, a Storage Area Network, a random access memory (RAM); a read-only memory (ROM); and all forms of flash memory storage devices.

Network 14 may be connected to one or more secondary networks (e.g., network 18), examples of which may include but are not limited to: a local area network; a wide area network; or an intranet, for example.

Examples of client-side applications 10c1, 10c2, 10c3, 10c4 may include but are not limited to an application incorporated into and executed within a client-side process incorporated into and executed with a client-side media applications, a web browser, media decoder, such as, audio and video decoders. It is understood that the aforementioned may be incorporated into a mobile device platform. The instruction sets and subroutines of client-side application 10c1, 10c2, 10c3, 10c4, which may be stored on storage devices 20, 22, 24, 26 (respectively) coupled to client electronic devices 28, 30, 32, 34 (respectively), may be executed by one or more processors (not shown) and one or more memory architectures (not shown) incorporated into client electronic devices 28, 30, 32, 34 (respectively). Examples of storage devices 20, 22, 24, 26 may include but are not limited to: hard disk drives; tape drives; optical drives; RAID devices; random access memories (RAM); read-only memories (ROM), and all forms of flash memory storage devices.

Examples of client electronic devices 28, 30, 32, 34 may include, but are not limited to, personal computer 28, laptop computer 30, mobile computing device 32, notebook computer 34, a netbook computer (not shown), a server computer (not shown), a gaming console (not shown), a data-enabled television console (not shown), and a dedicated network device (not shown). Client electronic devices 28, 30, 32, 34 may each execute an operating system.

Users 36, 38, 40, 42 may access DPS process 10 directly through network 14 or through secondary network 18. Further, screen capture process 10 may be accessed through secondary network 18 via link line 52. DPS process 10 may access a robotic device (e.g., robotic device 54) through network 14 by one or more of the users (e.g., Users 36, 38, 40, 42).

The various client electronic devices (e.g., client electronic devices 28, 30, 32, 34) may be directly or indirectly coupled to network 14 (or network 18). For example, personal computer 28 is shown directly coupled to network 14. Further, laptop computer 30 is shown wirelessly coupled to network 14 via wireless communication channels 44 established between laptop computer 30 and wireless access point (WAP) 48. Similarly, mobile computing device 32 is shown wirelessly coupled to network 14 via wireless communication channel 46 established between mobile computing device 32 and cellular network/bridge 50, which is shown directly coupled to network 14. WAP 48 may be, for example, an IEEE 802.11a, 802.11b, 802.11g, 802.11n, Wi-Fi, and/or Bluetooth device that is capable of establishing wireless communication channel 46 between laptop computer 30 and WAP 48. Additionally, personal computer 34 is shown directly coupled to network 18 via a hardwired network connection.

Referring also to FIG. 2, and as will be discussed in greater detail below, DPS process 10, may create 100 a digital proxy simulation for a robotic hardware wherein the digital proxy simulation and the robotic hardware share a network interface. The method may also provide 102 a user with an option to switch between the robotic hardware and the digital proxy simulation. The method may also, upon receiving a user selection, execute 104 the switch between the robotic hardware and the digital proxy simulation, wherein executing the switch includes transferring input and output signals between the digital proxy simulation and the robotic hardware.

Figure 3:
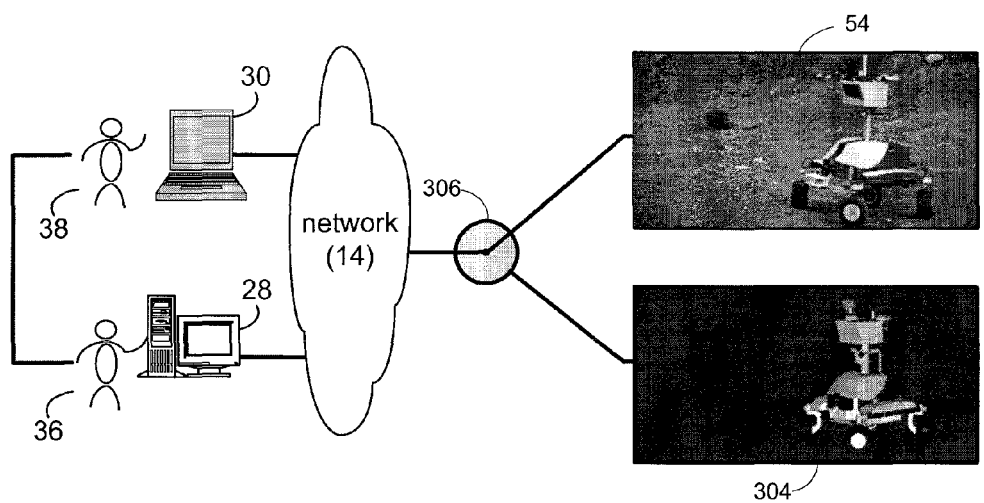
FIG. 3 is a diagrammatic representation of an example DPS process of FIG. 1, according to an implementation of the present disclosure.

Referring to FIG. 3, there is shown a network connecting a scientist (e.g., user 38), and a controller (e.g., User 36) that communicate and collaborate together over a communication network (e.g., network 14) to perform a digital proxy simulation (e.g., proxy 304) that can seamlessly replace physical robotic hardware (e.g., robotic device 54) for testing, validation, and training with a digital proxy simulation (e.g., proxy 304). DPS process 10 may allow the switching between the robotic hardware and the digital proxy simulation automatically or by the means of a switch. Automatically switching may be achieved by transferring the input and output data and signals that are communicated, where the transfer of the input and output data or signals may be established for either the digital proxy simulation or the robotic hardware or both. In other words, when the switch occurs, input and output data or signals may be transferred to either the digital proxy simulation or the robotic hardware or both. A virtual switch (e.g., switch 306) may allow the switch between the digital proxy simulation (e.g., proxy 304) and the physical robotic hardware (e.g., robotic device 54). Automatically switching or the use of a virtual switch (e.g., switch 306) may use services for communication such as CORBA, TCP/IP DLL, or direct link. It is understood that the Common Object Request Broker Architecture (CORBA) is a standard that provides for the definition of a set of distributed services to support the integration and interoperation of distributed objects. It is also understood that TCP/IP is a suite of communications protocol used to connect hosts on the Internet and that DLL, which stands for Dynamic Link Library, is a library of executable functions or data that can be used by an application. DPS process 10 may execute on one or more of these nodes of the IP network via client-side applications (e.g., client applications 10c1, 10c2, 10c3).

As explained above, and for illustration purposes NASA will be used as an example of a provider of robotic hardware to be seamlessly replaced by a digital proxy simulation. Throughout this disclosure references will be made to some NASA robotic hardware such as the K10 robots or the ATHLETE robots, however, other robotic hardware and providers of robotic hardware may be used.

For example, and with additional reference to FIG. 3, DPS process 10 may create 100 a digital proxy simulation for a robotic hardware wherein the digital proxy simulation and the robotic hardware share a network interface. For example, a software system may be implemented to create 100 a simulation that will act as a proxy for a robot (e.g., robotic device 54). A proxy may be a representation of a device and a different form. A digital proxy may be a digital program/software that can simulate the behavior and/or the appearance of a robotic hardware (e.g., robotic devices before). The robotic device 54 may be the NASA robotic hardware such as the K 10 robots. The robotic hardware (e.g., robotic device 54) and the digital proxy simulation (e.g., proxy 304) may share the same network interface, where an operator can connect to one or the other or both using the same network interface/service. Some of the network protocols that may be used are TCP/IP, UDP or others. Some of the network interface services may CORBA, TCP/IP DLL, or direct link. In is understood that the above are only examples and other network interfaces and communication services may be used.

The K10 may be a wheeled 95 kg robot with a maximum speed of 0.9 m/s. It may have a standard lidar, color imaging, and microsopic imaging sensors and can accommodate many types of scientific instruments. It may take a few hours to set up an experiment with the K10, and the K10 is commonly used for large-scale recon experiments involving 20-30 people, making it a good candidate for proxy simulation because there are clear time and resource expenditures involved in operating the hardware.

Some of the challenges in simulating the K10 may be that its lidar operates over a (large) range of 3-150 m and that OpenGL would be challenged in modeling accurate distances over these ranges, and therefore would not be suitable for lidar simulation. Motor input for the K10 may be made through two modes: directly driving the motor position profiles and driving through higher-level tasking. The position profile for the motors may be given at 5 Hz, while telemetry may be received at 25 Hz. Most interfacing maybe achieved through CORBA, but non-CORBA communication may also be used, including writing out data from imagers and lidar to local files (JPEG) on the robot. During operations, data may be stored at a rate of about 100 MB/Hour (though in some configurations, this can be higher). In one embodiment, the digital proxy simulation may support the a robot user interface (e.g., VERVE system). It is understood that VERVE is the Java-based front end used by NASA to display the robot telemetry.

In one embodiment, a software architecture may be developed to support the goals of proxy simulation. This architecture may be built on the architecture used in Energid's commercial Actin toolkit. In one embodiment, a set of criteria may be used in developing the architecture for the general simulation. The set of criteria may be as follows:
 a. The system may support any number of mobile robots and any number of moving parts on each robot.
 b. The system may support all methods of mobility, joint types, and control constraints.
 c. Kinematic control and dynamic simulation may be configurable using CAD models of the robot and terrain.
 d. Third-party software may be supported through a plugin interface.

Some of the components of the simulation may be shown in the following Table 1.

TABLE 1

Data forms that may be used in the proxy simulation, which may leverage the mechanisms available in the Actin Toolkit.

| Data Form | Description |
|---|---|
| Shape | Any shape, including sphere, ellipsoid, capsule, polyhedron, and so forth. |
| Link | A single link in a mechanism, which includes the shape, kinematics, mass properties, and actuator properties. |
| Manipulator | A single mechanical system or robot, which includes any number of connected links. |
| Stated System | Any number of robots, the environment, and their states. |
| Kinematic Simulation | A simulation of a stated system, which includes a stated system, visualization properties, and a kinematic control system. |
| Dynamic Simulation | A simulation providing all the capability of a kinematic simulation, but with dynamic simulation of articulation, physical impacts, and motor control. |

In one embodiment, the robotic hardware and the digital proxy simulation have the same network interface. As explained above, some of the network protocols that may be used may be TCP/IP, UDP or others. Some of the network interface services may CORBA, TCP/IP DLL, or direct link. In is understood that the above are only examples and other network interfaces and communication services may be used. DPS process 10 may allow the same network interface and/or network services to be used when an operator (e.g., Users 36, 38, 40, 42) switches between the robotic hardware (e.g., robotic device 54) and the digital proxy simulation (e.g., proxy 304).

The method may also provide 102 a user with an option to switch between the robotic hardware and the digital proxy simulation. For example, DPS process 10 may provide an operator (e.g., Users 36, 38, 40, 42) with the option to switch between the robotic hardware (e.g., robotic device 54), and the digital proxy simulation (e.g., proxy 304), at any time during testing, validation, and training or any other function related to the robotic hardware or the digital proxy simulation. For example, an operator using a user device (e.g., client electronic devices 28, 30, 32, 34) may control the simulation or may control the actual robotic hardware (e.g., robotic device 54) by switching between the digital proxy simulation and the robotic hardware.

The method may also, upon receiving a user selection, execute 104 the switch between the robotic hardware and the digital proxy simulation, wherein executing the switch includes transferring input and output signals between the digital proxy simulation and the robotic hardware. As explained above, DPS process 10 may allow the switching between the robotic hardware and the digital proxy simulation automatically or by the means of a switch. For example, a user (e.g. Users 36, 38, 40 or 42) may be able to control either the digital proxy simulation, the robotic hardware or both through DPS process 10 by first transferring the input and output data or signals to either the digital proxy simulation, the robotic hardware or both. It is understood that the input and output data or signals may allow communication to and from either the digital proxy simulation or the robotic hardware or both. As also explained above, automatically switching or the use of a virtual switch (e.g., switch 306) may use services for communication such as CORBA, TCP/IP DLL, or direct link. It is understood that a virtual switch may include a digital program or software or process that may allow for setting a path between at least two entities. Entities may be a user, a computer, a process, and algorithm, etc. A controller may be a user (e.g., Users 36, 38, 48, or 42), a computer, a handheld device, a process, a software program, and algorithm, etc. Whenever a path set between the at least two entities, data flowing between the at least two entities may be in the form of signals that may be transferred between the at least two entities. Signals may be in the form of input or output signals. For illustrative purposes, assuming a fault was encountered during a field test (or mission) of a robotic hardware (e.g., robotic device 54). An operator (e.g., Users 36, 38, 40 or 42) controlling the robotic hardware (e.g., robotic device 54) may be able to switch between the robotic hardware (e.g., robotic device 54) and a digital proxy simulation (e.g., proxy 304) using the virtual switch (e.g., switch 306). As explained above, a virtual switch allows a user to switch between the robotic hardware and the digital proxy simulation in order to be able to control one or the other or both. Control may be exercised to debug, test, validate or any other functions that may be necessary to be performed on the robotic hardware or the digital proxy simulation. For example, if the operator (e.g. Users 36, 38, 40 or 42) laws to control the digital proxy simulation (e.g., proxy 304), DPS process 10 may provide 102, the user with the option to switch to the digital proxy simulation (e.g., proxy 304), where now the operator may be able to communicate and/or control the digital proxy simulation (e.g., proxy 304). Further, the operator (e.g., Users 36, 38, 44, 42) may be able to send and receive signals to the digital proxy simulation (e.g., proxy 304). As explained above, signals may be in the form of input or output signals between at least two entities (e.g., an operator and the proxy simulation). Continuing with the example above, the operator (e.g., Users 36, 38, 40 or 42) may be able to debug the problem using the digital proxy simulation (e.g., proxy 304). The operator (e.g., Users 36, 38, 40 or 42) may then switch another time to the robotic hardware (e.g., robotic device 54) from the digital proxy simulation (e.g., proxy 304) to resume the control of the robotic hardware (e.g., robotic device 54). Another example may be where an operator (e.g., Users 36, 38, 40 or 42) may test or demonstrate new features on a robotic hardware by performing the tests on the digital proxy simulation (e.g., proxy 304) and then switch between the digital proxy simulation (e.g., proxy 304) and the robotic hardware (e.g., robotic device 54) as many times as necessary to demonstrate the new features. It is understood that the above is only an example of a debug scenario and a test scenario and that other scenarios necessitating switching between robotic hardware and digital proxy simulation may be envisioned.

The method may further include executing the digital proxy simulation using at least one of network communications and network communications over the Internet. For example, and referring to FIG. 3, a network communication (e.g., network 14) may allow users, such as scientists, and controllers (e.g., Users 36 and 38), to seamlessly communicate with the physical hardware (e.g. robot device 54), and/or the digital proxy simulation (e.g., proxy 304). The network may be a closed network, or an open network, or a combination thereof. A closed network may be private network with access limited to registered users. An open network may be accessed by users, even if not registered to use that network. An example of a closed network may be a network that require permission to join, and an example of an open network may be the Internet. In one embodiment, an operator may decide which network or combination thereof to use for executing the digital proxy simulation.

In one embodiment, the network communications and the network communication over the Internet are provided using Data Distribution Service (DDS) for real-time systems. That is, the network communications and the network communications over the Internet used between the users (e.g., Users 36, 38, 40, 42) and the robotic device (e.g., robotic device 54) and the digital proxy simulation (e.g., proxy 304) may be provided using Data Distribution Service (DDS) for real-time systems. In is understood that the use of the network communications allows connectivity between the users (e.g., Users 36, 38, 40 and 42) and the robotic device (e.g., robotic device 54) and the digital proxy simulation (e.g., proxy 304). Through that connectivity, one or more of the users (e.g., Users 36, 38, 40 and 42) may be able to operated the robotic device (e.g., robotic device 54) and the digital proxy simulation (e.g., proxy 304). As explained above, a virtual switch (e.g., switch 306) may be used to perform the switch between the digital proxy simulation (e.g., proxy 304) and the physical robotic hardware (e.g., robotic device 54) whenever an operator (e.g., Users 36, 38, 40 and 42) may want to control either the digital proxy simulation (e.g., proxy 304) or the physical robotic hardware (e.g., robotic device 54) or both.

In one embodiment, the robotic hardware is at least one of a mobile a fixed base articulated serial manipulator, a moving base articulated serial manipulator, a fixed base articulated robot with branching links, and a moving base articulated robot with branching links. For example, a physical extent describing a rigid component of a robot may be represented in a variety of levels of detail. In general, each shape is formed as a combination of geometric primitives through the compound-shape tree structure shown in FIG. 4. The tree structure may be composed at runtime, and may be modified (either directly or through a DLL) to support new geometric shape primitives or branching nodes. The leaves in the tree may be shape primitives, some examples of which are shown in FIG. 4 (e.g., polyhedron, sphere, capsule, lozenge, ellipsoid, box, tetrahedron, and half space).

Figure 4:
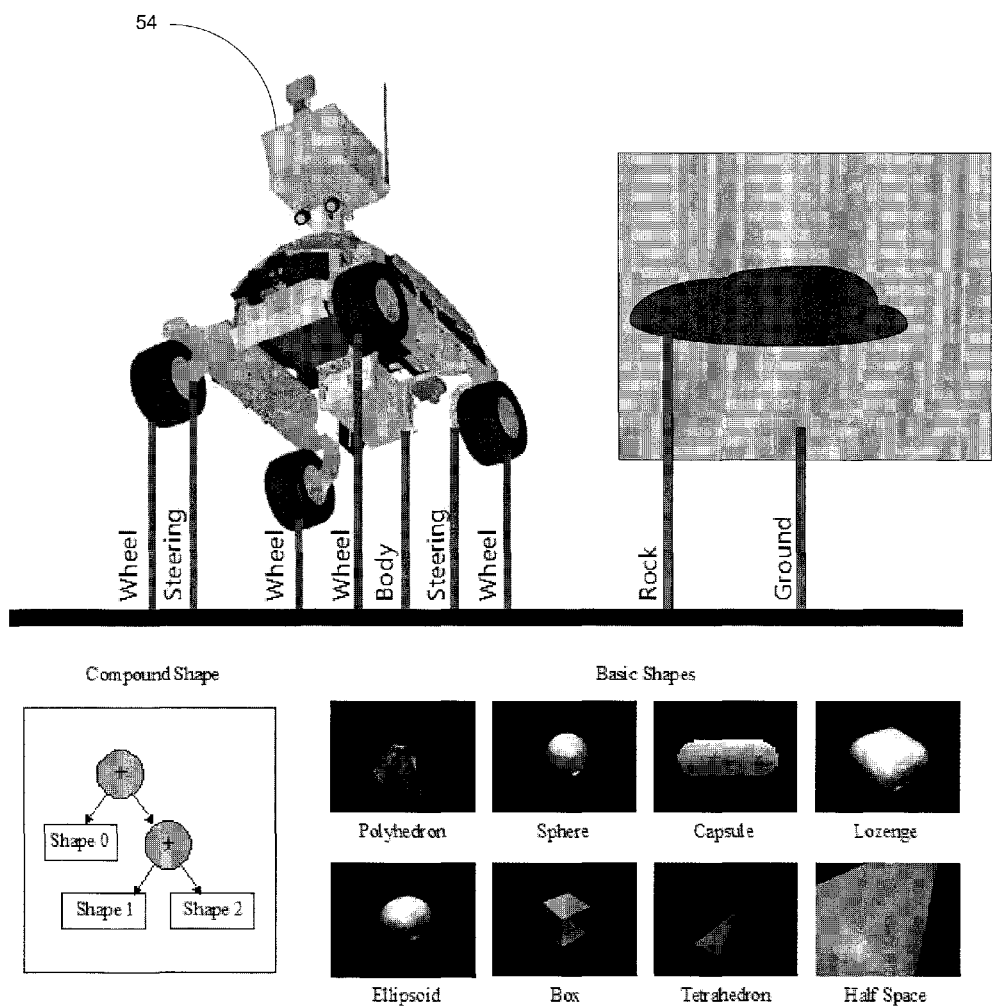
FIG. 4 depicts a diagram consistent with the processes of the present disclosure.

Still referring to FIG. 4, there is shown a robot (e.g., robotic device 54), where the robot description leverages a flexible capability for describing parts. For each part in the robot, such as a wheel, steering support, or articulated link, a compound-shape tree structure may be used to represent it. Internal nodes may be unions or intersections, and the leaves may be basic shapes. A common shape may be the general polyhedron. Other basic shapes may provide a simpler representation and faster simulation execution for some applications. These shapes may use surface properties referenced by string tokens. Each surface property may hold a string-string map, a string-floating-point map, and a string-integer map. Polyhedrons may organize their polygons by surface property, with potentially each polygon having its own surface property.

The link may be the object representing rigid bodies that may be used to build robot descriptions. The distal frame of one link may be rigidly attached to the proximal frame of each child link in a generic kinematic structure. This may allow multiple formalisms (such as Paul or Craig's Denavit-Hartenberg notation), and it may support the representation of new types of joints. Each link object may hold the following properties:

| Joint Kinematic Description | Surface Properties |
|---|---|
| Mass Properties | Spring and Damper Properties |
| Actuator Parameters | Child Links |
| Physical Extent | Methods for Calculating Derived Data |

The link's mass properties may include scalars that may be needed for rigid-body dynamics calculations. The actuator parameters may include the motor friction, motor inertia, joint flexibility, gear ratio, and joint limits. Joint-limit dynamics may be represented with a spring-damper model.

Figure 5:
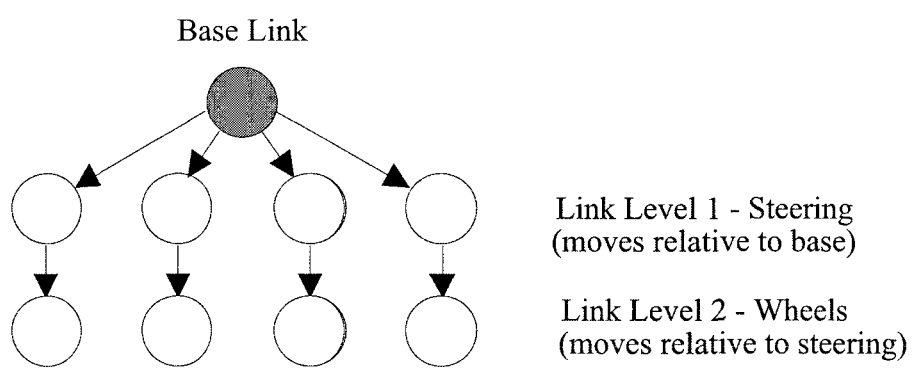
FIG. 5 depicts a diagram consistent with the processes of the present disclosure.

A robot may be constructed by connecting links in a tree structure, as shown in FIG. 5. The structure may support any number of links and any number of bifurcations, such as those present on the NASA K10 robot or other NASA robots (e.g., ATHLETE). Each individual link may move relative to its parent. The base link may play a special role by having its position and orientation represented explicitly. The base link may be typically the body of a mobile robot.

Still referring to FIG. 5, there is shown a robot or environmental object that may be defined through a link tree. Each link may have the form described above and may move relative to its parent. The position and orientation of the base link may be represented explicitly. The base link may be the body of a mobile robot. Further, FIG. 5 shows the topology for four wheel drive, four wheel steering without a suspension. For rigid environmental objects (e.g., rocks) the base may have no children and may be fixed or mobile, as best suited to the scenario.

Figure 6:
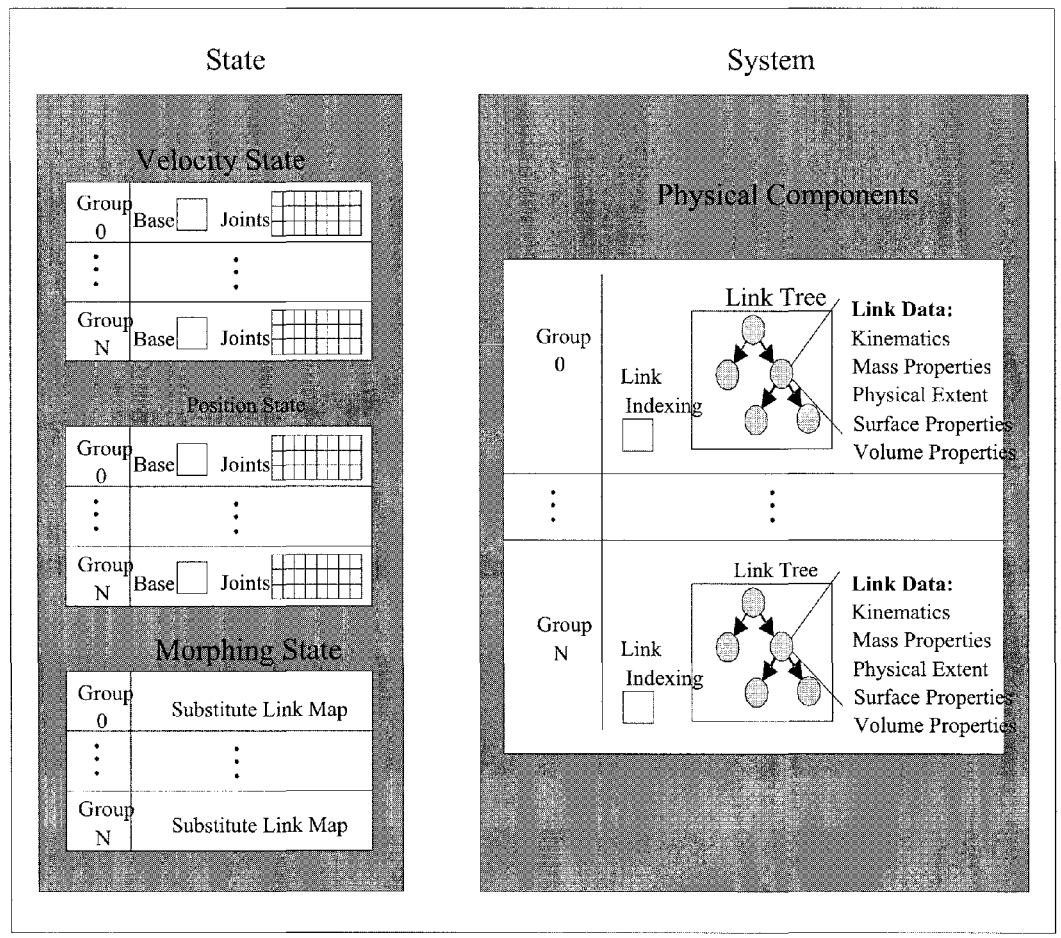
FIG. 6 depicts a diagram consistent with the processes of the present disclosure.

All robots and the environment may be described through the dichotomy of system and state. The system may remain the same, time step to time step, while the state may change. The system may be decomposed into any number of robots, or mechanisms. The state may be decomposed into a velocity and a position state, as well as a morphing state for describing terrain changes. Referring to FIG. 6, which may illustrate the above organization. A robot, such as the K10, may be considered as a group. A rock may also be considered as a group (with only a base link). Each object may move rigidly or morph, to allow simulation of both rigid components and soil. FIG. 6 shows how robots, and the environment where the robot may be operating, may be organized into a "system" and at "state." The state may change from time step to time step, while the system may remain the same. The morphing state may model terrain change.

In one embodiment, the digital proxy simulation includes, at least in part, a sensor simulation, a kinematic simulation, a dynamic simulation, and an environment simulation. For example, and referring to FIG. 7, DPS process 10, may allow for various simulations of the actual physical robotic hardware (e.g., robotic device 54), the surrounding environment (e.g., environment 702) and the imaging sensors (e.g., sensor 704) present on a robotic hardware (e.g. on robotic device 54).

Figure 7:
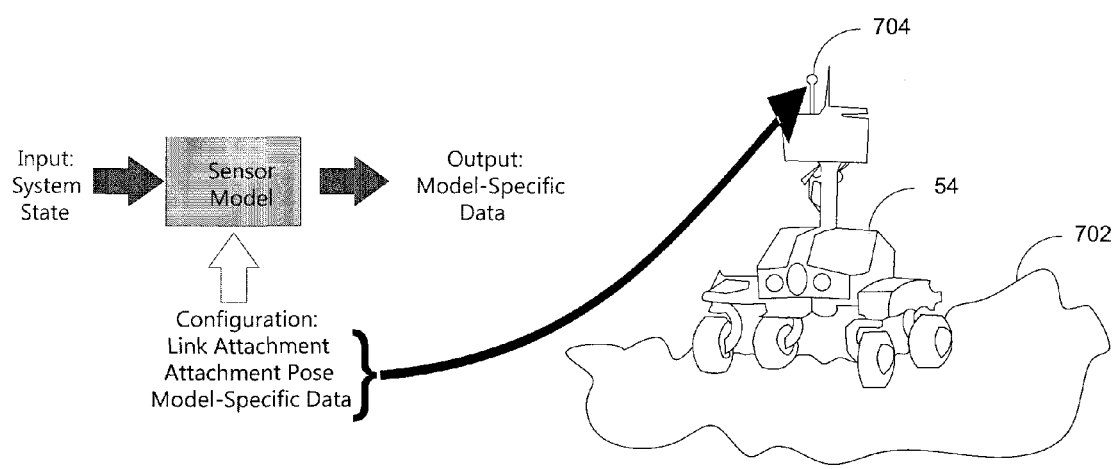
FIG. 7 depicts a diagram consistent with the processes of the present disclosure.

It is understood that the K10 model may have multiple imaging sensors and at least one lidar sensor as standard equipment. In addition to this, there may be often a demand for the addition of new scientific instruments and other sensors. To enable any sensor type to be used easily with the simulation, a plug-in architecture for sensor types that includes the ability to associate the sensor with any link and capture relevant data at any rate may be used. The base class for the sensor may accept a system and a state (as illustrated in FIG. 6) and may calculate the data that the sensor may produce. The code that does this may be different for each sensor model type. Referring to FIG. 7, there is shown a depiction of possible sensor configuration model that may derive from a common base class that may accept a system and the state as input and returns data in a form specifically relevant to sensor model type.

Kinematic Simulation

In one embodiment, A kinematic simulation may provide support for constraint management, including steering and other types of control. In software, a kinematic simulation may include a stated system, as described above combined with a configurable control system that may be comprised of a velocity control system and a position control system, which are described below. The control system may be robust enough to be generated automatically, yet flexible enough to give the designer full control over behavior when desired.

In one embodiment, the proxy simulation may use a velocity control framework (e.g. those available from the assignee of the present disclosure) for steering the digital proxy simulation (e.g., proxy 304), which may include easy configuration of kinematic constraints. The core velocity-control framework for any mechanism in the simulation may be based on the Jacobian equation:

$$V = J(q)\dot{q}^*, \quad (1)$$

where v is an m-length vector representation of the motion of the end effectors (for example, linear and angular velocity referenced to points rigidly attached to parts of the robot); q is the vector of joint positions, $\dot{q}^*$ is the n-length vector formed by augmenting $\dot{q}^*$ with the 3D linear and angular velocity of the base link; and J is the m×n Jacobian, a function of q. When the mechanism is kinematically redundant, the dimension of v is less than the dimension of $q^*$, which includes six independent elements representing base motion, (m<n), and (1) is underconstrained when v is specified.

The control framework calculates joint rates and base motion $\dot{q}^*$ that best achieve a desired set of end-effector motions, V, by building on the method described in "On the Implementation of Velocity Control for Kinematically Redundant Manipulators," J. D. English and A. A. Maciejewski, *IEEE Trans. On Sys., Man, and Cybernetics—Part A: Systems and Humans*, vol. 30, no. 3, May 2000, pp. 233-237, which uses a scalar a, a matrix function W(q), and a vector function F(q) to solve for $\dot{q}^*$ as follows:

$$\dot{q}^* = \begin{bmatrix} J \\ N_J^T W \end{bmatrix}^{-1} \begin{bmatrix} V \\ -\alpha N_J^T F \end{bmatrix}. \quad (2)$$

Here, $N_J$ is an n x (n−m) set of vectors that spans the null space of J. That is, $JN_J=0$, and $N_J$ has rank (n−m). $N_J$ is generally a function of q. By just changing the values of a, W, and F(q), many new and most established velocity-control techniques can be implemented, including pseudo-inverse control, weighted pseudoinverse control, augmented Jacobian techniques, extended Jacobian techniques, and projection methods. These can be used to optimize criteria such as balance, collision avoidance, joint-limit avoidance, and strength optimization. These are tailored to mobile systems to allow robots such as the K10 to easily be moved around the surface of the terrain just by guiding a 3D point.

Velocity control may be used for placing constraints. The current pose of an end-effector (location and orientation for a frame end effector, for example) and the desired pose may be used to construct an end-effector velocity that, if followed, may provide alignment. For point end effectors, the desired velocity of the point may be simply a scalar gain times the difference in position. That is, if $\vec{p}_a$ is the actual position and $\vec{p}_d$ is the desired position, then the desired velocity, $\vec{v}_d$, is given by the following, where $k_l$ is a positive gain:

$$\vec{v}_d = k_l(\vec{p}_d - \vec{p}_a). \quad (3)$$

For frame end effectors, every three-dimensional rotation can be expressed as a rotation about a single axis. Let the unit-norm axis of rotation between the actual and desired frames be û and the angle of rotation be θ. Then the desired angular velocity is given by $$\vec{\omega}_d = k_a \cdot \theta \cdot \hat{u}, \quad (4)$$

where $k_a$ is a positive gain. This approach allows the velocity control system defined through (2) to be used directly for position control. This is the approach that was used for K10 steering in the Phase I demonstrations.

Dynamic Simulation

In one embodiment, a dynamic simulation may include all the capability of a kinematic simulation discussed above, plus numerical integration of Newton's and Euler's dynamic equations for moving parts. Articulated dynamics, impact dynamics, and the dynamics of the motor controllers may be included. It is understood that the moving parts include the moving parts of a robotic hardware (e.g., robotic device 54).

In one embodiment, the method of simulation used may be the Order($N^3$) Composite Rigid Body Inertia Algorithm. The method of simulation may be implemented using an adaptation of the composite rigid-body algorithm for bifurcating manipulators, based on the following equation:

$$\tau = M(q)\ddot{q} + C(q)\dot{q} + G(q) + DA_b + B, \quad (5)$$

where τ is the column vector of joint torques/forces, M(q) is the manipulator inertia matrix, q is the vector of joint position, C(q) represents the Coriolis forces, G(q) represents gravitational forces, and B represents the effect of external forces applied to the arm's links. $A_b$ is the seen (rather than felt) acceleration of the base link. D is a special matrix that is a function of configuration only. Combining this equation with direct application of Newton's and Euler's laws to the base link allows solution of $\ddot{q}$ and $A_b$ for mobile systems through the solution of an (N+6) DOF linear equation.

Proxy Simulation Algorithm Organization

For use in real-time application, agreed-upon interaction models may not sufficiently describe all the complex interactions anticipated for exploring with the proxy simulation. In one embodiment, a software architectural framework may be constructed that may allow interaction models to be switched depending on the nature of interaction, soil, and mechanism surfaces.

Figure 8:
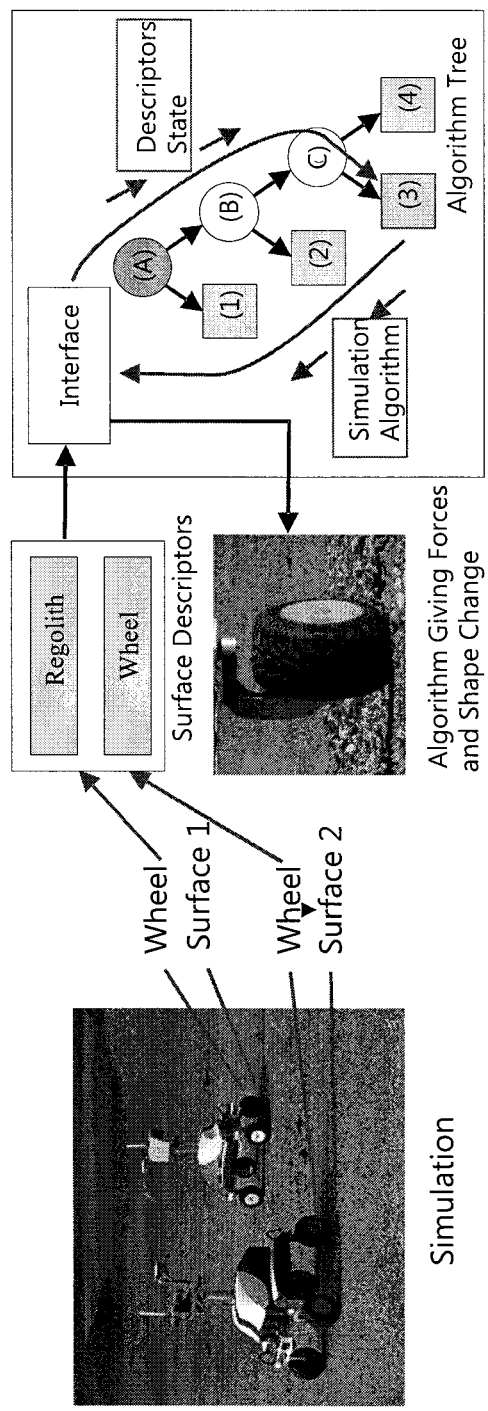
FIG. 8 depicts a diagram consistent with the processes of the present disclosure.

In one embodiment, for each interaction with the new system, a simulation algorithm may be looked up in a database, as illustrated in FIG. 8, which shows algorithm database and parameter lookup, where a different simulation algorithm may be used for each type of interaction. This may allow special algorithms to represent, for example, soft soil contacting wheels and other algorithms to represent interactions between the robot body and obstacles. In addition, the user may want to use different algorithms for the same interaction pair for different goals. For example, there may be three available interaction models for a given wheel and set of soil properties, with the three models offering different trade-offs of speed for accuracy. The database and look-up mechanism may provide the support for selecting a specific model.

As an example for computing interaction forces, the EcLinkInteractionsVector object may be a vector of EcBaseLinkInteractions instances. The EcLinkCollisionForce, derived from EcBaseLinkInteractions, may be responsible for calculating interaction forces due to collisions among all links (objects) in the system. All classes derived from EcBaseLinkInteractions may implement a forceBetweenLinks method to calculate the interactions between links and add the results to the outputs. Error! Reference source not found. below lists the arguments of this method.

TABLE 2

Example details of forceBetweenLinks method of EcBaseLinkInteractions.

| Argument | Type | Description |
| --- | --- | --- |
| actState | EcSystemActiveState | The non-redundant and redundant states of the system. The redundant state can be computed from the non-redundant state but may be computationally expensive so it is computed and cached for later usage. |
| manipSystem | EcManipulatorSystem | The system descriptions including geometry, shapes, surface properties, etc. |
| time | EcReal | The current time in seconds. |
| manipExtForce-Vector | EcManipulatorExternal-ForceVector | The output which is the vector of all interaction forces after the calculations. |

In one embodiment, for data exchange, the proxy simulation may use the XML formalism. XML may use tags to describe data that is organized in a hierarchical fashion. For example, DPS process 10, may be associated with an XML schema. The XML schema developed may define what can and cannot exist in the language used to exchange robot information. This schema may be used with any commercially available parser for validating data. An example schema for mass properties' second moment, as would be used throughout the description of a robot, is shown in the Text Box below.

```
<xs:complexType name="EcSecondMoment">
    <xs:all>
        <xs:element ref="jXX"/>
        <xs:element ref="jXY"/>
        <xs:element ref="jXZ"/>
        <xs:element ref="jYY"/>
        <xs:element ref="jYZ"/>
        <xs:element ref="jZZ"/>
    </xs:all>
</xs:complexType>
<xs:element name="secondMoment" type="EcSecondMoment"/>
```

For illustrative purposes and as an example, the NASA robotic hardware (e.g., NASA K10 robot) model may be converted for use with the digital proxy simulation. The converted model may have eight degrees of freedom, two for each wheel. In this example, to enable conversion of the model with the eight degrees of freedom, several modifications to the model may be necessary:

1) The model may be further mated to constrain parts. Parts that are not mated may have artificial degrees of freedom. The converter may assume that these parts may be constrained to the base which is the K10 body for this model. That assumption may work for most of the parts but not for the parts that are attached to the articulated links. The parts in the articulated links may be fully mated to enable conversion to the Actin toolkit.
2) The joints may be mated with concentric, coincident, and angle limit mates. The concentric and coincident mates may define the axis of rotation and the limit mate may define the joint limit.

3) Many parts in the model may be in a hidden state. Hidden parts may be basically there but transparent. These parts may be suppressed to bypass conversion of these parts to the Actin toolkit.
4) The model may contain some parts colored with third-party tools, and these colors may not convert. Some parts may be re-colored to make the models match more closely.
5) The original model converted to a 16 MB Actin model. Several internal parts may have been removed to reduce the model size to less than 10 MB.

In one embodiment, environmental simulation may include general terrain parameters that may be simulated by determining the performance of one point in the environment compared to a neighboring point in the environment. This concept will be explained in greater detail below.

To simulate general terrain parameters, building of random arrays with specified distance autocovariance may be enabled. Parameters over terrain, such as height and other soil properties may vary statistically with distance. If terrain is highly compressible at one point, for example, it may be likely to be highly compressible at a nearby point.

Figure 9:
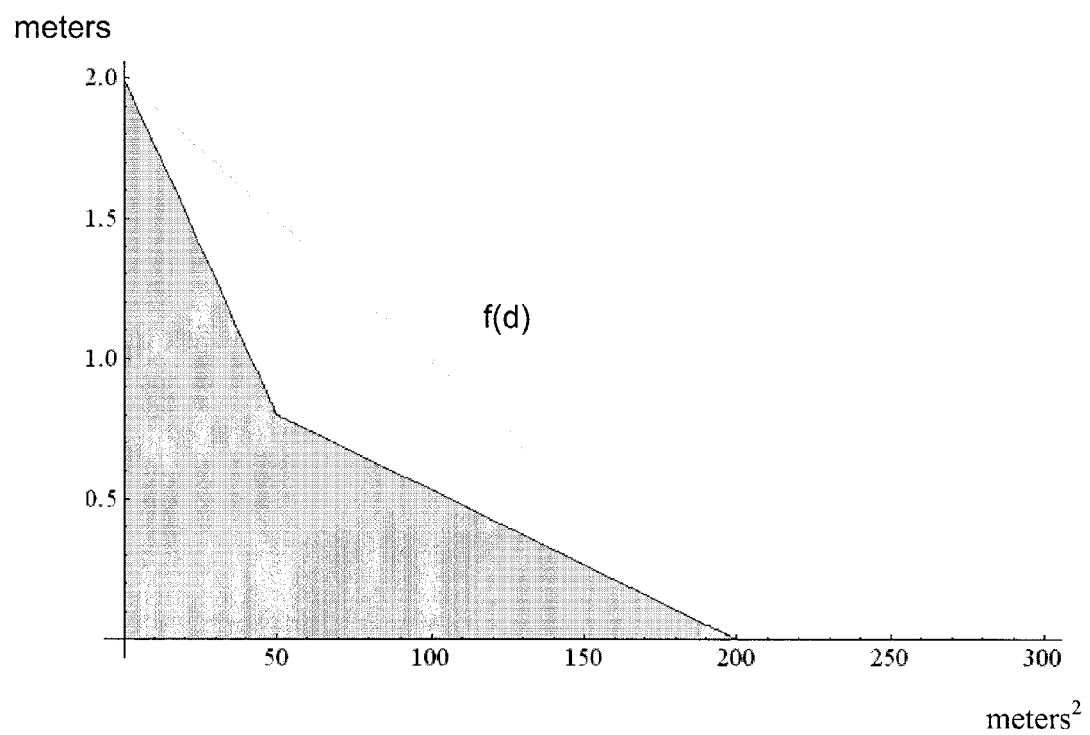
FIG. 9 depicts a diagram consistent with the processes of the present disclosure.

The creation of random terrain properties may be established by building an array with a prescribed mean and standard deviation for each point and an autocovariance function over distance. For example, a covariance function for height might look like that shown in FIG. 9. As shown, FIG. 9 represents an autocorrelation function, f(d), over terrain. The x-axis represents distance in meters, and the y-axis represents covariance in m². The covariance of the parameter is given as a function of linear distance along the ground plane.

In one embodiment, to build a two-dimensional grid using the autocorrelation function specified, a combination of outer products of column vectors sampled for a prescribed covariance may be used. A column vector may be selected as representing a series with the autocorrelation function F(d), specified as follows:

$$F(d) = \frac{1}{\sqrt{f(0)}} f(d) \quad (6)$$

In one embodiment, the column vectors used to build the array may then represent a discrete instantiation of this autocorrelation, with an assumed cell width (and height) of D. These vectors have covariance M, given as follows:

$$M = \begin{bmatrix} F(0) & F(D) & F(2D) & \\ F(D) & F(0) & F(D) & \ddots \\ F(2D) & F(D) & \ddots & \ddots \\ & \ddots & \ddots & \ddots & F(0) \end{bmatrix} \quad (6')$$

M is a symmetric Toeplitz matrix. With it, it is desired to create random column vectors X such that $$E(XX^T)=M \quad (7)$$

where E(•) is the expected value. To do this, Cholesky Decomposition is used, giving upper-triangular L, where $$L^T L = M \quad (8)$$

With this, first a column vector Y is created by sampling zero-mean unit-variance Gaussian distributed random variables as follows:

$$Y = \begin{bmatrix} N(0,1) \\ N(0,1) \\ \vdots \\ N(0,1) \end{bmatrix}, \quad (9)$$

so that $$E(YY^T)=I, \quad (10)$$

the identity matrix. Then X is calculated as $$X=L^T Y. \quad (11)$$

With this construction, $$E(XX^T)=E(L^T Y(L^T Y)^T)=E(L^T YY^T L)= \\ L^T E(YY^T)L=L^T IL=M, \quad (12)$$

as desired. An array A is calculated using two samples of X as follows:

$$A=XX^T. \quad (13)$$

This may give a vertical and horizontal autocorrelation function corresponding to f(d). Values of A may be calculated multiple times and sampled at random orientations, θ, weighted, and added to calculate the final random array R as follows:

$$R = \sum_{i=1}^{N} \frac{1}{\sqrt{N}} A_\theta \quad (14)$$

Where A is a random matrix, constructed as described above, and the subscript implies resampling at an orientation may be determined by the random variable θ, uniform over [0,2π].

Figure 10:
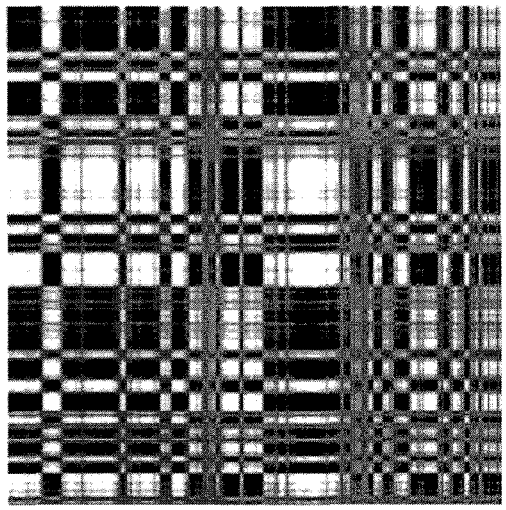
FIG. 10 depicts a diagram consistent with the processes of the present disclosure.
Figure 11:
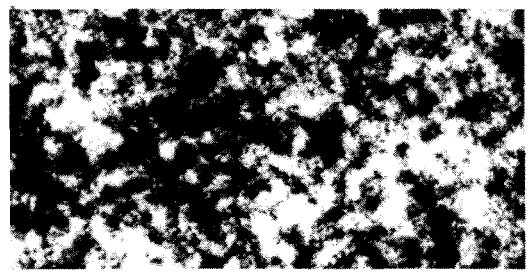
FIG. 11 depicts a diagram consistent with the processes of the present disclosure.

For example, to use the autocovariance given in FIG. 9 to generate random values over a 2 km by 1 km stretch of terrain, with one sample every 5 m, A may be sampled as described above, with the following image (generated by scaling the sampled values to [0,1]) as an example. This is depicted in FIG. 10, which shows an example illustration of a single sample of A (values are mapped to gray level [0,1]). A single sample may be random, but patterned. This may then be resampled at the desired scale illustration of a single sample of A (values are mapped to gray level [0,1]). A single sample may be random, but patterned. This may then be resampled at the desired scale and resolution multiple times at multiple random orientations, as shown in FIG. 11, which is an example construction of a random array (values are mapped to gray level [0,1]) using 200 samples of random arrays such as that shown in FIG. 10.

Figure 12:
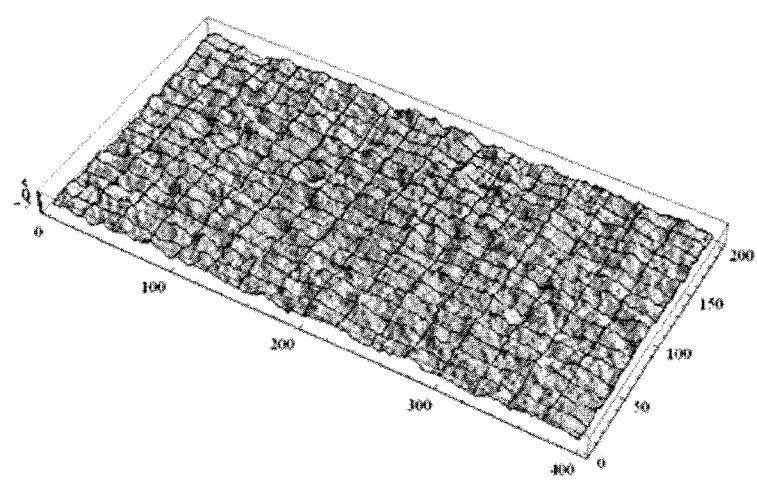
FIG. 12 depicts a diagram consistent with the processes of the present disclosure.

This data is illustrated through plotting as a height field (and rendered using Mathematica) as shown in FIG. 12.

In one embodiment, the capability described above may be implemented in code delivered through two classes, EcRandomTensorTool, used to build the random array, and EcMultipointScalarFunction, used to describe the autocorrelation function. The class EcRandomTensorTool may implement the following exemplary method, which may be used to implement an embodiment of the disclosure:

```
/// get a random array, with a Gaussian distribution
virtual void getGaussianRandomArray
   (
   EcReArray& randomArray,
   EcU32 arrayWidth,
   EcU32 arrayHeight,
```

```
EcBaseScalarFunction& autoCovariance,
EcReal arrayUnitDiameter=1.0,
EcReal mean=0.0
) const;
```

This may take a desired array width and height, an autocovariance function, and an optional scaling factor for unit diameter in the array and an optional factor for the mean of the array, which may return a random array. The class also may provide the ability to seed the random number generator used to create the array. This may be implemented in ecRandomTensorTool.cpp,h.

EcMultipointScalarFunction may implement the following exemplary methods, which may be used to implement an embodiment of the disclosure:

```
/// set domain values
virtual void setDomainValues
(
    const EcXmlRealVector& domainValues
);
/// set range values
virtual void setRangeValues
(
    const EcXmlRealVector& rangeValues
);
/// evaluate the function
virtual EcReal evaluate
(
    const EcReal& domainValue
) const;
```

These may allow an autocorrelation function to be specified using linear interpolation over a set of points. Example code using these two methods is given in the listing below, which may be used to implement an embodiment of the disclosure.

LISTING 1

Example code showing random array generation for building terrains.

```
// setup for a random array
EcU32 width=100;
EcU32 height=50;
EcReArray randomArray;
const EcReal var=2.0;
// build a covariance function
EcMultipointScalarFunction acv;
EcXmlRealVector domainValues;
domainValues.pushBack(0.0);
domainValues.pushBack(100.0);
domainValues.pushBack(200.0);
domainValues.pushBack(1000.0);
// assign range values
EcXmlRealVector rangeValues;
rangeValues.pushBack(1.0*var);
rangeValues.pushBack(0.0);
rangeValues.pushBack(0.0);
rangeValues.pushBack(0.0);
// set the values
acv.setDomainValues(domainValues);
acv.setRangeValues(rangeValues);
// calculate the random array
EcRandomTensorTool tool;
tool.setRandomSeed(400);
tool.setNumRandomSamples(500);
EcReal mean=0.0;
tool.getGaussianRandomArray(
    randomArray,width,height,acv,20.0,mean);
```

In one embodiment, the movement of the robotic hardware is rendered at least on one of a computer screen and a handheld electronic device. For example, DPS process 10 may render the robotic hardware (e.g., robotic device 54), during a simulation, which results in a digital proxy simulation (e.g., proxy 304). It is understood that rendering is the process of generating images from a model through computer programs and processes. The rendering of the robotic hardware (e.g., robotic device 54) may be performed and/or shown in 2D or 3D on a computer (or computer screen) and/or a handheld electronic device. A rendering device may be a computer or a graphic processing units (GPU). A GPU is known as a specialized electronic circuit, designed to rapidly manipulate and alter memory to accelerate the creation of images in a frame buffer intended for output to a display. In general, a GPU is a purpose built device able to assist a central processing unit (CPU) in performing complex rendering calculations. DPS process 10 may allow a user (e.g., Users 36, 38, 40, or 42) to perform the rendering of the robotic hardware (e.g., robotic device 54). DPS process 10, may present the rendered images of the robotic hardware (e.g., robotic device 54) onto a user's device (e.g., client electronic devices 28, 30, 32, 34).

In one embodiment, the environment simulation includes, at least in part, a terrain simulation and an interaction with the robotic hardware. For example, for simulating the robotic hardware (e.g., NASA K10 robot), multiple simulation methods may be used, across a variety of scenarios and levels of fidelity. It is understood that the above may utilize an example of development of fast models for real-time application on wheeled vehicles (e.g., the NASA K10 robot) using the tools available in Actin Toolkit and that other examples of models may be used.

In one embodiment, all the force processors used in the simulation may inherit from EcBaseLinkInteractions. A vector of link interactions (EcLinkInteractionsVector) may be traversed in EcDynamicSimulatorSystem at the time step specified for the dynamic simulator system. If a new force processor is developed it may need only to subclass EcBaseLinkInteractions, and may be registered with the EcLinkInteractionsVector.

In one embodiment, a linear spring model may be extended to a nonlinear spring. In this model, the viscous, or damping, force may be proportional to the penetration depth, as shown in the formula:

$$f = d(k_p - k_d v), \tag{15}$$

Where d is the penetration depth, $k_p$ and $k_d$ are surface property constants, and v is the normal velocity.

In one embodiment, methods may be tailored to wheeled motion, with a focus on dry friction. These may be based on a breaking spring model of interaction and recent developments in modeling friction through time-stepped simulation.

Figure 13:
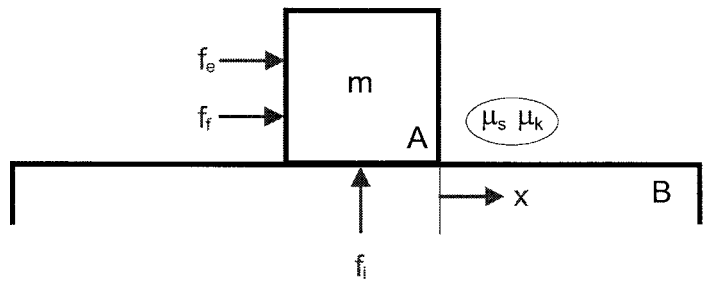
FIG. 13 depicts a diagram consistent with the processes of the present disclosure.

For illustration purposes, let two interacting surfaces be labeled A and B, as shown in FIG. 13, which is a one-dimensional example where object A may move horizontally relative to object B. The normal force applied by surface B on surface A is $f_i$. The horizontal location of the block is represented through x; the external horizontal force applied to the block is $f_e$, and the friction force applied to the block is $f_f$. The traditional coefficients of static and kinetic friction are $\mu_s$ and $\mu_k$, respectively. The mass of the block is m.

The Coulomb friction model may give the following constraints:

$$f_f \leq \mu_s f_i \text{ when } \dot{x}=0, \tag{16}$$

$$f_f = -\text{sign}(\dot{x}) \mu_k f_i \text{ when } \dot{x} \neq 0, \tag{17}$$

Along with the constraint that friction can do no work:

$$f_f \dot{x} = 0. \tag{18}$$

In one embodiment, the use of a model may be extended wherein the coefficient of kinetic friction may be moderated by a weighting function that may decrease the friction force as the tangential velocity approaches zero. In kinetic mode, in the new code, the friction may be calculated as $$f_f = -\text{sign}(\dot{x})w(\dot{x})\mu_k f_i, \tag{19}$$

Where $w(\bullet)$ is the weighting function.

In the static friction state, the friction force may be represented using a spring-damper response. The spring and damper parameters are $k_s$ and $\lambda_S$. Both of these may be strictly nonnegative. The force may then be calculated as follows in static mode:

$$f_f = -k_s x - \lambda_S \dot{x}. \tag{20}$$

The transfer function for this system is $$\frac{X}{F_e} = \frac{\frac{1}{m}}{s^2 + \frac{\lambda_s}{m}s + k_s}. \tag{21}$$

Let $\lambda_S$ be calculated as $$\lambda_s = 2\hat{m}\sqrt{k_s}, \tag{22}$$

Where $\hat{m}$ is the estimate of m. With this value, the response may be critically damped when $m=\hat{m}$. The damping factor, $\zeta$, is given by $$\zeta = \frac{\hat{m}}{m} \tag{23}$$

The settling time for an underdamped system may be inversely proportional to the damping factor.

Figure 14:
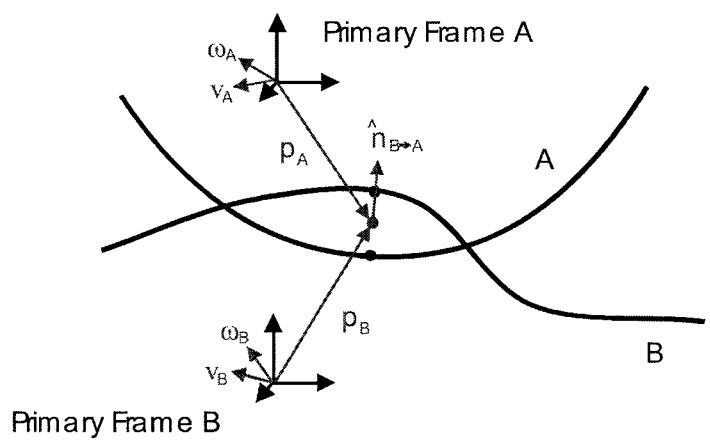
FIG. 14 depicts a diagram consistent with the processes of the present disclosure.

In one embodiment, each object in the proxy simulation may have its own reference frame, called the Primary Frame. For interaction of three-dimensional objects, the situation may be illustrated in FIG. 14, which shows that for two intersecting 3D objects, such as a wheel and a rock, the midpoint between the deepest intersection points is represented in both primary frames as $\vec{p}_A$ and $\vec{p}_B$. The contact point may be the spatial point midway between the deepest intersections of the two objects, such as a wheel and a rock. The location of this point as represented in the two object primary frames is given by $\vec{p}_A$ and $\vec{p}_B$. The normal $\hat{n}_{B \to A}$ is a unit vector along the axis defined by the two intersection points.

Figure 15:
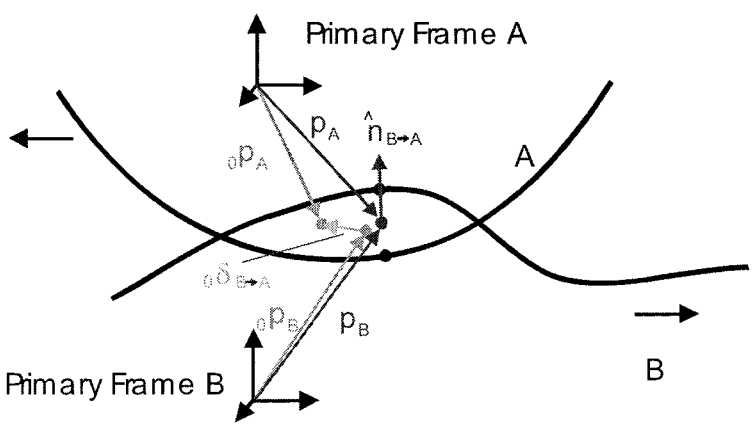
FIG. 15 depicts a diagram consistent with the processes of the present disclosure.

For calculating the friction between the two objects, the locations of the contact point in the two reference frames ($\vec{p}_A$ and $\vec{p}_B$) may be saved as $_0\vec{p}_A$ and $_0\vec{p}_B$. This is illustrated in FIG. 15, which shows that for two intersecting 3D objects, the midpoint between the deepest intersection points is represented in both primary frames and this representation moves as the objects move. As the two objects move, this point moves distinctly for the two objects, staying constant in each object's primary frame. The location of the point is stored for the first time step that is part of a static-friction mode.

The following quantities may be saved each from the first occurrence of a static mode:

The locations of the contact points in primary frame coordinates, as $\vec{p}_A$ and $\vec{p}_B$ $_0\vec{p}_A$ and $_0\vec{p}_B$.

Frame A represented in frame B, $^B T_A$.

The general velocity of frame A with respect to frame B, $^B V_A$.

Additionally/alternatively, to the method presented above, a more advanced terrain simulation methods for use specifically with the K10 and similar robots may be designed and specified as follows.

In one embodiment, to model interaction between rigid wheel and soil, Bekker theory may be used. The inputs may be the sinkage, the slip ratio, and the slip angle. Given these inputs, this component then may computes the drawbar pull ($F_x$), the side force ($F_y$), the vertical force ($F_z$), and the wheel moment ($M_w$) using the following equations.

$$F_x = rb \int_{\theta_r}^{\theta_f} (\tau_x(\theta)\cos\theta - \sigma(\theta)\sin\theta)\, d\theta \tag{24}$$

$$F_y = \int_{\theta_r}^{\theta_f} (rb\tau_y(\theta) + R_b(r - z(\theta)\cos\theta))\, d\theta \tag{25}$$

$$F_z = rb \int_{\theta_r}^{\theta_f} (\tau_x(\theta)\sin\theta + \sigma(\theta)\cos\theta)\, d\theta \tag{26}$$

$$M_w = r^2 b \int_{\theta_r}^{\theta_f} \tau_x(\theta)\, d\theta \tag{27}$$

Additionally/alternatively, the force calculations may depend on soil characteristics such as cohesion, internal friction angle, cohesive modulus, frictional modulus, shear deformation modulus, sinkage component, and sinkage ratio, and these soil characteristics may be added as part of the surface properties.

In one embodiment, the operator might not know during execution of DPS process 10 whether the robot is real or simulated. For example, DPS process 10, may allow for a switch between the digital proxy simulation (e.g., proxy 304), and the robotic hardware (e.g., robotic device 54), such that it may not be necessary for an operator (e.g., User 36 and/or User 38) to perform additional tasks when switching between the physical hardware and a digital simulation. In that case, an operator may be only concerned with the result of an operation without necessarily being concerned with whether the object of the operation is the actual robotic hardware (e.g., robotic device 54). In whole or in the digital proxy simulation (e.g., proxy 304).

Additionally/alternatively, DPS process 10, may perform recently and using a virtual switch (e.g., switch 306) that exists between the robotic hardware (e.g., robotic device 54) in the digital proxy simulation (e.g., proxy 304). For example, an operator (e.g., User 36 and/or User 38) may operate either the physical robotic hardware (e.g., robotic device 54) or the digital proxy simulation (e.g., proxy 304) by utilizing a virtual switch (e.g., switch 306). This may be achieved because, as explained above, both the physical robotic hardware (e.g., robotic device 54), and the digital proxy simulation (e.g., proxy 304) may share the same network interface.

In one embodiment, the sensor simulation includes, at least in part, a camera simulation provided using GPU real-time rendering with a noise model and a lidar simulation provided using GPU real-time rendering with a noise model. For example, a lidar sensor may be part of standard equipment on a robotic hardware (e.g., NASA K10 robot). Typically, it may be used to capture a 2.5-D image of a scene by sending out thousands of laser pulses and using time-of-flight calculations to determine the distance to the first reflecting surface in the scene. Synthetic lidar scanners may be necessary for simulation purposes. Assuming that a 3D model of a scene exists, one may simulate lidar scan results by casting rays on to the scene and measuring the distances of the intersecting points.

In one embodiment, the lidar scanner equipped on robotic hardware (e.g., NASA K10 robot) may be, for example, an ILRIS-3D scanner from Optech. It is understood that this is only an example, and other lidar scanners may be used. Based on information from its web site, the specifications of the ILRIS-3D scanner are listed in the following table.

TABLE 3

Specifications of ILRIS-3D scanner.

| Performance | |
|---|---|
| Dynamic scanning range | 3 m-1,500 m to an 80% target |
| | 3 m-800 m to an 20% target |
| | 3 m-350 m to an 4% target |
| Data sampling rate (actual measurement rate) | 2,500 points per second |
| Beam divergence | 0.00974° |
| Minimum spot step (X and Y axis) | 0.00115° |
| Raw range accuracy | 7 mm @ 100 m |
| Raw positional accuracy | 8 mm @ 100 m |
| Laser wavelength | 1,500 nm |
| Scanner field of view (ILRIS-3D) | 40° × 40° |

Considerations

Figure 16:
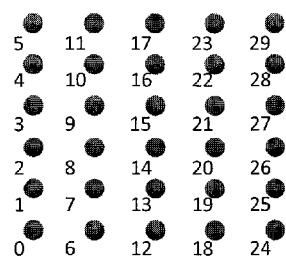
FIG. 16 depicts a diagram consistent with the processes of the present disclosure.
Figure 17:
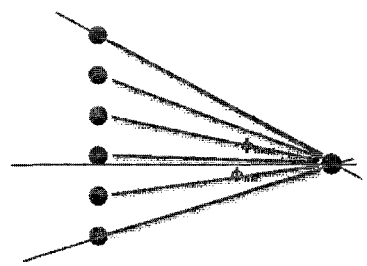
FIG. 17 depicts a diagram consistent with the processes of the present disclosure.
Figure 18:
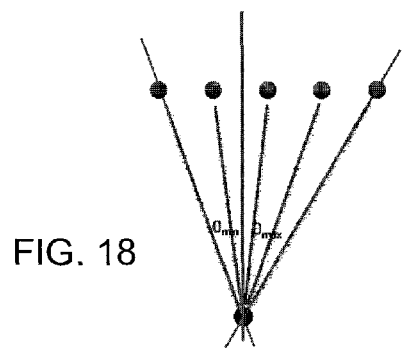
FIG. 18 depicts a diagram consistent with the processes of the present disclosure.

In one embodiment, Ray-casting may be used. Ray-casting may be a straightforward way to simulate the inner workings of lidar scanners. Rays may be cast from the scanner's origin. When a ray hits (intersects) a surface of an object in the scene, the intersection point and the distance from the scanner's origin to that point may be stored. The scan results may be collected by casting rays in a rectangle-patterned grid within the operating (vertical and horizontal) fields of view (FOV) and computing the distances and intersection points for all those rays. FIG. 16 may depict the grid of intersection points if the rays are cast on a planar object. It may also label the scan points in the order of acquisition of those points. FIGS. 17 and 18 show the vertical and horizontal fields of view, respectively. The central sphere, where the lines project from, denotes the lidar scanner's origin. The min and max FOV angles need not be equal.

Synthetic lidar scanners may be simulated by casting one ray at a time until the entire grid is covered. However, this approach may be slow, especially with high numbers of rays, as the computation time grows approximately linearly with the total number of rays (scan points).

Additionally/alternatively, OpenGL may be used to simulate lidar scanners. The main advantage of OpenGL is speed, as the computation can be done on the Graphics Processing Unit (GPU), rather than on a CPU, which is highly optimized and highly parallelized for graphical applications. As will later be shown below, OpenGL may be more than two orders of magnitude faster than a non-OpenGL solution. A concern may be that OpenGL would be challenged in modeling accurate distances over large ranges (3-350 m for the Optech lidar). However, most modern (low- and mid-end) GPUs may support 24-bit depth buffer. Some high-end GPUs may even support a 32-bit depth buffer. The analysis given below may show that OpenGL with 24-bit depth buffer may be adequate to model the lidar data of the robotic hardware (e.g., the NASA K10 robot).

In one embodiment, the lidar simulation may be performed using a depth buffer technique for measuring distances. For example, the depth buffer (also known as z-buffer) may be used in OpenGL to resolve the distance between two nearby objects to determine which objects may be hidden behind which others. Because the z-buffer may deal directly with distances, it may be almost directly applicable for simulating lidar scanners.

The near and far clipping planes may be the planes defining what objects may be rendered in the scene. Only the objects located between the two planes may be rendered. zNear and zFar are the distances from the eye to the near and far clipping planes, respectively. For synthetic lidar scanners, zNear and zFar can be thought of as the minimum and maximum range values of the scanners.

The z-buffer may be nonlinear. The actual number stored in the z-buffer memory may be expressed in terms of the distance to the object as:

$$z = (2^N - 1) \cdot \left(a + \frac{b}{d}\right), \quad (28)$$

Where N is the number of bits of Z precision, d is the distance from the eye (sensor) to the object, and $$a = \frac{zFar}{(zFar - zNear)}$$

$$b = \frac{zFar \cdot zNear}{(zNear - zFar)}$$

Note that z must be an integer so the value obtained from the above equation (28) will be rounded down. From the equation, one can observe that z trends inversely proportional to d, and hence the precision may be better for objects closer to the eyepoint than those farther away. This reciprocal behavior may be useful because objects that are close to the eyepoint may be needed to be rendered in great detail. However, this may also mean that distances far from the eyepoint may not be adequately discerned. Therefore, the smallest resolvable separation distance or resolution must be determined to ensure that the precision from the z-buffer is adequate for the application. To determine the resolution, denote two successive z values with $z_1$ and $z_2$ and the distances at those z values be $d_1$ and $d_2$. That is, $$z_1 = (2^N - 1) \cdot \left(a + \frac{b}{d_1}\right)$$

$$z_2 = (2^N - 1) \cdot \left(a + \frac{b}{d_2}\right)$$

Differencing $z_1$ and $z_2$ and setting it to unity, results in $$z_1 - z_2 = 1 = (2^N - 1) \cdot \left(\frac{b}{d_1} - \frac{b}{d_2}\right)$$

Let $\delta = d_1 - d_2$ be the smallest discernable distance. Rearranging the above equation yields $$\delta = \frac{d_1 d_2}{(2^N - 1)b} \approx -\frac{d^2}{(2^N - 1)b} \quad (29)$$

At d=350 m, zNear=3 m, and zFar=350 m, using the above equation, the resolution for 24-bit z-buffer is 0.002413 (or 2.4 mm). Compare this with the raw range accuracy of 7 mm at 100 m in the specifications table and the fact that the range data in the IDL is 16-bit integers (which translates to 5.34 mm discretization over 350 m range if linear). Based on this analysis the OpenGL depth buffer approach may be adequate for most anticipated purposes even when using only 24 bits.

Simulation with the Depth Buffer

Figure 19:
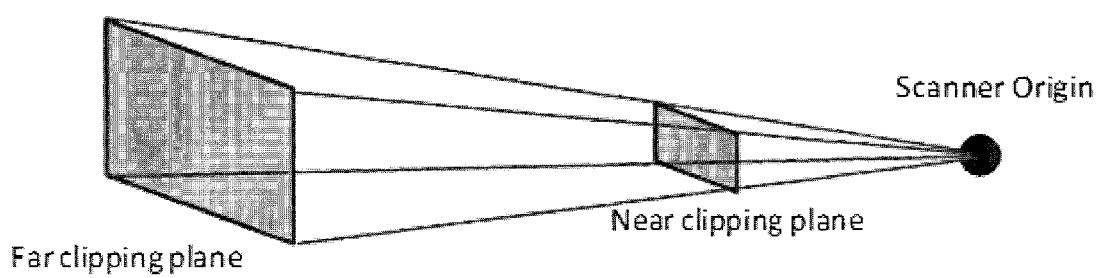
FIG. 19 depicts a diagram consistent with the processes of the present disclosure.

Not only the fact that the depth buffer measures the distances lends itself nicely to simulating lidar scanners—other aspects of OpenGL do as well. In OpenGL, a 3D perspective view of a scene by creating a frustum may be created. This is shown in FIG. 19, which shows the Frustum (volume between the near and far clipping planes) and depth buffer can be used simulate lidar scanners). Anything inside the frustum will be rendered. Creating the right frustum may result in almost directly using the distances returned by the depth buffer as the distances for the synthetic lidar scanner. The right frustum may have the following properties:

The eyepoint is at the scanner's origin.

The near and far clipping planes are at the min and max ranges.

The frustum has the same horizontal and vertical FOVs as the scanner.

The frustum has the same number of (horizontal and vertical) pixels as the number of scan points.

$$d = \frac{b(2^N - 1)}{z - a(2^N - 1)} \quad (30)$$

Figure 20:
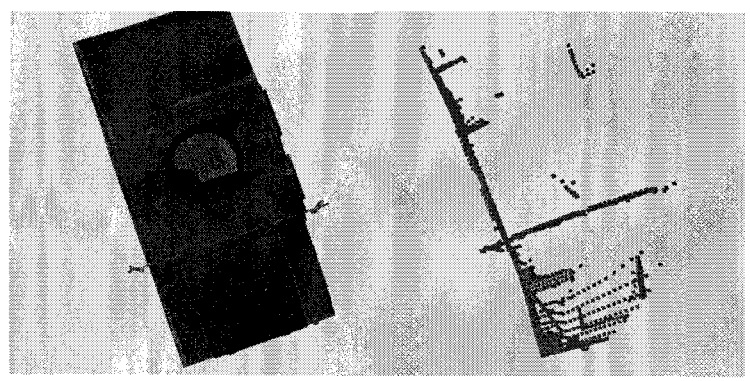
FIG. 20 depicts a diagram consistent with the processes of the present disclosure.

The distance obtained from equation (30) may be measured perpendicular to the near clipping plane. If used directly as the scanner distance, it may cause hemispherical distortion; i.e., it may cause the points on a plane to look as if they were on a hemispherical surface. This phenomenon is illustrated in FIG. 20, which shows a Point cloud with hemispherical distortion. Notice that the left side of the Humvee in the point cloud appears curved.

Figure 21:
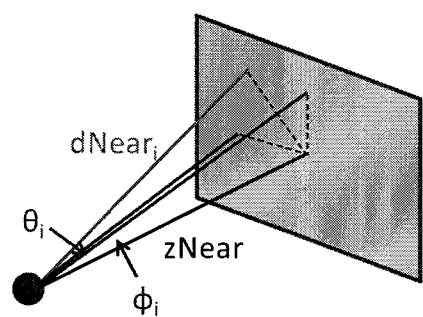
FIG. 21 depicts a diagram consistent with the processes of the present disclosure.

To correct for this distortion, the ratio between the distance at each scan point on the near clipping plane and the normal distance must be computed. This ratio is called the stretch factor and is given by $$s_i = \frac{dNear_i}{zNear} = \sqrt{\tan^2(\theta_i) + \tan^2(\phi_i) + 1}$$

where $\theta_i$ and $\phi_i$ are the horizontal and vertical angles of ray i, respectively. FIG. 21, shows the quantities that may be involved in computing the stretch factor.

The stretch factor may be then multiplied with the distance in equation (3) to yield the distortion-corrected distance given below.

$$d_i = \frac{b(2^N - 1) \cdot s_i}{z_i - a(2^N - 1)} \quad (31)$$

Figure 22:
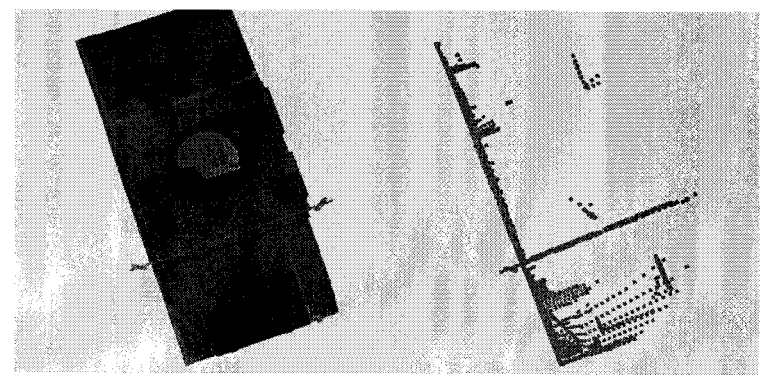
FIG. 22 depicts a diagram consistent with the processes of the present disclosure.

FIG. 22, shows the results with distortion corrected distance obtained with equation (31) of the same Humvee. Notice that the left side of the vehicle is now straight, as expected.

In one embodiment, the noise model may include, at least in part, a longitudinal and an orthogonal noise types. Longitudinal noise may represent the uncertainties in the distances along the rays. This noise may affect the range accuracy. Orthogonal noise may correspond to the uncertainties in the directions of the rays, which may affect the position accuracy. In the digital proxy simulation, both of these may be modeled as the Gaussian distributions with zero mean. Each may have its own variance (standard deviation). Longitudinal noise may be included by simply adding the normal random length to each distance of each ray. For orthogonal noise, a vector with random length and direction (with the constraint that it be orthogonal to the ray direction) may be added to the intersection point.

In one embodiment, the depth buffer approach described above may be implemented in a C++ class named EcLidarRangeSensor. Some methods of this class are listed and described in the following table. Note that each of the first nine methods also has an associated set method to set those properties.

TABLE 4

Selected methods of EcLidarRangeSensor.

| Method | Description |
| --- | --- |
| label( ) | The label (identifier) of the sensor. |
| range( ) | The range values (min/max) of the sensor. |
| verticalFieldOfView( ) | The min/max vertical field of view angles. |
| horizontalFieldOfView ( ) | The min/max horizontal field of view angles. |
| numVerticalScanPoints( ) | The number of scan points in the vertical direction. |
| numHorizontalScanPoints ( ) | The number of scan points in the horizontal direction. |
| rangeVariance( ) | The variance of the longitudinal noise. |
| positionVariance( ) | The variance of the orthogonal noise. |
| linkAttachment( ) | Specifies how the sensor is attached to a robot. |
| init( ) | Initializes the sensor with a stated system. |
| performScan( ) | Performs a scan. The input is the state. |
| scanResults( ) | Returns the scan results of a prior call to performScan( ). |

EcLidarPoint may be a struct that may store the information about the acquisition of a single scan point. It may contain:

The coordinates of the intersection point (the point at which the ray intersects an object in the scene) in the form of an EcVector.

The distance from the sensor's origin to the intersection point in the form of a double.

A Boolean flag indicating whether the ray hits any object in the scene.

The scan results may be simply a vector of EcLidarPoint objects (which is typedefed to EcLidarPointVector) for all the scan points of the sensor.

The example code below, which is an example of software code that may be used to implement an embodiment of the disclosure, using this capability is given in the text box below, which shows a code snippet showing how to create and use the synthetic lidar sensor.

```
// create a scene with a sphere
EcIndividualManipulator manip;
EcIndividualManipulatorVector manips;
EcSphere sphere;
sphere.setRadius(1.0);
manip.setFromShape(sphere);
manip.setLabel("sphere1");
manips.pushBack(manip);
// add a manipulator to mount the sensor on
sphere.setRadius(0.1);
manip.setFromShape(sphere);
manip.setLabel("sensorManip");
manips.pushBack(manip);
EcManipulatorSystem system;
system.setManipulators(manips);
statedSys.setFromSystem(system);
// move the sphere
state=statedSys.state( );
state.positionStates( ) [0].coordSysXForm( ).setTranslation(EcVector(50,0,0));
state.positionStates( ) [1].coordSysXForm( ).setTranslation(EcVector(-0.1,0,0));
statedSys.setState(state);
const EcU32 numScanPoints = 100;
// create a synthetic lidar sensor
EcLinkAttachment linkAtt;
linkAtt.setManipulatorIndex(1);
linkAtt.setLinkIdentifier("sensorManip");
EcCoordinateSystemTransformation frame;
frame.setTranslation(EcVector(0.1,0,0));
linkAtt.setFrame(frame);
EcLidarRangeSensor lidar;
lidar.setLinkAttachment(linkAtt);
lidar.setRange(EcXmlRealRealPair(3.0, 350.0));
lidar.setHorizontalFieldOfView(EcXmlRealRealPair(-20*EcDEG2RAD,
20*EcDEG2RAD));
lidar.setVerticalFieldOfView(EcXmlRealRealPair(-20*EcDEG2RAD,
20*EcDEG2RAD));
lidar.setNumHorizontalScanPoints(numScanPoints);
lidar.setNumVerticalScanPoints(numScanPoints);
lidar.setRangeVariance(0.007);
lidar.setPositionVariance(0.008);
// initialize with the stated system
lidar.init(&statedSys);
// perform a scan with the state
lidar.performScan(state);
// obtain the scan results
const EcLidarPointVector& scanResults = lidar.scanResults( );
```

In some embodiments, the synthetic lidar sensor implemented above may be tested in different scenarios to ensure that the accuracy and performance are satisfactory and the noise models work as expected. Some of the tests to be performed may be an accuracy test, a performance test, and/or a noise test. It is understood that the above are only examples and other tests may be performed.

Accuracy Test

In an accuracy test, a sphere with a radius of 1.0 m may be placed at varying distances from the sensor's origin to determine how the distance may affect the accuracy of the synthetic lidar sensor. The sensor properties may be set as listed below. Note that the numbers of scan vertical and horizontal scan points need to be odd so that there is one ray (the center one) that will be cast directly perpendicular to the near clipping plane.

Range: 3-350 m
Vertical FOV: ±2°
Horizontal FOV: ±2°
Vertical scan points: 21
Horizontal scan points: 21

Table lists the errors and expected errors (derived from equation (2)) at various distances. The results may confirm that the OpenGL approach may be adequate as far as accuracy is concerned.

TABLE 5

Errors at varying distances.

| Location | Ideal Distance | Simulated lidar Distance | Error | Expected Error |
|---|---|---|---|---|
| 5 | 4 | 4 | 0 | 4.92e−7 |
| 20 | 19 | 19 | 0 | 7.88e−6 |
| 100 | 99 | 99 | 0 | 1.97e−4 |
| 200 | 199 | 199 | 0 | 7.88e−4 |
| 300 | 299 | 298.998 | 0.002 | 0.00177 |
| 350 | 349 | 349.001 | 0.001 | 0.00241 |

Performance Test

Since the OpenGL approach was chosen primarily due to its speed, it is essential that this decision was justified with quantifiable results. The performance of the depth buffer approach may be compared with the straightforward intersection approach. For intersection calculations, a standard OpenSceneGraph intersection method (osgViewer::View::compute Intersections) may be used. The tests may be conducted on a computer with the following specifications:

CPU: AMD Phenom II X4 945 3.00 GHz
RAM: 8 GB
OS: Windows 7 64-bit
GPU: ATI Radeon HD 4650

The sensor properties may be set as follows:
Range: 3-350 m
Vertical FOV: ±20°
Horizontal FOV: ±20° it is understood that the above are only examples and other computers with other specifications may be used as well as other sensor properties.

Figure 23:
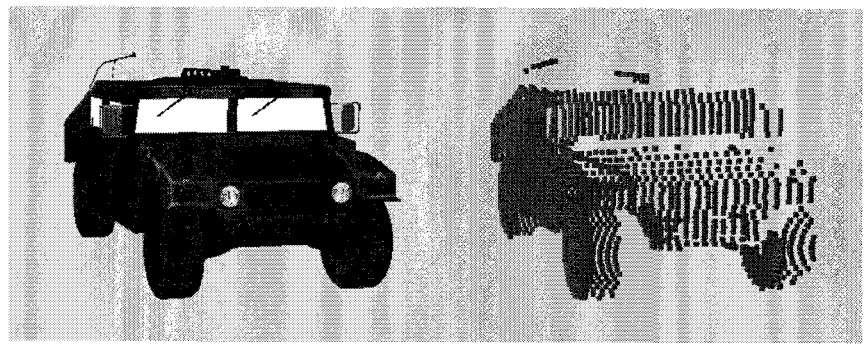
FIG. 23 depicts a diagram consistent with the processes of the present disclosure.

The Humvee model shown in FIG. 23 may be used for these performance tests. FIG. 23 shows the Humvee model as used in the performance tests and the point cloud from the synthetic sensor.

As can be seen from the table below, the depth buffer approach may be significantly faster than the intersection approach. The performance difference also may grow as the number of scan points increases. For a 90×90 grid, the depth buffer approach may be more than 300 times faster than the intersection approach.

TABLE 1

IDLs included in PoseEstimator.idl.

| Number of scan points | Avg. scan time (s): Intersection approach | Avg. scan time (s): Depth buffer approach | Ratio |
|---|---|---|---|
| 225 (15 × 15) | 0.0410 | 0.00098 | 41.8 |
| 900 (30 × 30) | 0.1246 | 0.00118 | 105.6 |
| 3600 (60 × 60) | 0.4611 | 0.00202 | 228.3 |
| 8100 (90 × 90) | 1.0242 | 0.00334 | 306.7 |

Figure 24:
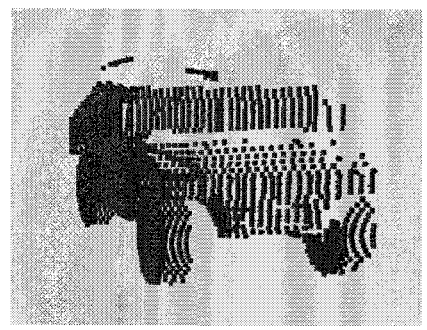
FIG. 24(a) depicts a diagram consistent with the processes of the present disclosure.
FIG. 24(b) depicts a diagram consistent with the processes of the present disclosure.
Figure 24:
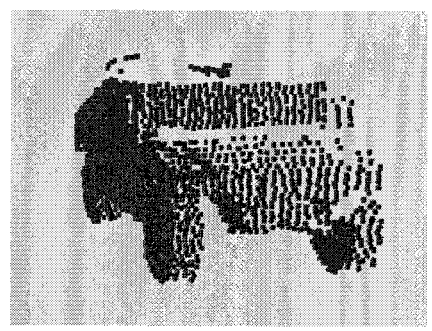

In these simulations, the effects of simulated noise may be visualized. The same Humvee model may be used and the sensor properties may be the same as in the performance tests, except that both the number of vertical and horizontal scan points may be set to 100. FIGS. 24(a) and 24(b) show the scan results with varying noise characteristics. In FIG. 24(a), there is no noise (perfect sensor). In FIG. 24(b), the variances from the ILRIS-3D scanner are used.

In one embodiment, the simulation of a robotic hardware (e.g., NASA K10 robot) was used for observation, with the following sensor properties:
Range: 3-350 m
Vertical FOV: ±20°
Horizontal FOV: ±20°
Vertical scan points: 100
Horizontal scan points: 100

Figure 25:
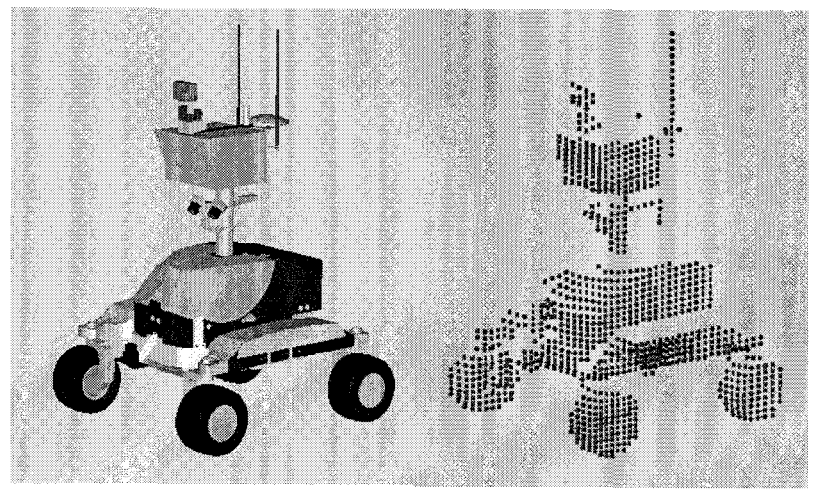
FIG. 25 depicts a diagram consistent with the processes of the present disclosure.

FIG. 25 shows the K10 model and the resulting synthetic scan.

In one embodiment, DPS process 10, may provide for digitally simulating any number of cameras that may be rigidly attached with any position and any orientation to any link on the robot. Additionally/alternatively, each camera may be assigned any field of view and any size in pixels. Noise models may also be added to the cameras to simulate realism. A dialogue box for configuring cameras may be used. It is understood that the other means for configuring the cameras may also be used in the above is only an example.

As explained above, communication services may be used for the exchange between the robotic hardware (e.g., robotic device 54), and digital proxy simulation (e.g., proxy 304). Interfaces may be defined using Interface Description Language (IDL). It is understood that IDLs may define the interfaces for CORBA services. The IDL compiler may create stub code for the client and skeleton code for the server. The following may describe the IDL files for the Pose Estimator, Navigator, and Locomotor.

In one embodiment, the pose estimator interface may be defined in PoseEstimator.idl. The following table describes the IDLs included in PoseEstimator.idl.

TABLE 7

IDLs included in PoseEstimator.idl.

| IDL | Description |
|---|---|
| Pose2dEstimator.idl | This is a definition of an interface that is inherited by PoseEstimator. |
| SPoseEstimator.idl | Structure type definition for a pose and covariance. The pose is defined by Location.idl as three positions and roll, pitch, and yaw. It also defines a 2D location as two positions and a heading. Location.idl includes BaseTypes.idl which defines basic types. BaseTypes.idl includes TimeBase.idl which is a TAO CosTime service for managing time across all the services. |

PoseEstimator may inherit from Pose2dEstimator. The following table may describe the IDLs included in Pose2dEstimator.idl.

TABLE 8

IDLs included in Pose2dEstimator.idl.

| IDL | Description |
|---|---|
| Sensor.idl | This is a definition of an interface that is inherited by Pose2dEstimator.idl. |
| Location.idl | Described above. |
| Exception.idl | Describes the exceptions available to services. Pose2dEstimator uses ENotSupported, EUnknownName, and ETimeout. |

Sensor.idl may be the base interface for all sensors, and it may include the IDLs in the following table.

TABLE 9

IDLs included in Sensor.idl.

| IDL | Description |
|---|---|
| Entity.idl | This is a definition of an interface that is inherited by Sensor. |

Sensor may inherit from Entity, which may be the base interface for all robot interfaces. It may contain a unique name and a property list, and it may include the IDLs in the following table.

TABLE 10

IDLs included in Entity.idl.

| IDL | Description |
|---|---|
| BaseTypes.idl | BaseTypes defines the basic types. BaseTypes.idl includes TimeBase.idl which is a TAO CosTime service for managing time across all the services. |

Figure 26:
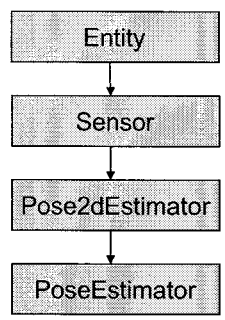
FIG. 26 depicts a diagram consistent with the processes of the present disclosure.

The overall inheritance hierarchy of PoseEstimator is shown in FIG. 26.

The IDL generator may create thirteen abstract methods that may be defined in the table below. The getPose( ) method may be used by robot user interface (e.g., VERVE) to get the pose. For illustrative purposes, the VERVE robot user interface may be referenced as an example. As explained above, VERVE may refer to the Java-based front end used by NASA to display the robot telemetry.

TABLE 11

Abstract methods generated by IDL compiler.

| Method | IDL definition |
|---|---|
| virtual char * name ( ); | Entity |
| virtual ::gri::PropertySeq * properties ( ); | Entity |
| virtual char * associatedFrame ( ); | Sensor |
| virtual char * referenceFrame ( ); | Sensor |
| virtual ::CORBA::Boolean useOdometryProcessModel ( ); | Pose2dEstimator |
| virtual ::CORBA::Boolean resetable ( ); | Pose2dEstimator |
| virtual void reset ( ); | Pose2dEstimator |
| virtual ::CORBA::Boolean init( ); | Pose2dEstimator |
| virtual void setReferenceFrame ( ); | Pose2dEstimator |
| virtual ::gri::SPose2DEstimate getPose2d ( ); | Pose2dEstimator |
| virtual ::gri::SPose2DEstimate getWaitPose2d ( ); | Pose2dEstimator |
| virtual ::gri::SPoseEstimate getPose( ); | PoseEstimator |
| virtual ::gri::SPoseEstimate getWaitPose ( ); | PoseEstimator |

The navigator interface may be defined in Navigator.idl. The following table may describe the IDLs included in Navigator.idl.

TABLE 12

IDLs included in Navigator.idl.

| IDL | Description |
|---|---|
| Subsystem.idl | This is the definition for a generic interface for a robot subsystem. It is inherited by Navigator. |
| SNavGoal.idl | Navigator status |
| Waypoint.idl | Generic waypoint definition |
| BaseTypes.idl | Basic type definitions |

Navigator may inherit from Subsystem. The following table may describe the IDLs included in Subsystem.idl.

TABLE 13

IDLs included in Subsystem.idl.

| IDL | Description |
|---|---|
| Entity.idl | This is a definition of an interface that is inherited by Sensor. |
| Exceptions.idl | Describes the exceptions available to services. Subsystem uses ENotSupported, EFailure, EBusy, EFailure, ETimeout, and EInterrupted. |

Figure 27:
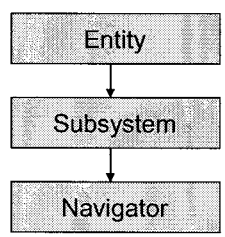
FIG. 27 depicts a diagram consistent with the processes of the present disclosure.

Subsystem may inherit from Entity, which may be the base interface for all robot interfaces. It may contain a unique name and a property list, and may include the IDLs defined in Table 8 above. The overall inheritance hierarchy of Navigator is shown in FIG. 27.

The interface for the rover locomotor subsystem may be defined in Locomotor.idl. The following table may describe the IDLs included in Locomotor.idl.

TABLE 14

IDLs included in Locomotor.idl.

| IDL | Description |
|---|---|
| Subsystem.idl | This is the definition for a generic interface for a robot subsystem. It is inherited by Locomotor. |
| Location.idl | Location is defined as three positions and roll, pitch, and yaw. It also defines a 2D location as two positions and a heading. Location.idl includes BaseTypes.idl which defines basic types. BaseTypes.idl includes TimeBase.idl which is a TAO CosTime service for managing time across all the services. |

Figure 28:
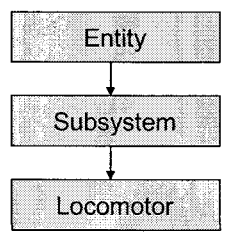
FIG. 28 depicts a diagram consistent with the processes of the present disclosure.

The overall inheritance hierarchy of Locomotor may be shown in FIG. 28.

Figure 29:
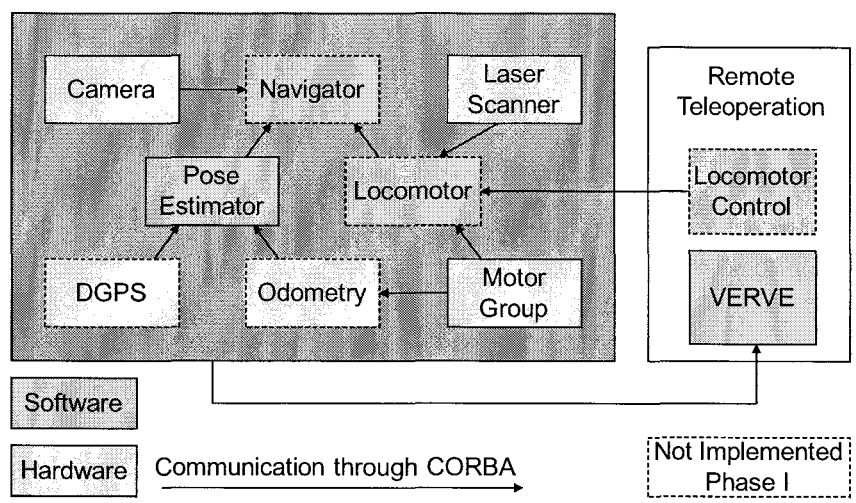
FIG. 29 depicts a diagram consistent with the processes of the present disclosure.
Figure 30:
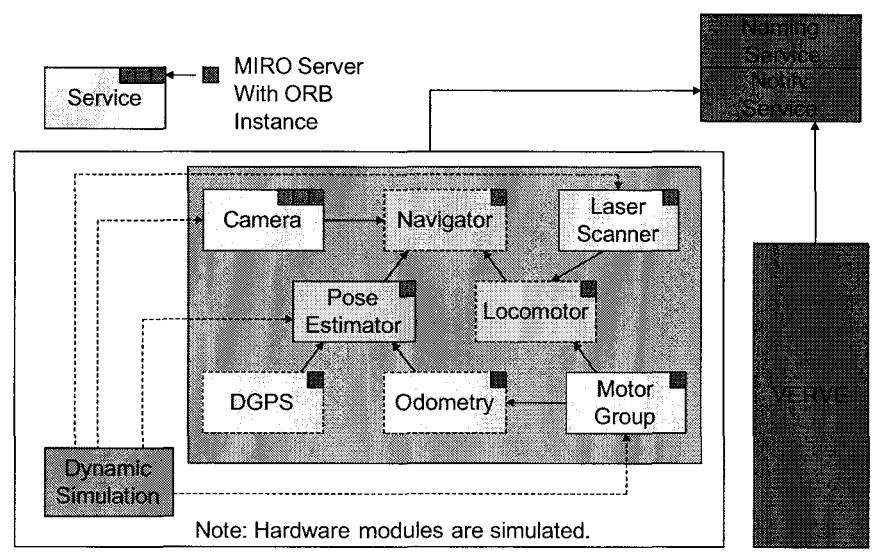
FIG. 30 depicts a diagram consistent with the processes of the present disclosure.

For illustrative purposes, and referring to FIG. 29, which shows a simplified view of the Rover (e.g., NASA K10 robot) software architecture. For example, the K10 robot may be controlled through the Locomotor service which may be controlled by polling from the Locomotor Control client. Most of the other services may interact with robot user interface (e.g., VERVE) using a publish/subscribe approach that may be facilitated by the Notify Service. In one embodiment, the following services may be implemented: Pose Estimator, Motor Group, Camera, and Laser Scanner. Referring to FIG. 30, which shows the modified architecture for proxy simulation. The dynamic simulation may supply the proxy data to the services may be is displayed in VERVE. The Naming and Notify services may be standard CORBA services. The Naming service may enable other services to be found across networks and the Notify service may enable the publish/subscribe mechanism for event-driven communication. It is understood that the above are only examples and other services may be used.

As explained above, NASA robots and tools are used in this disclosure for illustrative purposes, applicability to other robotic systems and tools may be achieved. In one embodiment, NASA tools in the form of a Red Hat x86 virtual machine image containing roversw source code were used. In order to understand the process required for communicating with the NASA tools, the roversw source code may be copied from the virtual machine image onto a computer machine (e.g., Kubuntu 10.04 amd64 machine) with the purpose of compiling the code natively. Building on Kubuntu may require two tasks: obtaining the necessary third-party library dependencies, and building on the target platform. Once these tasks were complete, an effort may be made to port the necessary pieces of roversw to Windows.

In an embodiment, Python script for building third-party libraries from source code may be maintained. This script may allow the exact build configuration of each dependency library to be revision controlled, and it may provide consistency across a variety of platforms. Additionally, this script may ease the transition to new platforms by simplifying the process of providing native third-party library builds. To enable integration with the NASA software, each third-party library may have a separate Python module that may detail its build configuration and build process. The following table shows some of the libraries supported by the new build scripts. Some of the Python scripts may support building packages on the following platforms: Visual Studio 2005, Visual Studio 2008, Mac OSX, Linux x86, and Linux amd64. The majority of packages may be supported on all of the platforms; however, some packages may only be supported for a subset of the platforms.

TABLE 15

Third-party library modules supported by Energid's build scripts.

| ACE + TAO | eigen | jsoncpp | OpenCV | Qt |
|---|---|---|---|---|
| Atlas | ffmpeg | libdc1394 | OpenVRML | QtPropertyEditor |
| Boost | fltk | libjpeg | OSG | Qwt |
| bzip2 | freetype1 | libpng | osgEphemeris | Tiff |
| Clapack | freetype2 | libraw1394 | pcre | Tinyxml |
| collada-dom | gdal | libungif | proj4 | Vxl |
| Curl | gsl | libxml2 | Qhull | Zlib |

Additionally/alternatively, Roversw may also be compatible with other operating systems, such as Kubuntu. For example, Kubuntu 10.04 uses gcc version 4.4.3. Additionally some of the third-party library dependencies built in the previous step may have different versions than are being used in the Red Hat virtual machine image. For instance, ACE+TAO version 5.7.8, Boost version 1.41, and Qt version 4.6.2 may be used. It is understood that the above are only examples and other systems may be applicable.

In one embodiment, Roversw may be ported to Windows. For example, in this case, Miro may be required in addition to the third-party library dependencies was Miro. Porting Miro to compile with Visual Studio 2005 and 2008 may require the renaming of a source and header file within the Miro project. The renaming may avoid a conflict with a system header named io.h.

In one embodiment, the Energid Actin toolkit may be integrated with third-party tools (e.g., NASA tools), which may require using a plug-in framework. Specifically, the following services may be implemented as plugins: notification service, pose estimator service, motor group service, image sender service, and lidar service.

In one embodiment, a separate Miro::Server process may be created for each unique robot naming context. The multiple processes involved may imply the need for inter-process communication. The responsibilities of each service plugin may be as follows:

Start interprocess communication for each robot.
Start the separate Miro::Server process for each robot.
Communicate status updates via interprocess communication to each robot.
Stop the separate Miro::Server process for each robot.
Stop interprocess communication for each robot.

Figure 31:
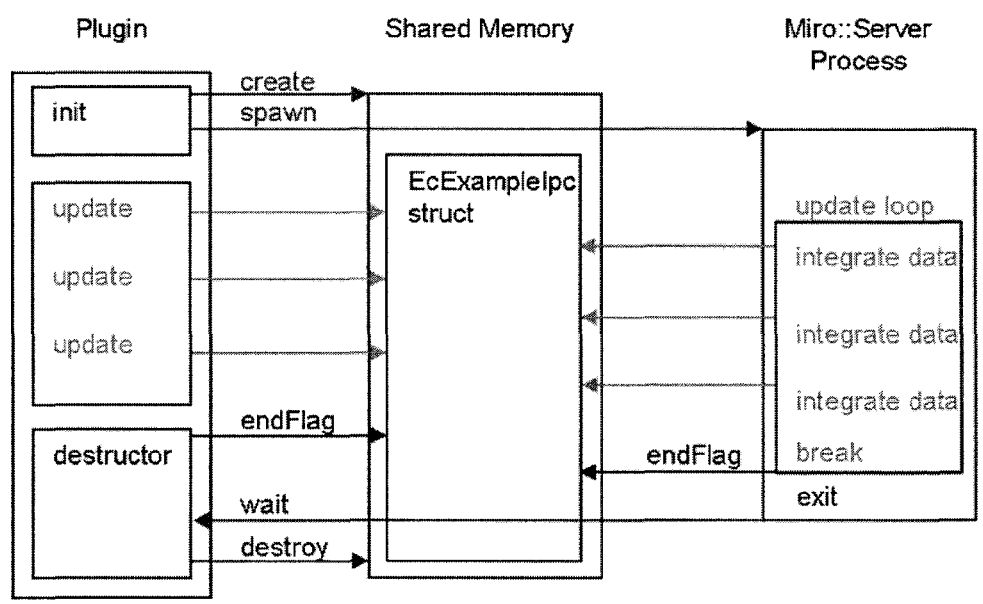
FIG. 31 depicts a diagram consistent with the processes of the present disclosure.

The plugins may implement three methods: init, update, and reset. The init method may be called when the plugin is first loaded. The update method may be called at each time step during the simulation loop. The reset method may be called whenever a new simulation is loaded. FIG. 31 shows a graphical representation of a plugin design. For example, the service plugins may be configured through an XML file, EcK10ProxySimConfiguration.xml. This file may contain the naming service IOR and event channel name in addition to a coordinate system transformation and a robot-name-to-manipulator-index mapping. The pose estimator service plugin may update every 50 ms. At each update, the plugin may transform and send the position state of each manipulator to the shared memory segment associated with the appropriate robot naming context.

Figure 32:
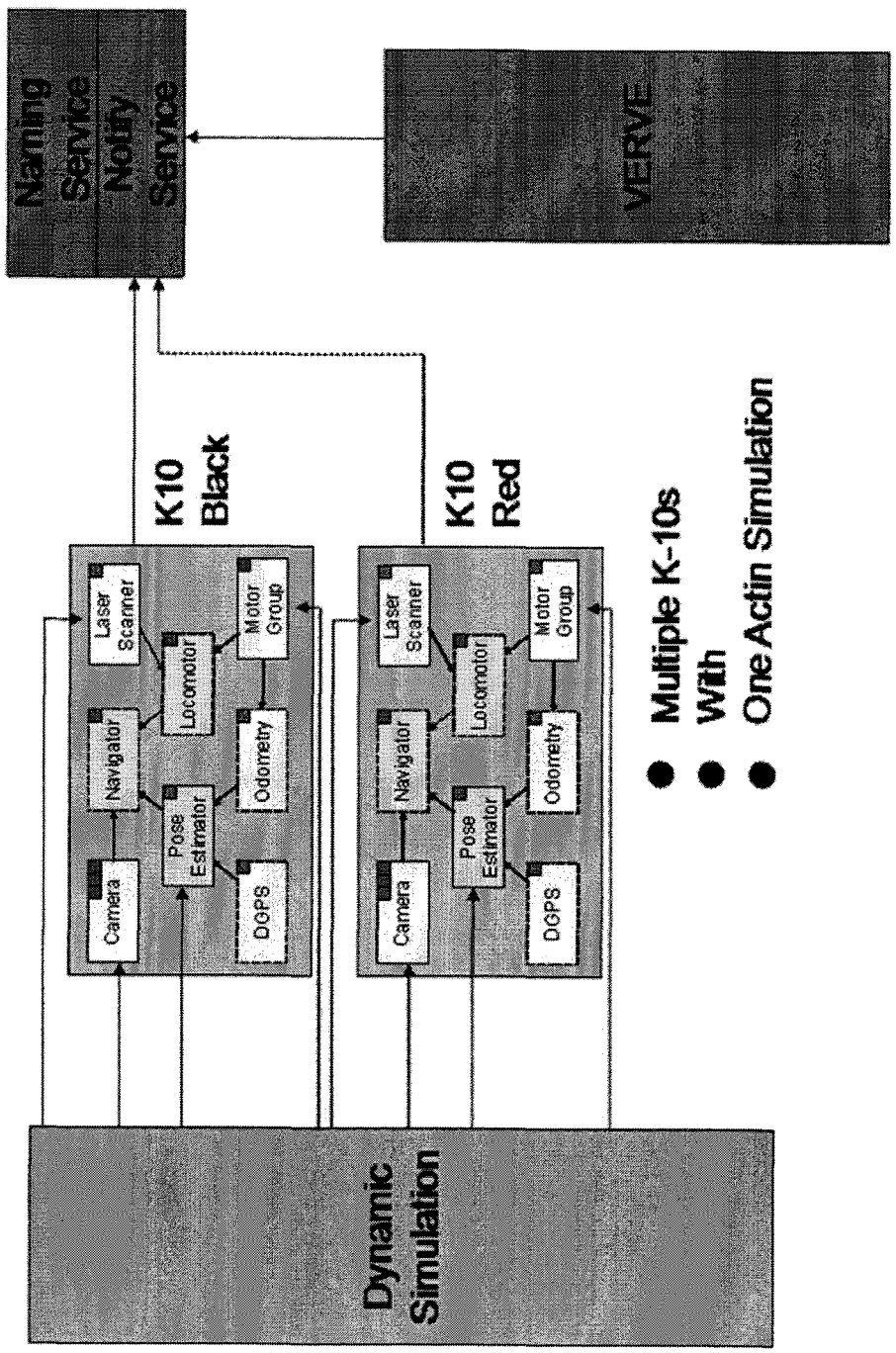
FIG. 32 depicts a diagram consistent with the processes of the present disclosure.

In one embodiment, the proxy simulation of multiple robots by using one dynamic simulation may be enabled as shown in FIG. 32. Use of one simulation may simplify the simulated interaction of the proxy robots with each other and the environment but may have the drawback of placing the computational burden on one processor.

Figure 33:
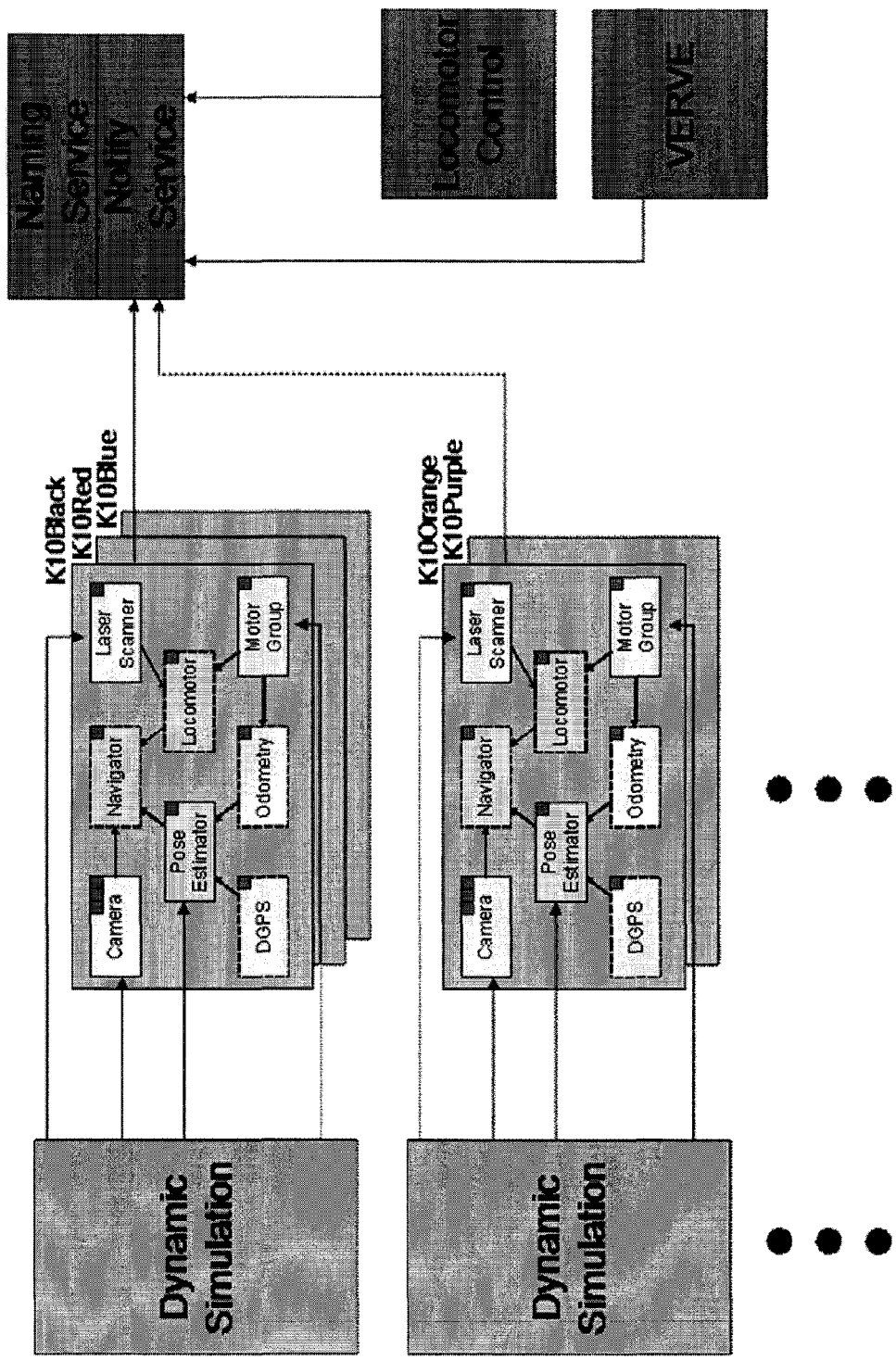
FIG. 33 depicts a diagram consistent with the processes of the present disclosure.

In another embodiment, and referring to FIG. 33, the use of multiple simulations to multi-process the simulation may be achieved for simulating one or more K1 Os (e.g., robots, K10Black and K10Red, K10Blue, K10Orange, and K10Purple), in one simulation and sharing the state with other simulations. This may be an extension of the controller/responder networking mode that Actin supports.

In one embodiment, the proxy simulation software may be developed as an object-oriented toolkit. The hundreds of classes that may used in the development of DPS process 10 software may be organized and compiled into libraries that developers may use to create new software. A developer may subclass from one of the classes available in the toolkit and change it to suit a new purpose. It is understood that in such a large programming effort, the developer may adhere to consistent software coding standards. Additional standards may be needed to ensure the source code will build under Windows, Linux, and Mac OS.

In some embodiments, it may be useful to adhere to the following C++ coding standards.

To minimize conflicts with other third-party code (e.g., NASA code) that may be linked to the simulation code, values with global scope may be prefixed with the letters "Ec". This may include class names, macros, and utility functions.

Classes may include implementation of the "big four" methods: the constructor, the destructor, the copy constructor, and the equal operator. The copy constructor and equal operator will be deep (e.g., the contents of a pointer are copied, not the pointer value itself) except where noted in the class documentation and header files. If any of the big four are not implemented, they may be protected in the header file.

All classes that can be read or written as XML may have a clone( ) operator. This is also called a virtual constructor—it may return a new'ed copy of itself as a pointer of its appropriate base class. Clone methods will make a deep copy to allow objects to be used as prototypes. Most classes may also implement operator==( ) for testing.

All member functions besides constructors and destructors may begin with a lower-case letter and use the camel-hump style, with each word in the name beginning with a capital, for example, printResults( ).

All member variables may begin with the prefix "m_", followed by a capital letter if the variable represents a member object or basic type. For example, m_Range.

Static member variables may begin with the prefix "m_the". For example, m_theCount. Class names will begin with the prefix "Ec" followed by a capital and use the camel-hump style. For example, EcPolygonRootFinder.

Accessors may use const type& variableName( ) or getVariableName(const type& var). Mutators may use setVariableName(const type& var). (Basic types, like int and double, may be passed by value, but objects will be passed by reference.)

In some embodiments, a member variables may be protected, where no variables or methods may be private. This may provide third-party developers (e.g., NASA's developers) and contractors more flexibility when subclassing. Whenever there is a chance a method might be correctly called within another object, it may be declared public, even if not used in a public manner in the toolkit code.

Member functions as a rule may be declared virtual. This may provide maximum flexibility in subclassing. A few special, basic classes may be nonvirtual to improve runtime performance.

All member functions that do not modify member data may be declared const. It may be appropriate to have both const and nonconst versions of a method, such as when returning const and nonconst pointers or references. Accessors that return member variables may return const references. Mutators may pass const references. Static member variables that are not basic types (int, double, etc.) may be const.

Classes may be defined in .h files, with each .h file defining only one class. This may allow the code to be more easily understood. The filename may be parallel, but may not equal, the class name. For example, in some cases, the filename may be shortened.

Pointers will always be set to 0 when they are not valid. Member pointer variables are prefixed with "m_p", for example m_pImage.

Objects may be created in virtual factory methods. That is, "new" may not generally be used outside of methods specifically for creating objects. Factory methods may be prefixed with "new". For example, EcImage* newImage( ). The use of factory methods may allow third-party (e.g., NASA) to subclass an object and replace member variables with subclassed versions.

In some embodiments, multiple inheritance may not be used.

In some embodiments, all units may be SI unless the variable or method name includes the units. For example, lengthInches would be the length in inches, while length would be the length in meters.

Macros and macro-like functions may be named starting with "Ec" followed by upper-case letters.

Filenames for CPP and header files may be the same as the class names, with "ec" as a prefix. So, "ecJointActuator.h" may be the filename for class EcJointActuator, and "ecPolygon.h" may be the filename for EcPolygon. In all cases, filenames may start with a lower-case letter.

Microsoft-specific extensions may be avoided. Though third-party-specific interfacing code may work only under Windows or Linux, the core toolkit may be cross-platform.

Exception handling may be avoided in favor of null pointer return in most cases. This may allow general good practice (checking pointers) to overlap with error handling and leads to less cluttered, faster code. There may be three areas in which exception handling may be used:
  When it is required by other (third party) software.
  When there is no appropriate return type to flag an error.
  When an error condition requires a lot of information or information that is different from nonexception cases.

The use of friend classes may be avoided. Friendship may not be inherited, which may complicate reuse.

Additionally/alternatively to the examples discussed above, several software modules may be implemented, as will be discussed in greater detail below.

Figure 34:
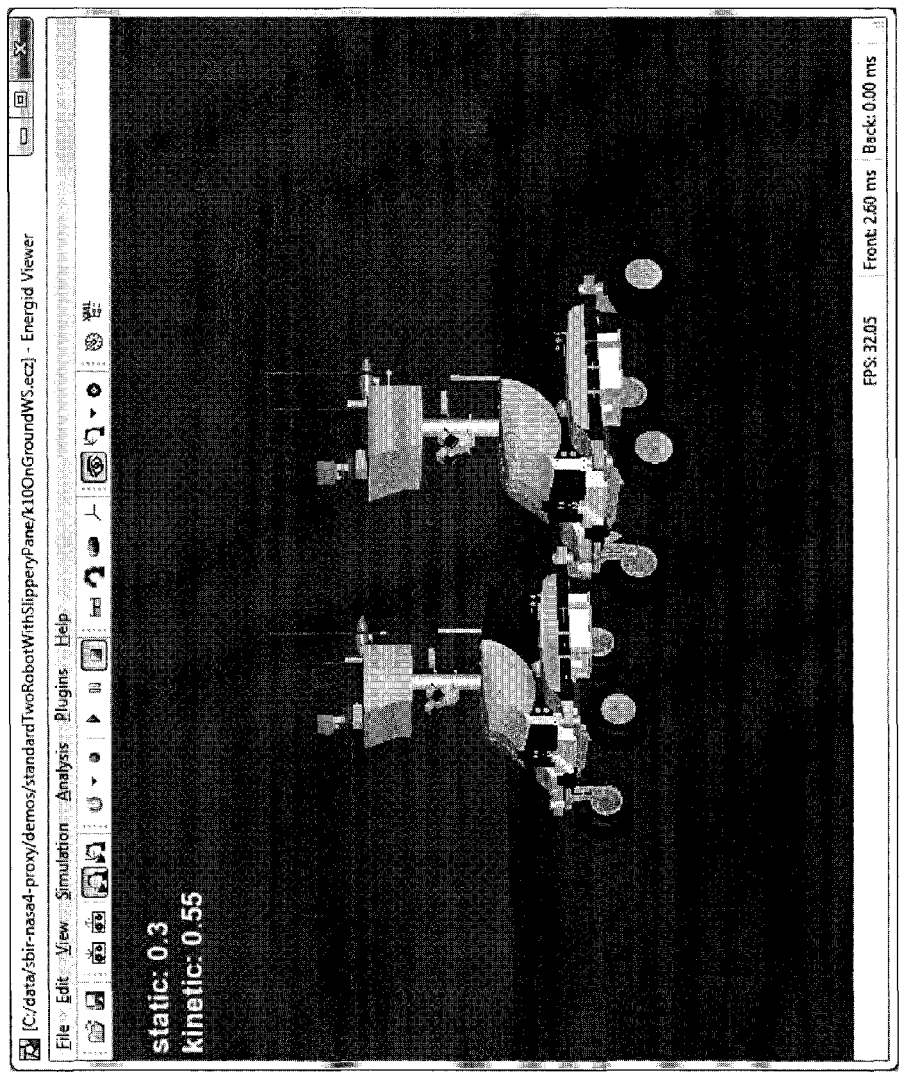
FIG. 34 depicts a diagram consistent with the processes of the present disclosure.

For illustrative purposes, a plugin for dynamically changing terrain-wheel friction parameters may be implemented for demonstration, as illustrated below. Referring to FIG. 34, which shows an exemplary illustration of the terrain-change plugin, which supports dynamically changing the static and kinetic friction coefficients for a dry friction model of terrain interaction. The coefficients may be shown as rendered in real time and the background color also made change as a function of the parameters.

In one embodiment, the friction parameters may be changed either with the s (static decrease), S (static increase), k (kinetic decrease), or K (kinetic increase) keys. Additionally/alternatively, the friction parameters may be changed using sliders on a dialog available through a left-click menu. A dialog with sliders may allow the coefficients to be changed while the simulation is running. The values may also be changed using keystrokes.

Figure 35:
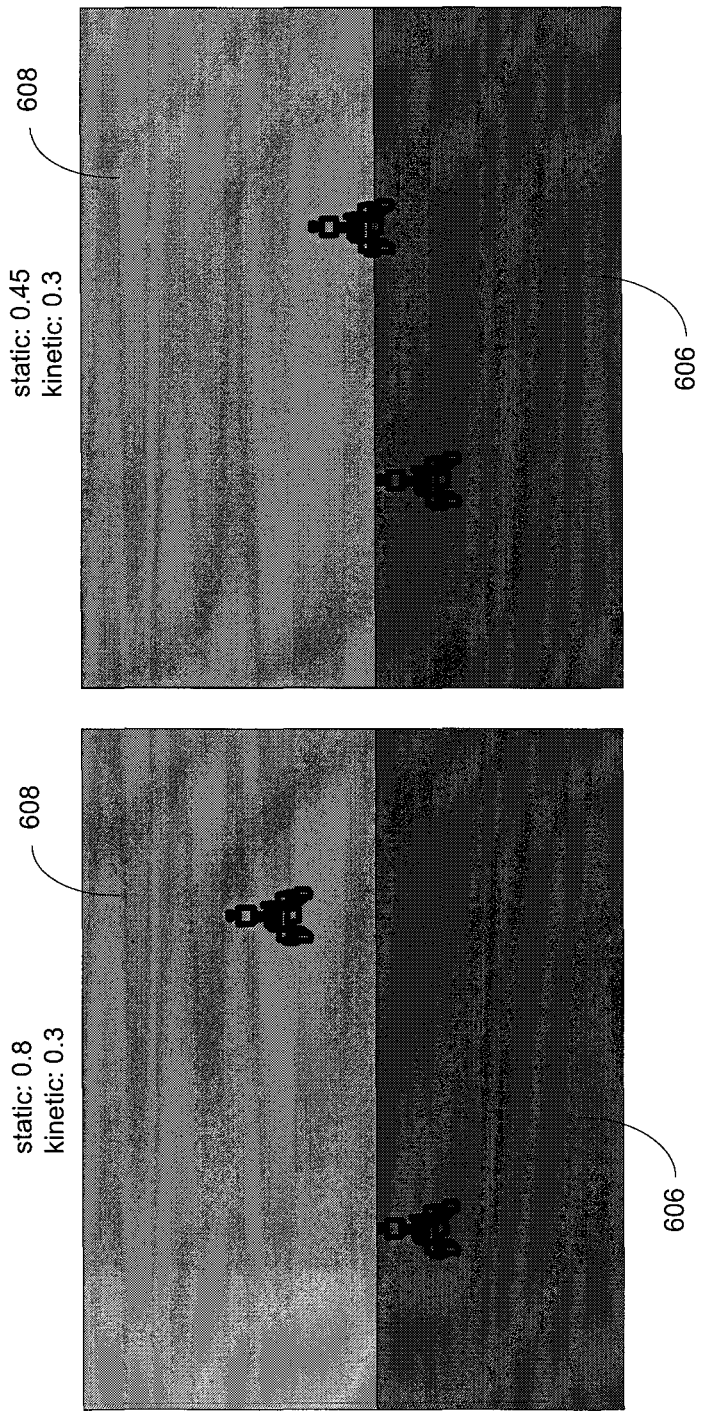
FIG. 35 depicts a diagram consistent with the processes of the present disclosure.

An illustration of using this software may be given in FIG. 35, which depicts the use of the terrain-change plugin. For example, there may be two trains with different slopes (e.g., terrains 606 and 608). A robotic hardware (e.g. NASA K10 robot), may be moving from terrain 606 to terrain 608, where the slope of terrain 608 is larger than the slope of terrain 606. With a static friction coefficient of 0.8, the K10 may stop on the slope. When the static friction is reduced to 0.45, the K10 rolls back down the slope. It is understood that the above is only an example and other friction coefficients may be used.

In some embodiment, multi-vehicle simulation may be achieved. For example DPS process 10, may be capable of simulating a larger number of simultaneous robots using different terrain properties in the same simulation. For example, and referring to FIG. 36, where five robotic hardware (e.g., K10 robots) lined up on terrain composed of regions with two different sets of terrain properties. In FIG. 36, five K10s simulation on terrain with two distinct sets of surface properties, where first terrain (e.g. terrain 706), property may have kinetic and static friction coefficient of 0.3 and 0.8, respectively, while the second terrain (e.g. terrain 708), may have kinetic and static friction coefficient of values of 0.1 and 0.25, respectively.

In one embodiment, and Referring to FIG. 37, each of the five robots shown in FIG. 36 may be tossed with an initial velocity of, from left to right, 11, 10, 9, 8, and 7 m/s in the forward direction. Referring to FIG. 38, there is shown the results of tossing the five robots with the above velocities. Those on the high-friction first terrain (e.g., terrain 706) stop, while those on the low-friction second terrain (e.g., terrain 708) roll back down. In other words, on the first terrain (e.g., terrain 706) with the higher coefficients of friction, the robots travel up the slope in proportion to their initial velocities. On the second terrain with lower coefficients of friction, the robots roll back down the slope.

Figure 39:
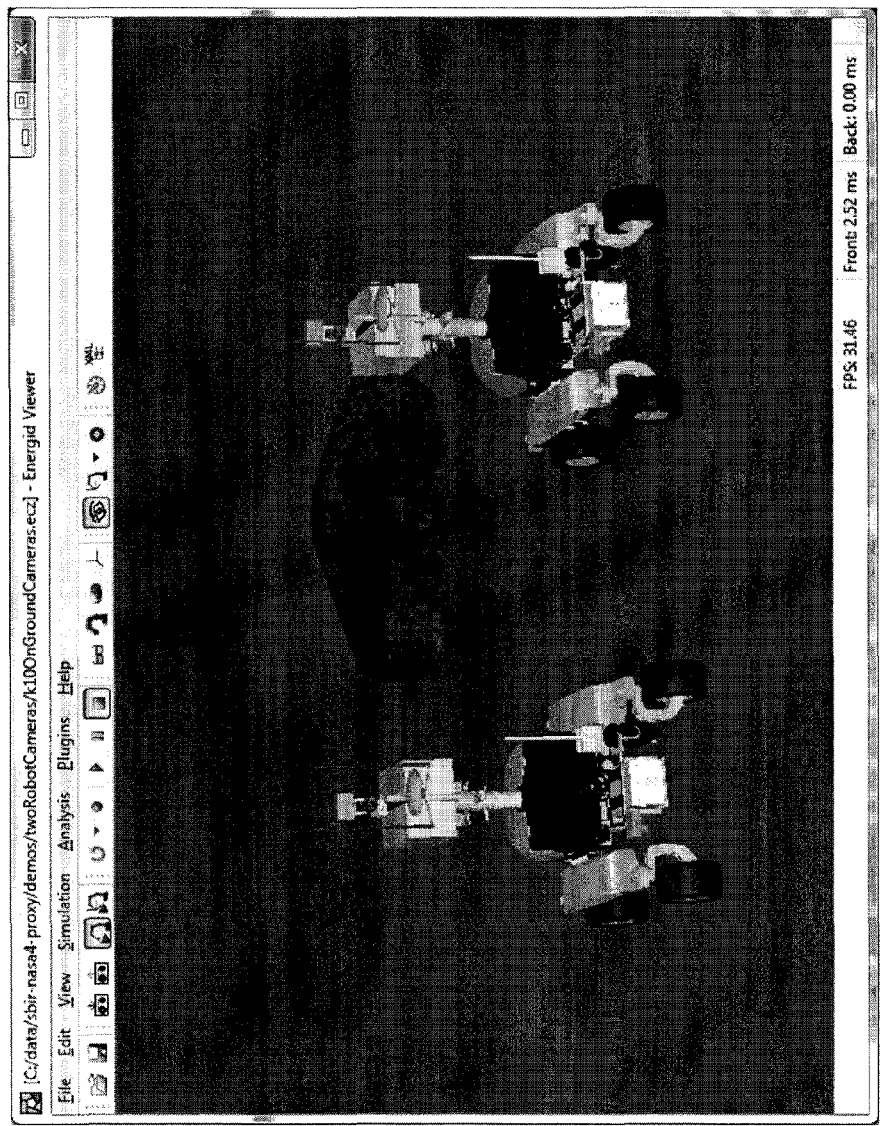
FIG. 39 depicts a diagram consistent with the processes of the present disclosure.
Figure 40:
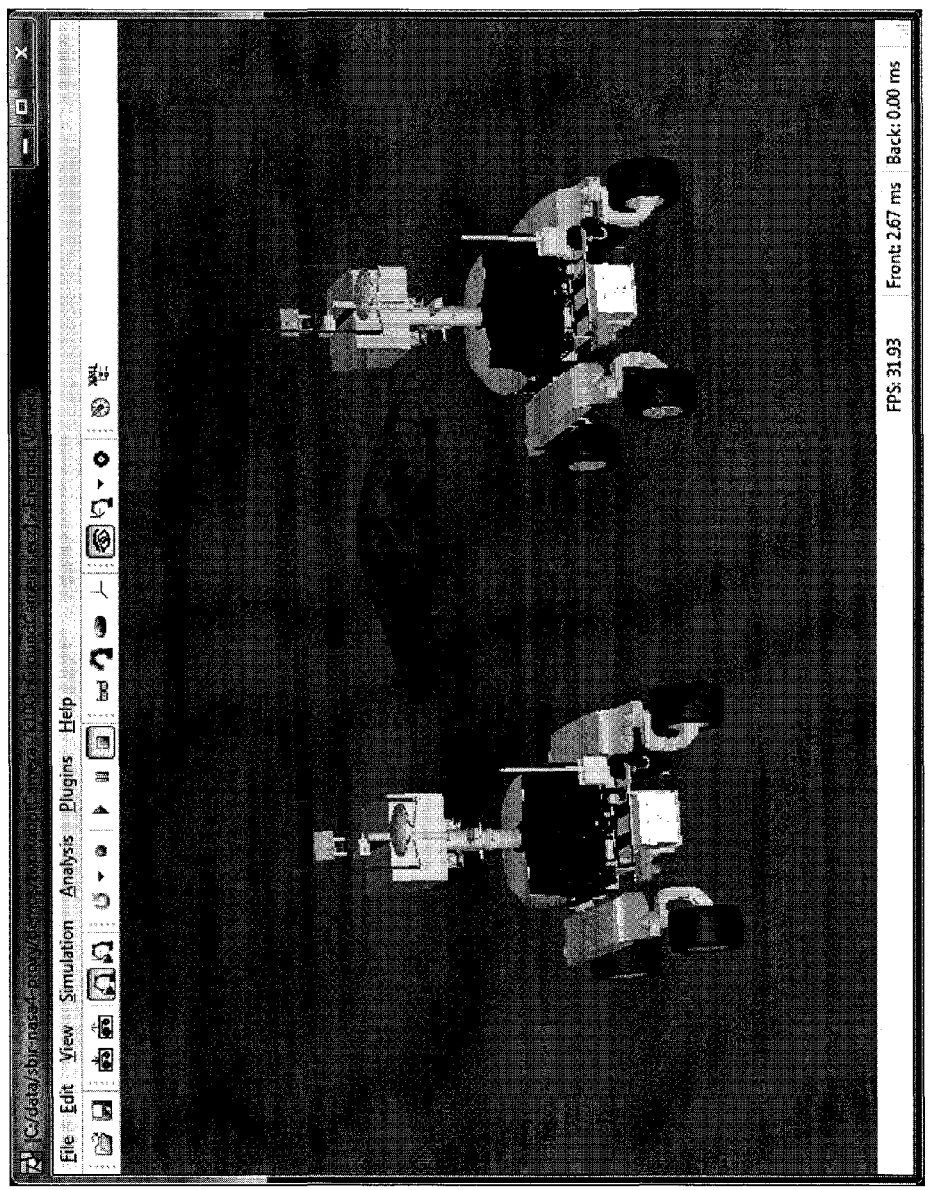
FIG. 40 depicts a diagram consistent with the processes of the present disclosure.

In another embodiment, DPS process 10, may allow for the ability to insert obstacles in the scene. For example, a rock may be added to terrain used in the previous examples, as seen in FIG. 39. Additionally/alternatively, DPS process 10, may allow through the use of a dialog box to reposition the an object (e.g., a rock or any object in the scene), such as, move, raise or lower a rock in the terrain. For example, and referring to FIG. 40, showing a scenario with the rock lowered 0.3 m into the terrain. However the rock is moved, it is treated as stationary and interacts with the robots like the terrain.

In one embodiment, Axis Aligned Bounding Box (AABB) may be applied to each link in the rover to enable faster performance for collision detection and dynamics. If the AABBs of two links cross, and they are not in an exclusion map, then the collision algorithms may be applied to those two links. Effort was put into expanding the AABB algorithms to new shapes and into making the AABB code faster. As a link may be moving and reorienting, the AABBs may need to be recalculated which may be potentially expensive. Also, some AABB calculations may be more expensive than others. For example, the capsule AABB calculation may be much faster than the ellipsoid AABB calculation.

In one embodiment, for basic distance calculations, the syntax for the distance calculations may be:
  distance=terrain.distanceTo(xform*shape);
  where "shape" may be Box, Capsule, CircularLozenge, Cone, Cylinder, Ellipsoid, HalfSpace, Lozenge, Sphere, Terrain, Tetrahedron, TriangularLozenge, PolyPhysicalExtent, TriPhysicalExtent, and ShapeUnion. "xform" may transform the shape into the frame of the terrain.

Figure 41:
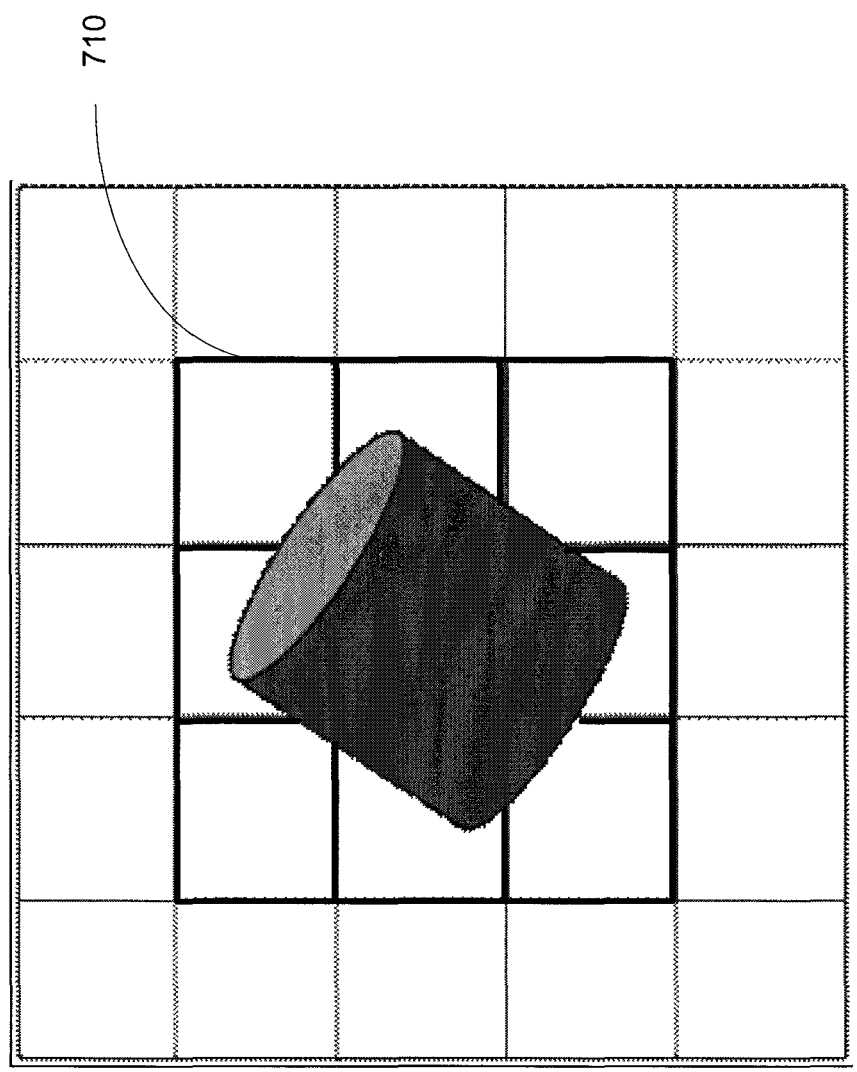
FIG. 41 depicts a diagram consistent with the processes of the present disclosure.

Previously, the following syntax may be used with the sphere shape as an example.

distance=terrain.distanceTo(xform*
    sphere.center( )-sphere.radius( );

In one embodiment, an approach may be used to provide more information to the terrain distance algorithm which may enable a subgrid to be created for reducing the number of terrain cells needed for the calculation. Previously, every cell in the terrain was tested for distance which may be expensive. FIG. 41 illustrates the subgrid for a cylinder and box. The subgrid (e.g., subgrid 710), shows the cells used in the calculation.

For penetration depth calculations, a similar syntax may be used as follows:

```
distance=terrain.distanceTo(xform*shape,support-
    Point1,supportPoint2);
```

Where the support points may be the closest points on the two objects. Subgrids may also be created during the penetration depth calculations.

Figure 42:
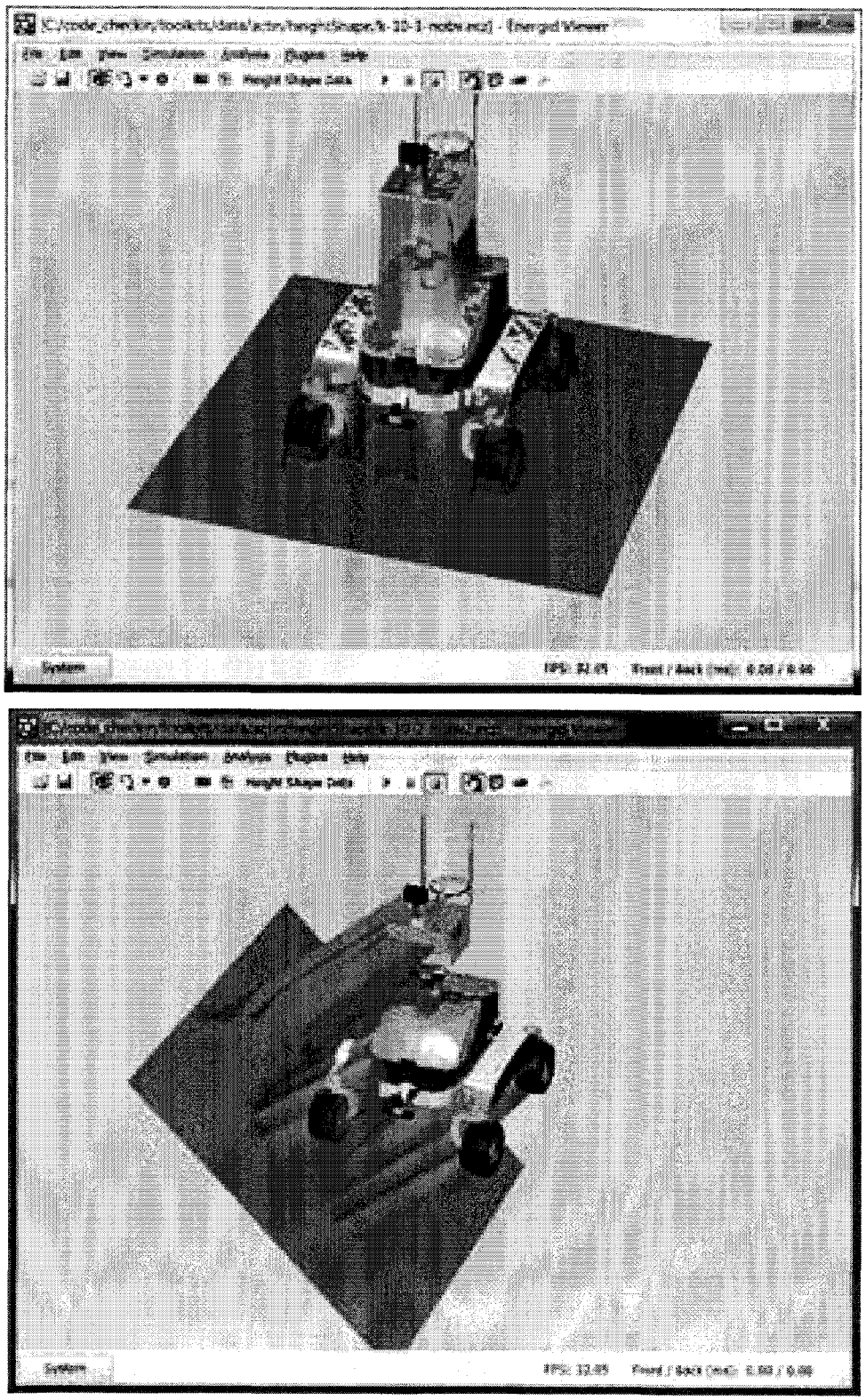
FIG. 42 depicts a diagram consistent with the processes of the present disclosure.

In one embodiment, a terrain shape may be created to be fast and flexible. The height field of the shape may be extended to be used as a general bounding volume. FIG. 42 shows height field bounding volume generation for two perspectives of the robotic hardware (e.g., NASA K10 robot).

Stereo Camera Simulation

In one embodiment, the general approach taken to simulate stereo cameras may be to render images with two virtual cameras placed in the simulation scene and feed those synthetic images into a stereo correspondence and 3D reprojection algorithm to calculate a depth map. The stereo correspondence algorithm implemented may be based on the Global Block Matching and Semi Global Block Matching algorithms described in the publication by Hirschmuller, H. (2008), Stereo Processing by Semiglobal Matching and Mutual Information, PAMI(30), No. 2, pp. 328-341. This algorithm may find correspondences between blocks of pixels in the stereo image pair, may calculate the disparity (or distance) between the corresponding blocks and may reconstruct the depth value based on the intrinsic and extrinsic parameters of the stereo camera rig.

The relationship between disparity of corresponding pixels and depth into the scene may be given by the following expression.

$$Z = f \frac{T}{d} \qquad (32)$$

Where f is the focal length of the imagers, T is distance between camera centers, d is the disparity between matching pixels and Z is the depth.

The stereo camera simulation process may be conducted as follows:

Stereo rectification: Prior to the start of the simulation the stereo camera geometry may be selected (spacing and angle between right and left cameras). Then the orientations of the two image planes may be corrected to satisfy a coplanar condition and a lookup table to apply the correction may be created for each camera. In this process, the mapping between depth in the scene and image disparity may be determined.

Image remapping: At each time step of the simulation, right and left images are rendered and these raw images may be rectified through the rectification lookup tables.

Image filtering: A user customized chain of image filters may be then applied to the remapped images. This may allow the user to tailor the stereo camera simulation to better match real conditions and real cameras.

Stereo correspondence: The stereo semi-global block matching algorithm may be then applied to determine the pixel correspondence between imagers and the resulting pixel disparity map.

Point cloud reconstruction: The disparity map may be then used to reconstruct the 3D positions of points mapped to the corresponding image pixels. This point cloud may consist of an array of 3D coordinates equal in size to the total number of pixels in the disparity map. The reconstruction process may be based on the transformation from disparity to 3D location that was established during the stereo rectification stage.

In one embodiment, The stereo camera simulation functionality may be utilized to create a plugin for the Viewer. When loaded into the Viewer and activated, the plugin may bring up the stereo camera management dialog. From this dialog the user may turn the stereo camera simulator on and off, may adjust the stereo correspondence parameters, may control what is being displayed by the plugin, and may change the position and orientation of the stereo camera.

The stereo correspondence parameters that may be tuned through the user interface include: Algorithm Preset, SAD Window size, Number of Disparities, and Minimum Disparity. The algorithm preset may be set to Basic, Narrow, and Wide angle depending on the type of lens specified for the cameras. The Sum of Absolute Differences (SAD) window size determines the size of the sliding window used to establish stereo correspondence between the images. The larger the SAD window size is the smoother and less accurate the disparity map. The maximum number of disparities defines the maximum distance in pixels between corresponding blocks of the image. The typical number of disparities for 320 by 240 pixel images used is 32. The Plugin may be used as follows:

When loaded the Stereo Camera plugin can be controlled by clicking on a dedicated icon in the tool bar.

This brings up the Stereo Camera simulation management dialog. Licking on a button for anything the Stereo Camera may define the key parameters of the stereo camera rig.

A stereo camera modification dialog may appear. From this dialog the user may define the spacing between cameras, field of view, number of channels in the images, manipulator and link to which the stereo camera should be attached. The offset translation and orientation values may the stereo camera rig's position relative to the selected link's reference frame.

Checking a checkbox for running the simulation may begin streaming images from the virtual cameras and processing through the stereo block matching algorithm. The SAD Window size, Number of disparities, and Minimum disparity value may be adjusted while the simulation is running to tune the output. The view frustums of the virtual cameras may be displayed by checking the Show Frustums checkbox. (Note: that the frustums may be visible to the virtual cameras and may interfere with the stereo matching algorithm. The frustums should be turned on only to verify the placement of the stereo rig.)

For example, the stereo camera simulation plugin may be tested with DPS process 10 to simulate two rovers exploring the lunar surface. In this model, the two rovers may be traversing the surface with one following the other. The stereo camera of the K10 rover may be simulated in real-time and the resulting disparity map may be displayed on the screen. For example, a rendered scene of the two rovers traversing the surface, where the spacing between the two imagers may be 15 cm and the resulting fields of view may be shown with frustums attached to the K10. There may be two raw images, one on the left and one on the right. The left and right raw images obtained at a single time step may be processed in the stereo camera correspondence algorithm to produce a disparity map.

Figure 43:
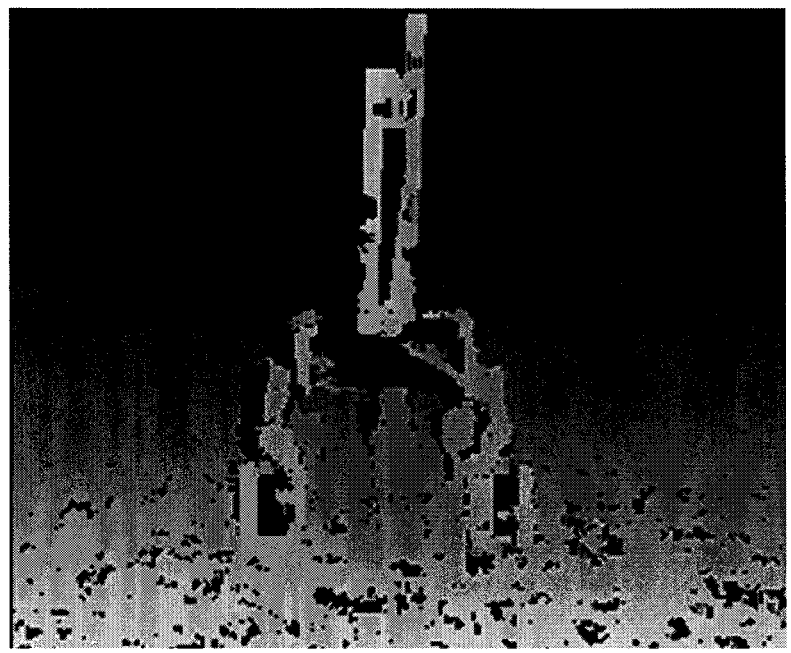
FIG. 43(a) depicts a diagram consistent with the processes of the present disclosure.
FIG. 43(b) depicts a diagram consistent with the processes of the present disclosure.
Figure 43:
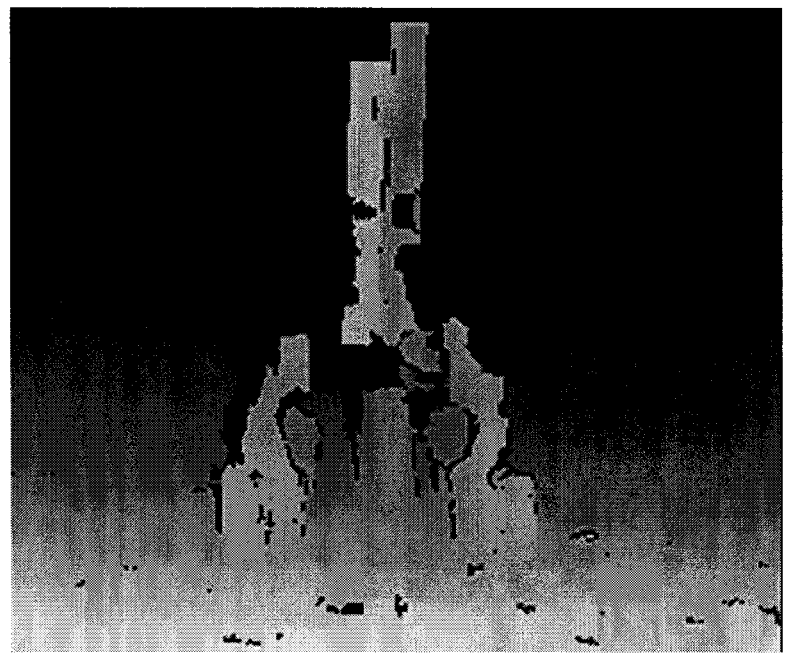
Figure 47:
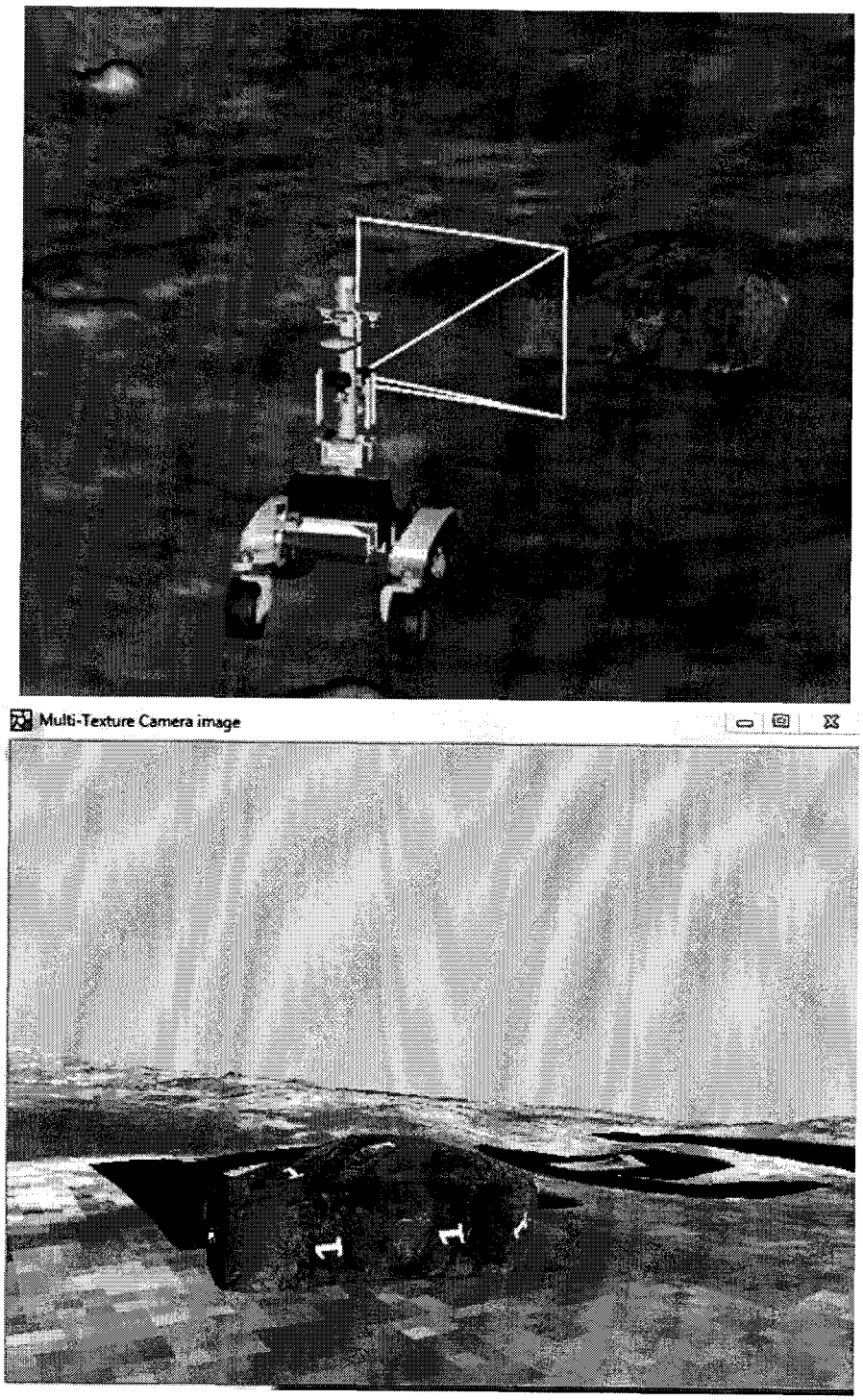
FIG. 47 depicts a diagram consistent with the processes of the present disclosure.

The disparity map and corresponding point cloud may be qualitatively well representative of real output from a stereo camera rig. The impact of selecting the averaging window size in the block matching algorithm (SAD window size) is shown in FIGS. 47(*a*) and 47(*b*). The window size of 5 pixels (FIG. 43 (a)) may give higher resolution but also has more areas where correspondence may be lost and therefore no depth information could be established. The window size of 11 pixels (FIG. 43 (b)) may provide a more smooth disparity map with fewer areas of zero correspondence, but may suffer a loss in resolution.

Laser Scanner Simulation

In one embodiment, a new laser scanner plugin may simulate the data returns from a lidar (e.g., Velodyne HDL-32E LIDAR) used on the robotic hardware (e.g., NASA K10 robot/rover). For example, Velodyne HDL-32E LIDAR unit may have 32 lasers mounted vertically on a rotating head. The LIDAR head may rotate at 600 rpm providing angular resolution of 0.16 degree in the horizontal and 1.33 degrees in the vertical. The unit may return 700,000 points per second in the range of 1 to 70 meters from the head with 360 degree horizontal by 40 degree vertical field of view. The detailed performance specifications are summarized in Table.

TABLE 16

Performance specification for the Velodyne HDL-32E LIDAR

| Parameter | Specification |
| --- | --- |
| Measurement range | 1-70 m |
| Number of laser/detector pairs | 32 |
| Angular velocity | 600 rpm |
| Accuracy | <2 cm (one sigma at 25 m) |
| Angular resolution | 1.33° (vertical), 0.16° at 600 rpm (horizontal) |
| Field of View | 41.3° (vertical), 360° (horizontal) |

The approach taken to simulate the Velodyne HDL-32E may be to use the OpenGL Z-buffer generated by the graphics card to obtain a representative sample of 3D points in a 360 degree view around the LIDAR unit. The depth buffer (also known as z-buffer) may be used in OpenGL to resolve the distance between two nearby objects to determine which objects should be hidden behind which others. For example, to simulate the Velodyne HDL-32E efficiently, the 360 degree scene around the unit may be rendered by a virtual camera rotated by a set angle at each simulation time step. Further, the Z-buffer of each rendered frame may be sampled to obtain the proper number of 3D scan points and may be plotted in the scene as a 3D point cloud. The simulation frame rate may be the main constraint for accurate capture of motion effects. The relationship between the scan rate ($\alpha_{scan}$) of the virtual camera with respect to the simulation frame rate ($r_{sim}$) and actual LIDAR angular velocity ($\omega_{lidar}$) is as follows.

$$\alpha_{scan}(\text{rad/frame}) = \frac{\omega_{lidar}(\text{rad/s})}{r_{sim}(\text{frames/s})} \quad (33)$$

Figure 44:
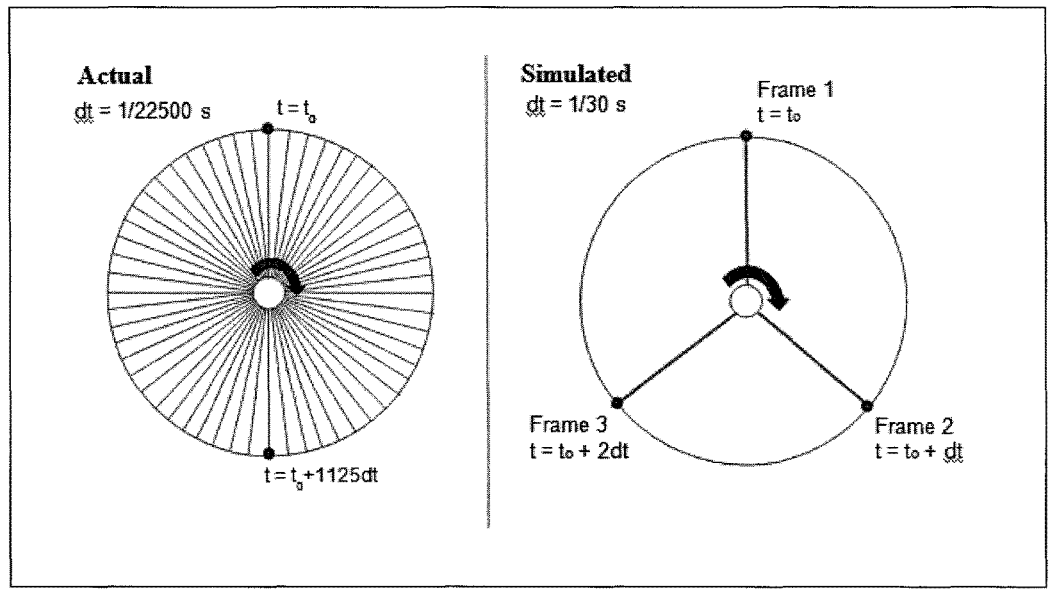
FIG. 44 depicts a diagram consistent with the processes of the present disclosure.

Therefore to achieve the desired scan rate of 10 revolutions per second at a simulation frame rate of 30 Hz, the virtual camera should scan 120 degrees at each time step. This may pose a concern for accurate treatment of motion in the scene since a large portion of the view must be observed at a single instant in time, whereas the HDL-32E may scan this zone over a period of 0.03 s with an angular resolution of 0.16 degrees (750 time steps of 40 micro seconds each). The difference between the actual and simulated lidar scans are shown in FIG. 44, which shows the actual and simulated 360 degree LIDAR scan with respect to time.

The motion effects on LIDAR may blur the retrieved point cloud if the relative motion between scanner and scanned object is high. The result may be that the point cloud representing an object can appear elongated or shrunk depending on its motion relative to the direction of the LIDAR's rotation. For simulation, the correct account of motion effects may depend in large part on the simulation frame rate and specified angular velocity of the LIDAR system as given in Equation 2. To ensure accurate simulation of motion effects, the displacement of an object within each simulation frame should be less than the standard uncertainty for each of the scanned 3D points by the real system. The displacement of an object with relative velocity with respect to the scanner is given in equation 3.

$$\Delta d = U_r \frac{\alpha_{scan}}{\omega_{lidar}} \quad (34)$$

Where $\Delta d$ is the displacement of an object with a relative velocity of $U_r$ with respect to the scanner after one simulation time step (the scan rate in rad/frame, $\alpha_{scan}$, divided by the LIDAR angular velocity, $\omega_{lidar}$). For K10 rovers on the lunar surface, any relative motion between scanner and objects may be almost entirely due to the ground speed of the rover itself, which is approximately 0.3 m/s at top speed. For example, for a single K10 the maximum displacement of a scanned object can be up to 9 mm within the simulation time step of 0.03 seconds. For example, for two K10s the maximum combined speed and corresponding displacement may be roughly double this. For example, this estimate of maximum object displacement may be within the specified position uncertainty of 2 cm for the Velodyne HDL-32E at 25 m. Therefore, using the OpenGL approach to render the depth field using a rotating virtual camera may be well suited to capture the motion effects expected by a typical lunar rover.

Figure 45:
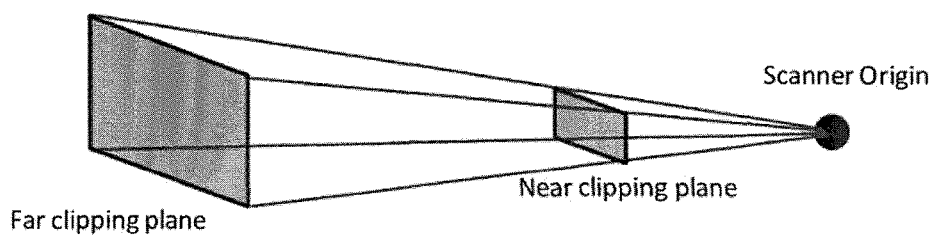
FIG. 45 depicts a diagram consistent with the processes of the present disclosure.

A concern may be that the OpenGL would be challenged in modeling accurate distances over large ranges. However, most modern (low- and mid-end) GPUs may support 24-bit depth buffer. The analysis given below may show that OpenGL with 24-bit depth buffer may be adequate to model K10 LIDAR data. The near and far clipping planes, as shown in FIG. 45, may define what objects will be rendered in the scene, with only the objects located between the two planes being rendered. zNear and zFar are the distances from the scanner origin to the near and far clipping planes, respectively. For simulated LIDAR scanners, zNear and zFar may be analogous to the minimum and maximum range values of the scanners.

The z-buffer may be nonlinear and the actual number stored in the z-buffer memory may be expressed in terms of the distance to the object as $$z = (2^N - 1)\left(a + \frac{b}{d}\right) \quad (35)$$

Where N is the number of bits used to store each depth value z, d is the distance from the scanner origin to the object, and a and b are constants for each scanner given in the equation below.

$$a = \frac{zFar}{(zFar - zNear)} \quad (36)$$

$$b = \frac{zFar \cdot zNear}{(zNear - zFar)}$$

From equation (35) it may be observed that z is inversely proportional to d, and hence the precision may be better for objects closer to the scanner origin than those farther away.

To determine the resolution, two successive z values are denoted $z_1$ and $z_2$ and the distances at those z values as $d_1$ and $d_2$. It follows from equation (35) that the smallest discernible distance B is given by $$\delta = \frac{d_1 d_2}{b(2^N - 1)} \approx \frac{d^2}{b(2^N - 1)} \tag{37}$$

At d=70 m, zNear=1 m, and zFar=70 m, using the above equation, the resolution for 24-bit z-buffer is 0.000288 m (or 0.288 mm). This compares favorably with the raw range accuracy off 2 cm at 25 m for the Velodyne HDL-32E. Based on this analysis, the OpenGL depth buffer approach may be adequate for most anticipated purposes even when using only 24 bits.

Hemispherical distortion may be an additional consideration for OpenGL-based LIDAR modeling. A 3D perspective view of a scene may be created through a view frustum. Anything inside the frustum may be rendered and a distance value may be calculated as $$d = \frac{b(2^N - 1)}{z - a(2^N - 1)} \tag{38}$$

The distance obtained from OpenGL may not directly be used as the scanner distance, as it may cause hemispherical distortion. Instead the ratio between the distance at each scan point on the near clipping plane and the normal distance may be computed. This ratio is called the stretch factor ($s_i$) and is given by $$s_i = \frac{dNear_i}{zNear} = \sqrt{\tan^2(\theta_i) + \tan^2(\phi_i) + 1} \tag{39}$$

where $\theta_i$ and $\phi_i$ are the horizontal and vertical angles of ray i, respectively. The stretch factor is multiplied with the initial distance to yield the distortion-corrected distance in the Phase II code.

In one embodiment, the ability to render 3D point clouds in the simulation scene directly in Actin Viewer using Open Scene Graph (OSG) may be added. The class Ec::PointCloudOSG may maintain the container structures and processing methods to generate an osg::Geode object which may be added as a child to the main OSG scene node. In practice this class may be first initialized with the maximum size of the point cloud using Ec::PointCloudOSG::init, then the Ec::PointCloudOSG::setPointCloud method may be called to add the scanned points, and finally Ec::PointCloudOSG::geode method may be called to return a reference pointer to the generated OSG Geode object. Internally the class may have two containers; a vector of 3D point locations and a vector of RGB values for the color of each point. Initially, all of the colors may have been set to red, but the class does provide support for changing the color of each point based on a predefined color map.

In one embodiment, a LIDAR simulation plugin may be created for Energid's Actin toolkit. This section will provide instructions for using the LIDAR simulation plugin.

When loaded the LIDAR plugin may be controlled by clicking on specific icon in the tool bar.

The LIDAR simulation manager widget may appear on the left side of the viewer followed by the LIDAR modification dialog for initialization of the LIDAR parameters.

The LIDAR modification dialog may be used to change the key parameters of the scanner including: field of view, number of scan points, range and manipulator link and offset.

To run the LIDAR simulation, Run Lidar simulation checkbox in the Manage Lidar Simulation dialog may be clicked. At this point the LIDAR simulation may begin scanning. With the simulation running, the scan points may be displayed or hidden by clicking the Show scan points checkbox. The rotation of the scanner may also be turned on and off with the Scan 360 degrees checkbox.

To edit the LIDAR parameters, the simulation may be stopped by unchecking the Run Lidar simulation checkbox and then clicking Edit LIDAR. This may bring back the LIDAR modification dialog. Results In one embodiment, a simulation of two K10 rovers on rough terrain may be used to test the LIDAR simulation plugin resulting in a single view scan with a horizontal and vertical field of view set at 20 degrees. In this mode, the LIDAR was attached to the base of the first rover with an offset of [0.1, 0.0, −0.5] m and orientation of [−1.57, 0, 0] (roll, pitch, yaw). This may result in 3D point cloud of scanned points, matching the contours of the terrain and other rover.

Figure 46:
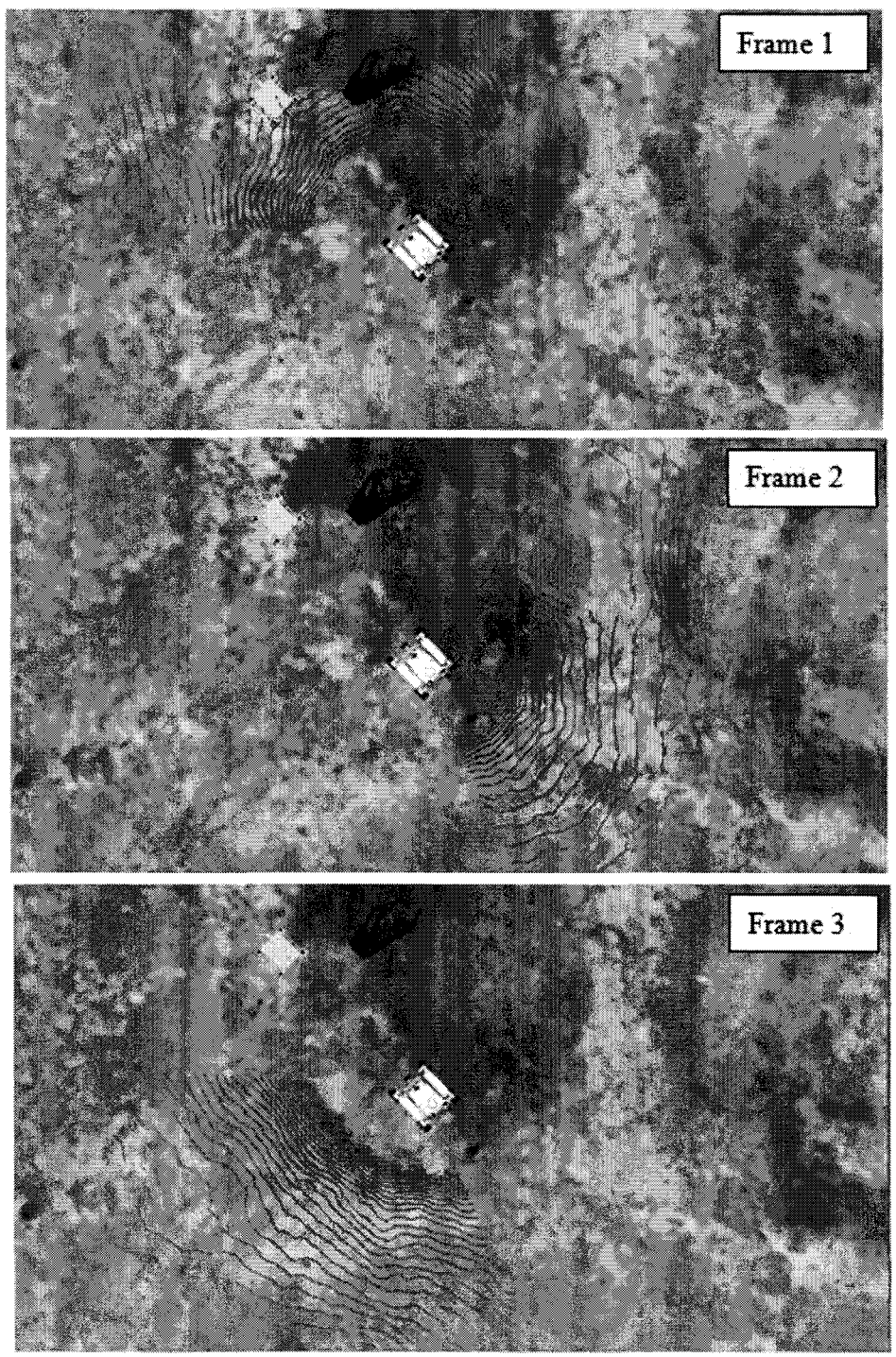
FIG. 46 depicts a diagram consistent with the processes of the present disclosure.

The results for a 360 degree scan are shown in FIG. 46. To match the Velodyne HDL-32E's angular scan rate of 600 rpm, the 360 degree view had be imaged at a rate $\alpha_{scan}$ equal to 2.09 radians per frame (120 degrees per frame). FIG. 46 shows three consecutive frames used to scan the full scene around the rover. The simulation frame rate achieved was ~20 to 25 frames per second on an Intel Core 17 2.3 GHz processor.

Simulate Differential

In one embodiment, a method for simulating a rocker suspension using constraint of the dynamic equations of motion may be presented. For example, the approach may be formulated in such a way that it could be used to also simulate other closed-chain mechanisms that might be of interest to third-party developers (e.g., NASA). In another embodiment, dynamic simulation may be extended and the feedforward controller may be expanded to include it.

The constraint dynamics calculations for simulation may be repeated here for use in the derivation of the feedforward controller. The composite rigid-body inertia algorithm equation of motion is the following:

$$\begin{bmatrix} I_b^C & D(q)^T \\ D(q) & M(q) \end{bmatrix} \begin{bmatrix} A_b \\ \ddot{q} \end{bmatrix} = \begin{bmatrix} F_e + F_{mc} + F_{mg} + F_{me} \\ \tau - C(q)\dot{q} - G(q) + B \end{bmatrix}, \tag{40}$$

where $I_b^C$ is the 6×6 composite rigid-body inertia of the entire robot; q is the N×1 joint values; D(q) is a special N×6 (N=10 in this case) dynamics matrix depending only on joint values (not their derivatives); M(q) is the N×N inertia matrix; $A_b$ is the 6×1 base acceleration; $\ddot{q}$ is the N×1 joint accelerations; Fe is the external force applied directly to the base; $F_{mc}$, $F_{mg}$, $F_{me}$ represent the forces due to Coriolis and centripetal terms, gravity, and external forces applied by the manipulator to the base, respectively; T is the column vector of joint torques; C(q) is the Coriolis forces; G(q) is the gravitation forces; and B is the external forces applied to the links.

A restriction on the system is written as follows:

$$f(q,T)=0 \quad (41)$$

Where T is the position and orientation of the base link. Taking the derivative of this equation gives $$K\dot{q}+K'V_b=0 \quad (42)$$

Where K is the Jacobian of f(q,T) with respect to the joint variables, and K' reflects the differential change in f(q) as a function of the linear and angular velocity of the base. That is, in (3), $$V_b = \begin{bmatrix} \vec{v}_b \\ \vec{\omega}_b \end{bmatrix} \quad (43)$$

where $\vec{v}_b$ and $\vec{\omega}_b$ are the linear and angular velocity of the base, respectively. Taking the derivative of (42) gives $$\dot{K}\dot{q}+K\ddot{q}+\dot{K}'V_b+K'A_b=0 \quad (44)$$

This motion equation is imposed through torques on the joints due to the constraints established through $$\tau = K^T\beta \quad (45)$$

And a force on the base due to the constraints established through $$F_e = [K']^T\beta \quad (46)$$

where β is an arbitrary vector of the same dimension as the dimension of the constraints. With these changes, equation (40) becomes $$\begin{bmatrix} I_b^C & D(q)^T & [K'(q)]^T \\ D(q) & M(q) & K(q)^T \\ K'(q) & K(q) & 0 \end{bmatrix} \begin{bmatrix} A_b \\ \ddot{q} \\ -\beta \end{bmatrix} = \begin{bmatrix} F_e + F_{mc} + F_{mg} + F_{me} \\ \tau - C(q)\dot{q} - G(q) + B \\ -\dot{K}(q)\dot{q} - \dot{K}'V_b \end{bmatrix} \quad (47)$$

This has a solution that does not require inverting the matrix on the left. Let $$\begin{bmatrix} \overline{M} & \overline{K}^T \\ \overline{K} & 0 \end{bmatrix} \begin{bmatrix} \overline{A} \\ \overline{B} \end{bmatrix} = \begin{bmatrix} \overline{X} \\ \overline{Y} \end{bmatrix} \quad (48)$$

Where $$\overline{M} = \begin{bmatrix} I_b^C & D(q)^T \\ D(q) & M(q) \end{bmatrix} \quad (49)$$

$$\overline{K} = [K'(q) \quad K(q)] \quad (50)$$

$$\overline{A} = \begin{bmatrix} A_b \\ \ddot{q} \end{bmatrix} \quad (51)$$

$$\overline{B} = -\beta \quad (52)$$

$$\overline{X} = \begin{bmatrix} F_e + F_{mc} + F_{mg} + F_{me} \\ \tau - C(q)\dot{q} - G(q) + B \end{bmatrix} \quad (53)$$

$$\overline{Y} = -\dot{K}(q)\dot{q} - \dot{K}'(q)V_b \quad (54)$$

And

With this, equation (48) can be solved for $\overline{A}$ and $\overline{B}$ by first solving for $\overline{A}$ in terms of $\overline{B}$ using the top portion of (48), then substituting this into the lower portion of (48) to solve for $\overline{B}$ as follows:

$$\overline{B} = [\overline{K}\overline{M}^{-1}\overline{K}^T]^{-1}(\overline{K}\overline{M}^{-1}\overline{X} - \overline{Y}) \quad (55)$$

Using $\beta = -\overline{B}$ this allows additive torques and base force/moments to be calculated from (45) and (46) that can then be used in the original formulation of (40).

Feedforward Controller in the Presence of Constraints

Feedforward control may involve using simulation algorithms to achieve exactly 1) desired joint accelerations where specified and 2) desired joint torques where specified. Since control on the robot may be implemented through torques, this may require calculating control torques that may give the desired accelerations. (The values for the torque-control joints may be simply those specified.)

In one embodiment, the torque vector may be divided into the specified (or known) values and unspecified (or unknown values). Similarly, the accelerations may be segregated in known and unknown values. For any joint, one of the torque and acceleration may be known and the other may be unknown. With this, we decompose (48) into the following:

$$\begin{bmatrix} \overline{M}_{11} & \overline{M}_{12} & \overline{K}_1^T \\ \overline{M}_{12}^T & \overline{M}_{22} & \overline{K}_2^T \\ \overline{K}_1 & \overline{K}_2 & 0 \end{bmatrix} \begin{bmatrix} \overline{A}_u \\ \overline{A}_k \\ \overline{B} \end{bmatrix} = \begin{bmatrix} \overline{X}_k \\ \overline{X}_u \\ \overline{Y} \end{bmatrix} \quad (56)$$

Note this in general may require rearrangement of the order of the joints so that the known and unknown accelerations and torques group in this way. The rearrangement, which does not fundamentally affect the formulas, may be left out of this derivation. In (56), $\overline{A}_u$, $\overline{X}_u$, and $\overline{B}$ may be unknown, while $\overline{A}_k$, $\overline{X}_k$, and $\overline{Y}$ may be known.

Rearranging the rows and columns to group them may give the following:

$$\begin{bmatrix} \overline{M}_{11} & \overline{K}_1^T & \overline{M}_{12} \\ \overline{K}_1 & 0 & \overline{K}_2 \\ \overline{M}_{12}^T & \overline{K}_2^T & \overline{M}_{22} \end{bmatrix} \begin{bmatrix} \overline{A}_u \\ \overline{B} \\ \overline{A}_k \end{bmatrix} = \begin{bmatrix} \overline{X}_k \\ \overline{Y} \\ \overline{X}_u \end{bmatrix} \quad (57)$$

Define the following quantities:

$$\tilde{M}_1 = \begin{bmatrix} \overline{M}_{11} & \overline{K}_1^T \\ \overline{K}_1 & 0 \end{bmatrix} \quad (58)$$

$$\tilde{M}_2 = \overline{M}_{22} \quad (59)$$

$$\tilde{K} = [\overline{M}_{12}^T \quad \overline{K}_2^T] \quad (60)$$

$$\tilde{A}_u = \begin{bmatrix} \overline{A}_u \\ \overline{B} \end{bmatrix} \quad (61)$$

$$\tilde{A}_k = \overline{A}_k \quad (62)$$

$$\tilde{X}_k = \begin{bmatrix} \overline{X}_k \\ \overline{Y} \end{bmatrix} \quad (63)$$

$$\tilde{X}_u = \overline{X}_u \quad (64)$$

With these definitions, (57) may become $$\begin{bmatrix} \tilde{M}_1 & \tilde{K}^T \\ \tilde{K} & \tilde{M}_2 \end{bmatrix} \begin{bmatrix} \tilde{A}_u \\ \tilde{A}_k \end{bmatrix} = \begin{bmatrix} \tilde{X}_k \\ \tilde{X}_u \end{bmatrix} \quad (65)$$

Where, now, only $\tilde{A}_u$ and $\tilde{X}_u$ may be not directly known. These may be solved as follows:

$$\tilde{A}_u = \tilde{M}_1^{-1}(\tilde{X}_k - \tilde{K}^T\tilde{A}_k) \quad (66)$$

$$\tilde{X}_u = \tilde{K}\tilde{A}_u + \tilde{M}_2\tilde{A}_k \quad (67)$$

With this all the needed values of the control torques may be calculated (through $\tilde{X}_u$).

Note that $\tilde{M}_1^{-1}$ should not be explicitly calculated for use in (66) because $\tilde{M}_1$ may have a block of zeros as shown in (58). Instead, (66) may be calculated using (58) and (61) as follows:

$$\tilde{A}_u = \begin{bmatrix} \overline{A}_u \\ \overline{B} \end{bmatrix} = \begin{bmatrix} \overline{M}_{11} & \overline{K}_1^T \\ \overline{K}_1 & 0 \end{bmatrix}^{-1} \begin{bmatrix} \overline{Z}_1 \\ \overline{Z}_2 \end{bmatrix} \quad (68)$$

Where $\overline{Z}_1 = \overline{A}_k - \overline{M}_{12}\overline{A}_k$ and $\overline{Z}_2 = \overline{Y} - \overline{K}_2\overline{A}_k$.
This gives $$\overline{B} = (\overline{K}_1\overline{M}_{11}^{-1}\overline{K}_1^T)^{-1}(\overline{K}_1\overline{M}_{11}^{-1}\overline{Z}_1 - \overline{Z}_2) \quad (69)$$

And $$\overline{A}_u = \overline{M}_{11}^{-1}(\overline{Z}_1 - \overline{K}_1^T\overline{B}) \quad (70)$$

Explicit use of (69) and (70) may require only inversion of symmetric positive definite matrices in the typical case.

In one embodiment, a new plugin may be created to provide a user interface to edit, view, and manage surface properties, including material type and friction properties of shapes in the simulation. Once the surfacePropertiesPlugin is loaded an icon may appear on the toolbar of Actin Viewer. Clicking on this icon may bring up the Surface Property Editor. The Surface Property Editor may contain a tree of shapes in the scene grouped by manipulator and link. For each shape, the index, shape type, surface property (material type) and number of surfaces may be displayed. The shape identifier (unique name) and material type may be changed by selecting the shape (or shapes to change many at a time) then selecting the values to be applied.

The friction forces between two contacting surfaces may be calculated based on the combined static and kinetic friction coefficients given in a lookup table. The friction lookup table may be edited by clicking the a button (e.g., in Edit Friction Properties button) on the Surface Property Editor. This may bring up the Friction Properties Editor, which may display the available materials and the set of friction properties for each unique pair. Each value may be edited by clicking on the table and typing in a new value. New materials may be added by clicking the plus button and materials may be deleted from the table by clicking the minus button. The friction properties that need to be defined for each material pair and their default values are given in the table below. It is understood that the values given in the table below are only examples and other values may be used depending on the application.

TABLE 4

Friction properties required for each material pair.

| Friction Model Property | Default Value |
| --- | --- |
| Normal Static Friction Coefficient | 0.35 |
| Tangential Static Friction Coefficient | 0.90 |
| Kinetic Friction Coefficient | 0.80 |
| Viscous Friction Coefficient | 0.50 |
| Rotational Friction Scale Factor | 1.00 |
| Assumed Mass | 40.0 kg |

DDS Abstraction Library

Data-Distribution Service (DDS) is a specification for publish-subscribe data-distribution systems. The DDS specification may provide a common application-level interface that may defined the data-distribution service. DDS may be used in many types of applications, such as, military command systems, financial trading platforms, unmanned vehicles, and medical devices.

Several different DDS implementations may be investigated, including OpenDDS, OpenSplice, and RTI NDDS. In one embodiment, a DDS abstraction library, or DDSAL, may be developed to abstract away as many key differences as possible to provide a consistent interface independent of the chosen DDS implementation.

Each DDS implementation may have its own IDL code generator. Unfortunately, the generated type support type names may not be standard. As an example, OpenDDS may generate "rapid::JointSampleTypeSupportImpl" as the type support for "rapid::JointSample", while NDDS may generate "rapid::JointSampleTypeSupport". In one embodiment, and to provide a consistent type support type, a typedef may be provided for each DDS implementation. In the example, both "rapid::JointSampleTypeSupportImpl" and "rapid::JointSampleTypeSupport" may be type defined to "EcRapidJointSampleTypeSupport". This is shown in Listing 2 below, which is an example of software code that may be used to implement an embodiment of the disclosure.

LISTING 2

Example type support abstraction for "rapid::JointSample".

```
#if defined(ECDDSAL_OPENDDS)
#include."JointSampleTypeSupportImpl.h"
typedef.rapid::JointSampleTypeSupportImpl.
EcRapidJointSampleTypeSupport;
#elif defined(ECDDSAL_OPENSPLICE)
#include."JointSampleDcps_impl.h"
typedef.rapid::JointSampleTypeSupport.
EcRapidJointSampleTypeSupport;
#elif defined(ECDDSAL_NDDS)
#include."JointSampleSupport.h"
typedef.rapid::JointSampleTypeSupport.
EcRapidJointSampleTypeSupport;
#else
#error."A.valid.DDS.implementation.must.be.defined"
#endif
```

Domain Participant Factory

Listing 3, which is an example of software code that may be used to implement an embodiment of the disclosure, shows the interface for getting the domain participant factory, and it may be located in "ddsal/impl/ecDdsalParticipantFactory.h". The function may be contained in the "EcDdsal::impl" namespace, and it may return a shared pointer to "DDS::DomainParticipantFactory".

LISTING 3

DDSAL interface for accessing the domain participant factory.

```
typedef.boost::shared_ptr<DDS::DomainParticipantFactory>.DomainParticipantFactoryPtr;
EC_FOUNDATION_DDSAL_DECL.DomainPartiticantFactoryPtr.participationFactory
    ...(
    ...);
```

In an embodiment, the shared pointer may ensure that appropriate implementation-dependent cleanup may be done when the domain participant factory goes out of scope.

Domain Participant

Listing 4, which is an example of software code that may be used to implement an embodiment of the disclosure, shows the interface for creating domain participants, and it may be located in "ddsal/ecDdsalParticipant.h". The functions may be all contained in the "EcDdsal" namespace and may return a shared pointer to "DDS::DomainParticipant".

LISTING 4

DDSAL interface for creating domain participant DDS entities.

```
typedef boost::shared_ptr
<DDS::DomainParticipant>.DomainParticipatPtr;
EC_FOUNDATION_DDSAL_DECL.
DomainParticipantPtr.createParticipant
(
    .DDS::DomainParticipantFactory*       pFactory,
    .DDS::DomainId_t . . . . . . . . .    domainId
.);
EC_FOUNDATION_DDSAL_DECL.
DomainParticipantPtr.createParticipant
(
    .DDS::DomainParticipantFactory*.      pFactory,
    DDS::DomainID_t . . . . . . .         domainId
    const DDS::DomainParticipantQos&      qos
);
EC_FOUNDATION_DDSAL_DECL.
DomainParticipantPtr.createParticipant
.(
    .DDS::DomainParticipantFactory*.      pFactory,
    .DDS::DomainId_t . . . . . . . . . .  domainId
    .const DDS::DomainParticipantQos&     qos
    .DDS::Domain ParticipantListener*.    pListener,
    .DDS::StatusMask . . . . . . . . . .  mask
);
EC_FOUNDATION_DDSAL_DECL.
DomainParticipantPtr.createParticipant
(
    .impl::DomainParticipantFactoryPtr.   factoryPtr,
    .DDS::DomainId_t . . . . . . . . . . . . . . . . .  domainId
);
EC_FOUNDATION_DDSAL_DECL.
DomainParticipantPtr.createParticipant
.(
    .impl::DomainParticipantFactoryPtr    factoryPtr,
    ..DDS::DomainId_t . . . . . . . . . . . . . . . .   domainID,
    ...const DDS::DomainParticipantQos& . .            qos
.);
EC_FOUNDATION_DDSAL_DECL.
DomainParticipantPtr.createParticipant
(
    impl::DomainParticipantFactoryPtr     factoryPtr,
    DDS::DomainID_t . . . . .             domainId,
    const DDS::DomainParticipantQos&      qos,
    .DDS::Domain ParticipantListener*.    pListener,
    .DDS::StatusMask . . . . . . . .      mask
.);
```

In one embodiment, the shared pointer may ensure that appropriate implementation-dependent cleanup may be done when the domain participant goes out of scope. For example, there may be two sets of functions that may take a varying number of arguments. The first set may require a pointer to the domain participant factory, while the second set may require a shared pointer to the domain participant factory. The shared pointer variants may ensure that the domain participant factory may remain in scope until after the domain participant scope ends. If the quality-of-service value is not specified, then the default domain participant quality-of-service value from the domain participant factory may be used.

Type Registration

Listing 5, which is an example of software code that may be used to implement an embodiment of the disclosure, shows the interface for registering a type with a domain participant, and it may be located in "ddsal/ecDdsalParticipant.h". The functions may all be contained in the "EcDdsal" namespace.

LISTING 5

DDSAL interface for registering types with a domain participant.

```
EC_FOUNDATION_DDSAL_DECL bool participantAttachment
(
    ..DomainParticipantPtr. . .           participantPtr,
    ..const.boost::any& . . .             attachment
.);
// . . . . . . . . . . . . . . . . . . . . . . . . . . . . . . . . . . . . . . . .
template <typename.T>
const.char* getTypeName
    .(
    .){...}
// . . . . . . . . . . . . . . . . . . . . . . . . . . . . . . . . . . . . . . . .
template.<typename.T>
bool.registerType
    .(
    ..DomainParticipantPtr.               participantPtr,
    const.char*                           typeName
    ){...}
// . . . . . . . . . . . . . . . . . . . . . . . . . . . . . . . . . . . . . . . .
template.<typename.T>
bool.registerType
    .(
    DomainParticipanyPtr.participantPtr
    ){...}
```

In one embodiment, The "registerType" function templates may take the type support class as a template argument. Each DDS implementation in the abstraction library may have the corresponding functions shown in Listing 6, which is an example of software code that may be used to implement an embodiment of the disclosure. Some DDS implementations may have a scope requirement for the type being registered. For instance, OpenDDS may require that the type being registered may remain in scope until after the domain participant may be destroyed. In such a case, the specific implementation's "registerType" function can set a value for the "attachment" that may be guaranteed to remain in scope until the domain participant may be destroyed. The attachment may be added to the domain participant inside the "registerType" function using the "participantAttachment" function; however, "participantAttachment" may be exposed in the public interface to allow attaching any object that may need to remain in scope until after the domain participant may be destroyed.

LISTING 6

DDSAL implementation-specific interface for registering types with a domain participant.

```
//-----------------------------------------------------------------
template.<typename.T>
const.char*.getTypeName
. . . (
. . . ) {...}
//-----------------------------------------------------------------
template.<typename.T>
bool.registerType
. . . (
. . . DDS::DomainParticipant*.pParticipant,
. . . const.char* . . . . . . . . . . . .typeName,
. . . boost::any& . . . . . . . . . . . . attachment
```

LISTING 6-continued

DDSAL implementation-specific interface for registering types with a domain participant.

```
...) {...}
//-----------------------------------------------------------
template.<typename.T>
bool.registerType
...(
... DomainParticipantPtr.participantPtr,
... const.char* ........ .typeName,
... boost::any& ........ .attachment
...) {...}
```

Topic

Listing 7, which is an example of software code that may be used to implement an embodiment of the disclosure, shows the interface for creating topics, and it may be located in "ddsal/ecDdsalTopic.h". The functions may all be contained in the "EcDdsal" namespace and may return a shared pointer to "DDS::Topic".

LISTING 7

DDSAL interface for creating topic DDS entities.

```
typedef.boost::shared_ptr<DDS::Topic>.TopicPtr;
EC_FOUNDATION_DDSAL_DECL.TopicPtr.createTopic
    ..(
    ...DDS::DomainParticipant*.          pParticipant,
    ...const.char*.............          topicName,
    ...const.char*.............          typeName
    ...);
EC_FOUNDATION_DDSAL_DECL.TopicPtr.createTopic
    (
    .DDS::DomainParticipant*.            pParticipant,
    const char*...                       topicName,
    const.char*...                       typeName,
    . const DDS::TopicQos&                qos
    .);
EC_FOUNDATION_DDSAL_DECL.TopicPtr.createTopic
    (
    ..DDS::DomainParticipant*.           pParticipant,
    ...const char* ..........            topicName,
    .const.char* ...........             typeName,
    ..const DDS::TopicQos& ...           qos,
    DDS::TopicListener*                  pListener,
```

LISTING 7-continued

DDSAL interface for creating topic DDS entities.

```
    ..DDS::StatusMask .....              mask
    .);
EC_FOUNDATION_DDSAL_DECL.TopicPtr.createTopic
    (
    ..DomainParticipantPtr .             participantPtr,
    ..const char*.......                 topicName,
    .const.char*........                 typeName
    .);
EC_FOUNDATION_DDSAL_DECL.TopicPtr createTopic
    .(
    ..DomainParticipantPtr .             participantPtr,
    ..const char*......                  topicName,
    .const.char*........                 typeName,
    const DDS::TopicQos& .               qos
    );
EC_FOUNDATION_DDSAL_DECL.TopicPtr createTopic
    ..(
    DomainParticipantPtr .               participantPtr,
    .const char*........                 topicName,
    .const.char*........                 typeName,
    const DDS::TopicQos& .               qos,
    ..DDS::TopicListener* .              pListener,
    .DDS::StatusMask ...                 mask
    .);
```

In one embodiment, the shared pointer may ensure that appropriate implementation-dependent cleanup may be done when the topic goes out of scope. For example, there are two sets of functions that take a varying number of arguments. The first set may require a pointer to the domain participant, while the second set may require a shared pointer to the domain participant. The shared pointer variants may ensure that the domain participant may remain in scope until after the topic scope ends. If the quality-of-service value is not specified, then the default topic quality-of-service value from the domain participant may be used.

Content Filtered Topic

Listing 8, which is an example of software code that may be used to implement an embodiment of the disclosure, shows the interface for creating content filtered topics, and may be located in "ddsal/ecDdsalContentFilteredTopic.h". The functions may all be contained in the "EcDdsal" namespace and may return a shared pointer to "DDS::ContentFilteredTopic".

LISTING 8

DDSAL interface for creating content filtered topic DDS entities.

```
typedef.boost::shared_ptr<DDS::ContentFilteredTopic>.ContentFilteredTopicPtr;
EC_FOUNDATION_DDSAL_DECL.ContentFilteredTopicPtr.createContentFilteredTopic
    ...(
    ...DDS::DomainParticipant* .        pParticipant,
    .const char* ....                   topicName,
    ...TopicPtr ............            relatedTopic,
    ...const char* ..........           filterExpression
    ):
EC_FOUNDATION_DDSAL_DECL.ContentFilteredTopicPtr.createContentFilteredTopic
    ..(
    ..DDS::DomainParticipant* .         pParticipant,
    const char* .                       topicName,
    TopicPtr                            relatedTopic,
    .const char* .                      filterExpression,
    const DDS::StringSeq&               expressionParams
    ):
EC_FOUNDATION_DDSAL_DECL.ContentFilteredTopicPtr.createContentFilteredTopic
    .(
    ..DomainParticipantPtr              participantPtr,
    ...const.char* .........            topicName,
    ...TopicPtr ...........             relatedTopic,
    ...const char* ....                 filterExpression
    ...);
```

LISTING 8-continued

DDSAL interface for creating content filtered topic DDS entities.

```
EC_FOUNDATION_DDSAL_DECL.ContentFilteredTopicPtr.createContentFilteredTopic
  .(
  ...DomainParticipantPtr .           participantPtr,
  ...const char* . . . .              topicName,
  .TopicPtr . . .                     relatedTopic,
  .const char* .                      filterExpression,
  const.DDS::StringSeq&               expressionParams
  .):
```

In one embodiment, the shared pointer may ensure that appropriate implementation-dependent cleanup may be done when the content filtered topic goes out of scope. For example, there are two sets of functions that take a varying number of arguments. The first set may require a pointer to the domain participant, while the second set may require a shared pointer to the domain participant. The shared pointer variants may ensure that the domain participant remains in scope until after the content filter topic scope ends. Additionally, all variants may ensure that the related topic remains in scope until after the content filter topic scope ends.

Publisher

Listing 9, which is an example of software code that may be used to implement an embodiment of the disclosure, shows the interface for creating publishers, and it may be located in "ddsal/ecDdsalPublisher.h". The functions may all be contained in the "EcDdsal" namespace and may return a shared pointer to "DDS::Publisher".

LISTING 9

DDSAL interface for creating publisher DDS entities.

```
typedef.boost::shared_ptr<DDS::Publisher>.PublisherPtr;
EC_FOUNDATION_DDSAL_DECL.PublisherPtr createPublisher
  ...(
  ...DDS::DomainParticipant*       pParticipant
  );
EC_FOUNDATION_DDSAL_DECL.PublisherPtr.createPublisher
  (
  ..DDS::DomainParticipant* . .     pParticipant,
  ..const DDS::PublisherQos& .      qos
  );
EC_FOUNDATION_DDSAL_DECL.PublisherPtr.createPublisher
  ...(
  ...DDS::DomainParticipant* . .    pParticipant,
  .const DDS::PublihserQos& .       qos,
  ..DDS::PublisherListener* . .     pListener,
  ..DDS::StatusMask . . . . .       mask
  ..);
EC_FOUNDATION_DDSAL_DECL.PublisherPtr.createPublisher
  (
  DomainParticipantPtr              participantPtr
  ..);
EC_FOUNDATION_DDSAL_DECL.PublisherPtr.createPublisher
  (
  .DomainParticipantPtr . .         participantPtr,
  const-DDS::PublisherQos&          qos
  );
EC_FOUNDATION_DDSAL_DECL.PublisherPtr.createPublisher
  ..(
  ...DomainParticipantPtr . . . .   participantPtr,
  ..const-DDS::PublisherQos& .      qos,
  DDS::PublisherListener*           pListener,
  ..DD5::StatusMask . . . . . . .   mask
  ..);
```

In one embodiment, the shared pointer ensures that appropriate implementation-dependent cleanup may be done when the publisher goes out of scope. For example, there are two sets of functions that take a varying number of arguments. The first set may require a pointer to the domain participant, while the second set may require a shared pointer to the domain participant. The shared pointer variants may ensure that the domain participant remains in scope until after the publisher scope ends. If the quality-of-service value is not specified, then the default publisher quality-of-service value from the domain participant may be used.

Subscriber

Listing 10, which is an example of software code that may be used to implement an embodiment of the disclosure, shows the interface for creating subscribers, and it is located in "ddsal/ecDdsalSubscriber.h". The functions are all contained in the "EcDdsal" namespace and return a shared pointer to "DDS::Subscriber".

LISTING 10

DDSAL interface for creating subscriber DDS entities.

```
typedef.boost::shared_ptr<DDS::Subscriber>.SubscriberPtr;
EC_FOUNDATION_DDSAL_DECL.SubscriberPtr.createSubscriber
  (
  .DDS::DomainParticipant*          pParticipant
  ):
EC_FOUNDATION_DDSAL_DECL.SubscriberPtr.createSubscriber
  (
  DDS::DomainParticipant* . . .     pParticipant,
  const DDS::SubscriberQos& .       qos
  ):
EC_FOUNDATION_DDSAL_DECL.SubscriberPtr.createSubscriber
  (
  ...DDS::DomainParticipant* . .    pParticipant,
  .const DDS::SubscriberQos& .      qos
  .DDS::SubscriberListener* .       pListener,
  DDS::StatusMask .                 mask
  ):
EC_FOUNDATION_DDSAL_DECL.SubscriberPtr.createSubscriber
  (
  DomainParticipantPtr              participantPtr
  ):
EC_FOUNDATION_DDSAL_DECL.SubscriberPtr.createSubscriber
  (
  DomainParticipantPtr . . . . .    participantPtr,
  const DDS::SubscriberQos& .       qos
  ):
EC_FOUNDATION_DDSAL_DECL.SubscriberPtr.createSubscriber
  (
  DomainParticipantPtr .            participantPtr,
  const DDS::SubscriberQos& .       qos
  DDS::SubscriberListener* .        pListener,
  DDS::StatusMask                   mask
  ):
}
```

In one embodiment, the shared pointer may ensure that appropriate implementation-dependent cleanup may be done when the subscriber goes out of scope. For example, there are two sets of functions that take a varying number of arguments. The first set may require a pointer to the domain participant, while the second set may require a shared pointer to the domain participant. The shared pointer variants may ensure that the domain participant remains in scope until after the subscriber scope ends. If the quality-of-service value is not specified, then the default subscriber quality-of-service value from the domain participant may be used.

Data Writer

The interface for creating data writers may be located in "ddsal/ecDdsalDataWriter.h", and it may be subdivided into a base interface and a generic interface.

Base Interface

Listing 11, which is an example of software code that may be used to implement an embodiment of the disclosure, shows the base interface for creating data writers. The functions may all be contained in the "EcDdsal" namespace and may return a shared pointer to "DDS::DataWriter".

LISTING 11

DDSAL base interface for creating data writer DDS entities.

```
typedef.boost::shared_ptr<DDS::DataWriter>.DataWriterPtr;
EC_FOUNDATION_DDSAL_DECL.DataWriterPtr.createDataWriter
   .(
   DDS::Publisher*                    pPublisher,
   .TopicPtr . . . . .                topicPtr
   .);
EC_FOUNDATION_DDSAL_DECL.DataWriterPtr.createDataWriter
   (
   ...DDS::Publisher* . . . . . . . . . .   pPublisher,
   ...TopicPtr . . . . .              topicPtr,
   ...const-DDS::DataWriterQos& .     qos
   ...);
EC_FOUNDATION_DDSAL_DECL.DataWriterPtr.createDataWriter
   (
   ..DDS::Publisher* . . . . . . .    pPublisher,
   TopicPtr                           topicPtr,
   .const-DDS::DataWriterQos& .       qos,
   ..DDS::DataWriterListener* . .     pListener,
   ..DDS::StatusMask . . . . . . .    mask
   );
EC_FOUNDATION_DDSAL_DECL.DataWriterPtr.createDataWriter
   ...(
   ..PublisherPtr .                   publisherPtr,
   .TopicPtr . . . .                  topicPtr
   ..);
EC_FOUNDATION_DDSAL_DECL.DataWriterPtr.createDataWriter
   ...(
   PublisherPtr .                     publisherPtr,
   ..TopicPtr . . . . . . .           topicPtr,
   const-DDS::DataWriterQos&          qos
   );
EC_FOUNDATION_DDSAL_DECL.DataWriterPtr.createDataWriter
   ...(
   PublisherPtr . . . .               publisherPtr,
   TopicPtr . .                       topicPtr,
   .const-DDS::DataWriterQos&         qos,
   ..DDS::DataWriterListener* .       pListener,
   ..DDS::StatusMask . . . . . . .    mask
   .);
```

In one embodiment, the shared pointer may ensure that appropriate implementation-dependent cleanup may be done when the data writer goes out of scope. For example, there are two sets of functions that take a varying number of arguments. The first set may require a pointer to the publisher, while the second set may require a shared pointer to the publisher. The shared pointer variants may ensure that the publisher remains in scope until after the data writer scope ends. All variants may ensure that the topic remains in scope until after the data writer scope ends. If the quality-of-service value is not specified, then the default data writer quality-of-service value from the publisher may be used.

Generic Interface

Listing 12, which is an example of software code that may be used to implement an embodiment of the disclosure, shows the generic interface for creating data writers. The functions may all be contained in the "EcDdsal" namespace and may return a shared pointer to the template argument. The template argument may be the data writer class from a specific IDL-generated type support implementation.

LISTING 12

DDSAL generic interface for creating data writer DDS entities.

```
//---------------------------------------------------------------
template.<typename.T>
typename.boost::shared_ptr<T>.createDataWriter
   . . . (
   . . . DDS::Publisher*.pPublisher,
   . . . TopicPtr . . . . . . .  topicPtr
   . . . )  { . . . }
//---------------------------------------------------------------
template.<typename.T>
typename.boost::shared_ptr<T>.createDataWriter
   . . . (
   . . . DDS::Publisher* . . . . . . . . .  pPublisher,
   . . . TopicPtr . . . . . . . . . . . . .  topicPtr,
   . . . const.DDS::DataWriterQos&.qos
   . . . )  { . . . }
//---------------------------------------------------------------
template.<typename.T>
typename.boost::shared_ptr<T>.createDataWriter
   . . . (
   . . . DDS::Publisher* . . . . . . . . . .  pPublisher,
   . . . TopicPtr . . . . . . . . . . . . . .  topicPtr,
   . . . const.DDS::DataWriterQos&.qos,
   . . . DDS::DataWriterListener* . . pListener,
   . . . DDS::StatusMask . . . . . . . . . . mask
   . . . )  { . . . }
//---------------------------------------------------------------
template.<typename.T>
typename.boost::shared_ptr<T>.createDataWriter
   . . . (
   . . . PublisherPtr . . publisherPtr,
   . . . TopicPtr . . . . . topicPtr
   . . . )  { . . . }
//---------------------------------------------------------------
template.<typename.T>
typename.boost::shared_ptr<T>.createDataWriter
   . . . (
   . . . PublisherPtr . . . . . . . . . . . . . . publisherPtr,
   . . . TopicPtr . . . . . . . . . . . . . . . .  topicPtr,
   . . . const.DDS::DataWriterQos&.qos
   . . . )  { . . . }
//---------------------------------------------------------------
template.<typename.T>
typename.boost::shared_ptr<T>.createDataWriter
   . . . (
   . . . PublisherPtr . . . . . . . . . . . . . . publisherPtr.
   . . . TopicPtr . . . . . . . . . . . . . . . .  topicPtr,
   . . . const.DDS::DataWriterQos&.qos,
   . . . DDS::DataWriterListener* . . pListener,
   . . . DDS::StatusMask . . . . . . . . . . mask
   . . . )  { . . . }
```

For example, each function in the base interface may contain a corresponding function in the generic interface. The generic function may call the corresponding base function to create the data writer. Following creation, the generic function may narrow the data writer to the appropriate type and may return the narrowed shared pointer.

Data Reader

The interface for creating data readers may be located in "ddsal/ecDdsalDataReader.h", and it may be subdivided into a base interface and a generic interface.

Base Interface

Listing 13, which is an example of software code that may be used to implement an embodiment of the disclosure, shows the base interface for creating data readers. The functions may all be contained in the "EcDdsal" namespace and may return a shared pointer to "DDS::DataReader".

LISTING 13

DDSAL base interface for creating data reader DDS entities.

```
EC_FOUNDATION_DDSAL_DECL.DataReaderPtr.createDataReader
    .(
    ...SubscriberPtr . . . . . . . . . .      subscriberPtr,
    ...ContentFilteredTopicPtr .             topicPtr
    ..);
EC_FOUNDATION_DDSAL_DECL.DataReaderPtr.createDataReader
    .(
    .SubscriberPtr .                         subscriberPtr,
    .ContentFilteredTopicPtr . . .           topicPtr
    ...const DDS::DatatReaderQos& .          qos
    );
EC_FOUNDATION_DDSAL_DECL.DataReaderPtr.createDataReader
    (
    .SubscriberPtr . . . . . . .             subscriberPtr,
    ...ContentFilteredTopicPtr . . .         topicPtr,
    ...const DDS::DatatReaderQos& .          qos,
    ...DDS::DataReaderListener* . .          pListener,
    ...DDS::StatusMask . . . . . .           mask
    .);
EC_FOUNDATION_DDSAL_DECL.DataReaderPtr.createDataReader
    ..(
    ...SubscriberPtr . . . . . . . . .       subscriberPtr,
    .TopicPtr . . . . . . . . . . . . . .    topicPtr
    ...);
EC_FOUNDATION_DDSAL_DECL.DataReaderPtr.createDataReader
    .(
    ..SubscriberPtr . . . . . . . . .        subscriberPtr,
    ...TopicPtr . . . . . . . . . . . . .    topicPtr,
    ..const.DDS::DatatReaderQos& .           qos
    ...);
EC_FOUNDATION_DDSAL_DECL.DataReaderPtr.createDataReader
    .(
    .SubscriberPtr . . . . .                 subscriberPtr,
    TopicPtr . . . . . .                     topicPtr,
    const DDS::DatatReaderQos& .             qos
    ..DDS::DataReaderListener*               pListener,
    .DDS::StatusMask . . . .                 mask
    );
```

In one embodiment, the shared pointer may ensure that appropriate implementation-dependent cleanup may be done when the data reader goes out of scope. For example, there are two sets of functions, and they take a varying number of arguments. The first set, not shown in the listing to keep it brief, may require a pointer to the subscriber, while the second set may require a shared pointer to the subscriber. The shared pointer variants may ensure that the subscriber may remain in scope until after the data reader scope ends. All variants may ensure that the topic or content filtered topic remains in scope until after the data reader scope ends. If the quality-of-service value is not specified, then the default data reader quality-of-service value from the subscriber may be used.

Generic Interface

Listing 14, which is an example of software code that may be used to implement an embodiment of the disclosure, shows the generic interface for creating data readers. The functions may all be contained in the "EcDdsal" namespace and may return a shared pointer to the template argument. The template argument may be the data reader class from a specific IDL-generated type support implementation.

LISTING 14

DDSAL generic interface for creating data reader DDS entities.

```
//--------------------------------------------------------------
template.<typename.T>
typename.boost::shared_ptr<T>.createDataReader
    . . . (
    . . . SubscriberPtr . . . . . . . . .    subscriberPtr,
    . . . ContentFilteredTopicPtr.topicPtr
    . . . )   {...}
//--------------------------------------------------------------
template.<typename.T>
typename.boost::shared_ptr<T>.createDataReader
    . . . (
    . . . SubscriberPtr . . . . . . . . . . .subscriberPtr,
    . . . ContentFilteredTopicPtr . . . . .  topicPtr,
    . . . const.DDS::DataReaderQos&.qos
    . . . )   {...}
//--------------------------------------------------------------
template.<typename.T>
typename.boost::shared_ptr<T>.createDataReader
    . . . (
    . . . SubscriberPtr . . . . . . . . . . .subscriberPtr,
    . . . ContentFilteredTopicPtr . . . . .  topicPtr,
    . . . const.DDS::DataReaderQos&.qos,
    . . . DDS::DataReaderListener* . . pListener,
    . . . DDS::StatusMask . . . . . . . . . mask
    . . . )   {...}
//--------------------------------------------------------------
template.<typename.T>
typename.boost::shared_ptr<T>.createDataReader
    . . . (
    . . . SubscriberPtr.subscriberPtr,
    . . . TopicPtr . . . . topicPtr
    . . . )   {...}
//--------------------------------------------------------------
template.<typename.T>
typename.boost::shared_ptr<T>.createDataReader
    . . . (
    . . . SubscriberPtr . . . . . . . . . . .subscriberPtr,
    . . . TopicPtr . . . . . . . . . . . . . .topicPtr,
    . . . const.DDS::DataReaderQos&.qos,
    . . . )   {...}
//--------------------------------------------------------------
template.<typename.T>
typename.boost::shared_ptr<T>.createDataReader
    . . . (
    . . . SubscriberPtr . . . . . . . . . . .subscriberPtr,
    . . . TopicPtr . . . . . . . . . . . . . .topicPtr,
    . . . const.DDS::DataReaderQos&.qos,
    . . . DDS::DataReaderListener* . . pListener,
    . . . DDS::StatusMask . . . . . . . . . . mask
    . . . )   {...}
```

For example, each function in the base interface may contain a corresponding function in the generic interface. The generic function may call the corresponding base function to create the data reader. Following creation, the generic function may narrow the data reader to the appropriate type and may return the narrowed shared pointer.

Sample

Listing 15, which is an example of software code that may be used to implement an embodiment of the disclosure, shows the interface for creating a sample, and it may be located in "ddsal/impl/ecDdsalSample.h". The function may be contained in the "EcDdsal::impl" namespace, and it may return a shared pointer to a sample.

LISTING 15

DDSAL interface for creating samples.

```
//---------------------------------------------------------------------
template.<typename.TypeSupport,.typename.T>
```

LISTING 15-continued

DDSAL interface for creating samples.

```
typename.boost::shared_ptr<T>.createSample
...(
...) {...}
```

In one embodiment, the "createSample" function template may take the type support class and the sample type as template arguments. The shared pointer may ensure that appropriate implementation-dependent cleanup is done when the sample goes out of scope.

DDSAL Example

This example shows the typical usage of the DDS abstraction layer for creating both a data writer and a data reader.

Common

Listing 16, which is an example of software code that may be used to implement an embodiment of the disclosure, shows a code example that may be common for creating both data writers and data readers.

LISTING 16

Common code used for creating the data writer and the data reader.

```
// Get.the.domain.participant.factory
EcDdsal::impl::DomainParticipantFactoryPtr.dpfPtr.=
    EcDdsal::impl::participantFactory( );
.//.Create.the.domain.participant.on.domain 0
.EcDdsal::DomainParticipantPtr.participantPtr.=
    ..EcDdsal::createParticipant(dpfPtr,.0);
.//.Register.EcRapidJointDampleTypeSupport
.EcDdsal::registerType
    <EcRapidJointSampleTypeSupport>(participantPtr);
.//Get.the.type.name.from.EcRapidJointSampleTypeSupport
.const.char*.typeName.=
    ..EcDdsal::getTypeName<EcRapidJointSampleTypeSupport>( );
//.Create.a.topic for.EcRapidJointSampleTypeSupport
EcDdsal::TopicPtr topicPtr.=
    EcDdsal::createTopic(participantPtr, rapid::
    JOINT_SAMPLE_TOPIC, typeName);
```

In the example, the domain participant factory may be used to create a domain participant. A type may be registered with the new domain participant. Following type registration, a topic may be created that may be used by the data writer and the data reader.

Data Writer

Listing 17, which is an example of software code that may be used to implement an embodiment of the disclosure, shows a code example for creating a data writer that publishes a sample on a topic.

LISTING 17

Example showing how to create a data writer and publish a sample.

```
//.Create.a.publisher
.EcDdsal::PublisherPtr.publisherPtr.=
    ..EcDdsal::createPublisher(participantPtr);
.// Create.a.data.writer for.EcRapidJointSampleTypeSupport
.boost::shared_ptr<rapid::JointSampleDataWriter>.dwPtr.=
    ...EcDdsal::createDataWriter<rapid::JointSampleDataWriter>(publisherPtr,.topicPtr);
.// Create.a.sample
.boost::shared_ptr<rapid::JointSample>.samplePtr.=
    EcDdsal::impl::createSample<EcRapidJointSampleTypeSupport, rapid::JointSample>( );
.//.Fill in the sample
// ...
// Publish the sample
.dwPtr->write(*samplePtr, DDS::HANDLE_NIL);
```

In the example, the domain participant may be needed to create the publisher, and the publisher and topic may be needed to create the data writer.

Data Reader

Listing 18, which is an example of software code that may be used to implement an embodiment of the disclosure, shows a code example for creating a data writer that may listen for samples.

LISTING 18

Example showing how to create a data reader that listens for samples.

```
// Create.a.content.filtered.topic.for.EcRapidJointSampleTypeSupport
EcDdsal::ContentFilteredTopicPtr.contentFilteredTopicPtr.=
    .EcDdsal::createContentFilteredTopic
    ....(
    ....participantPtr,
    ....."K10Red_joing_sample",
    ....topicPtr,
    ....."hdr/assetName.=.'K10Red'"
    .......);
// Create.a.subscriberPtr =
.EcDdsal::SubscriberPtr.subscriberPtr =
    ...EcDdsal::createSubscriber(participantPtr);
.// Get.the.data.reader.QOS
DDS::DataReaderQos.drQos;
.subscriberPtr->get_default_datareader_qos(drQos);
// Create.a.data.reader.for.EcRapidJointSamleTypeSupport
.boost::shared_ptr<rapid::JointSampleDataReader>.drPtr.=
    .EcDdsal::createDataReader<rapid::JointSampleDataReader>
    ....(
    .......subscriberPtr,
    ...contentFilteredTopicPtr,
    .....drQos,
    .......pListener,
    EcDdsal::impl::EcDefaultStatusMask
    ):
```

In the example, a content filtered topic may be used to listen to a filtered subset of samples on a topic. The domain participant may be needed to create the content filtered topic and the subscriber. The topic may be also needed to create the content filtered topic and the subscriber. The subscriber and the content filtered topic may be needed to create the data reader.

Multi-Channel Camera Simulation

In one embodiment, DPS process 10, may perform a multi-channel camera simulation. For illustrative purposes, and discussion often eight channel camera simulation will be presented. It is understood that the above eight channel camera simulation is only an example, and any number of channels may be envisioned. The approach taken may be to apply a monochrome texture for each channel to the terrain node and then view these textures through custom OpenGL vertex and fragment shaders. The EcColorImageSensor and EcImageSensorDisplay classes may be used to complete the implementation. The main challenge may lay in allowing the new multi-texture camera to view the applied textures with all other cameras viewing the scene normally. For example, to achieve this, a shallow copy of user specified geometry nodes may be created with a unique node mask bit (0x0800000). The display mask of the multi-texture camera may be then set to view only nodes with the node mask with the 0x080000 bit set. An exemplary result may be illustrated in FIG. 47, which shows a multi-texture camera set to view channel 1 on the right and main window view on the left. In this case, channel 1 shows the texture marked with "1".

Figure 48:
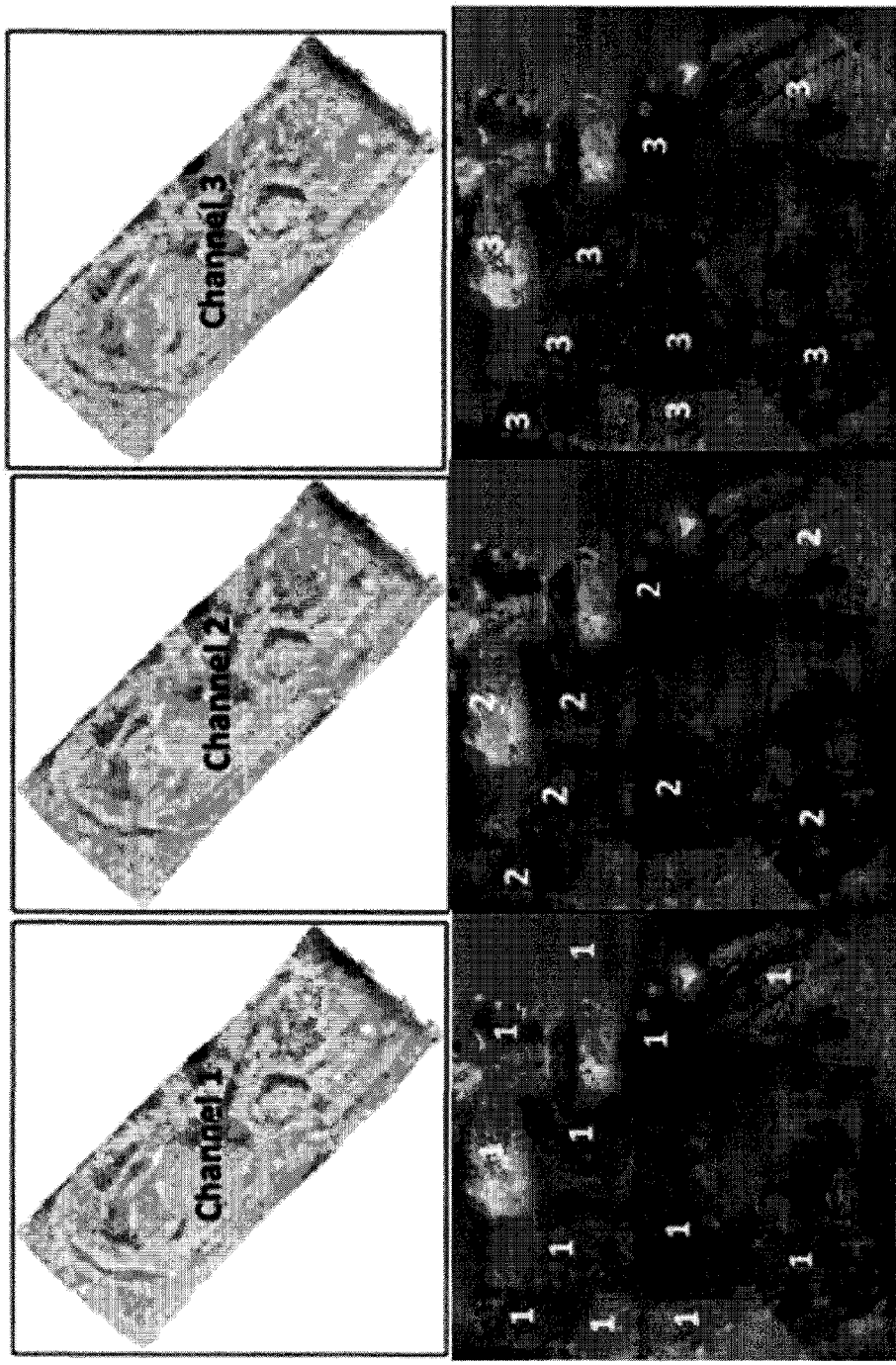
FIG. 48 depicts a diagram consistent with the processes of the present disclosure.

The multi-texture camera implementation approach may adhere to the following steps:
1. Create a new EcImageSensorDisplay based on the parameters read in from the multi-texture camera xml file.
2. Attach the custom vertex and fragment shaders (Text Box 1 and Text Box 2) to the new display and set the display mask to 0x0800000. It is understood that the custom vertex and fragment shaders presented in Text Box 1 and 2 are examples of software code that may be used to implement an embodiment of the disclosure.
3. Create a texture uniform for sampling and a integer uniform for channel selection
4. Identify and make a shallow copy of each EcMultiTextureNode defined by the user in the EcMultiTextureCamera xml file, and add the copies at the same level as the original nodes, then set the node mask to 0x0800000.
5. Load eight single channel images from file and combine into two RGBA four channel images for each node (see FIG. 48).
6. Create two textures from the RGBA images and apply to texture units 0 and 1 of each node

TEXT BOX 1

Vertex shader.

```
static const EcString vertexShaderSource =
"#version 130\n"
"void main ( )\n"
"{\n"
"  gl_Position = ftransform ( ) ;\n"
"  gl_TexCoord[0] = gl_TextureMatrix[0] * gl_MultiTexCoord0;\n"
"  gl_TexCoord[1] = gl_TextureMatrix[1] * gl_MultiTexCoord1;\n"
"}\n";
```

TEXT BOX 2

Fragment shader using texture sampler uniform for RGBA texture selection and integer uniform for channel selection.

```
static const EcString fragmentShaderSourceChannelSelector =
"#version 130\n"
"uniform sampler2D texArray; \n"
"uniform int channel; \n"
"\n"
"void main ( )\n"
"{\n"
"  int chanIndex = channel % 4; \n"
```

TEXT BOX 2-continued

Fragment shader using texture sampler uniform for RGBA texture selection and integer uniform for channel selection.

```
"  vec4 pixel = texture(texArray, gl_TexCoord[0] .xy) ; \n"
"  gl_FragColor = vec4 (pixel [chanIndex] , pixel [chanIndex] ,
   pixel[chanIndex], 1.0) ; \n"
"}\n";
```

In one embodiment, the multiTextureCameraPlugin may be created to demonstrate the camera in Actin Viewer with the proxy_simulation/data/proxySimulation.ecx model. Once the plugin is loaded it may create a camera and may apply eight sample texture images to the terrain geometry node and rock geometry node. The terrain images may be derived from the proxy_simulation/data/AmesMarsScape.10 cm.ortho.tif, and the rock images may be derived from proxy_simulation/data/jewlfull.jpg. By default the camera may be attached to the K10's base link at an offset placing it high above and overlooking the terrain so the change in textures will be apparent.

In one embodiment, a DDS plugin (multiTextureCameraDdsPlugin) may also be created to allow objects to subscribe to the stream of images taken by the multi-texture camera. DDS topics may be created for each of the camera's eight channels and may be named as follows: rapid_imagesensor_sample-<manipLabel>MultiTextureCamera-ch<channelIndex>, where <manipLabel> is the label of the manipulator to which the camera is attached and <channelIndex> is the index from 0-7 of the channel.

The proxy simulation tool may have application to third-party robotic work and missions, such as, NASA's robotic missions. Additionally/alternatively, since DPS process 10, may be developed as a toolkit, with modules that may be reused, it may also have the potential for broader application for lunar and planetary exploration.

Although the NASA is robotic hardware (e.g., K10 an ATHLETE) were used above applicability of DPS process 10, may be used outside of NASA robotic hardware and may support robotic systems developers across the spectrum of robotics domains, from defense to home use. DPS process 10 may also be integrated in other software products as an add-on. Additionally/alternatively, by linking the software libraries into third-party code, developers may have full access to all the capability provided by the toolkit. The new capability may allow developers to leverage terrains and remote-control technologies into new applications.

Figure 49:
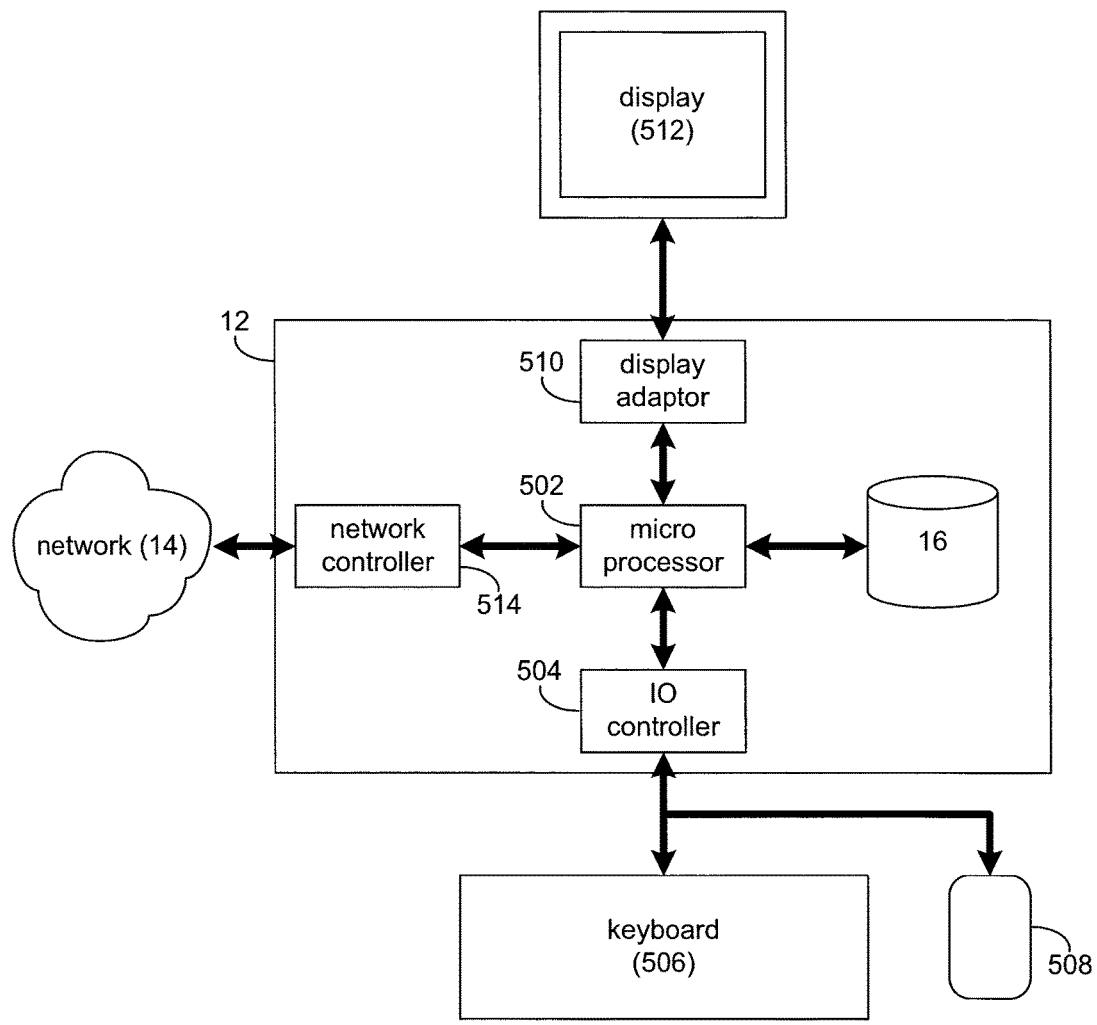
FIG. 49 is a diagrammatic view of the computing device of FIG. 1, according to an implementation of the present disclosure.

Referring also to FIG. 49, there is shown a diagrammatic view of computing system 12. While computing system 12 is shown in this figure, this is for illustrative purposes only and is not intended to be a limitation of this disclosure, as other configuration are possible. For example, any computing device capable of executing, in whole or in part, DPS process 10 may be substituted for computing device 12 within FIG. 5, examples of which may include but are not limited to client electronic devices 28, 30, 32, 34.

Computing system 12 may include microprocessor 502 configured to e.g., process data and execute instructions/code for screen capture process 10. Microprocessor 502 may be coupled to storage device 16. As discussed above, examples of storage device 16 may include but are not limited to: a hard disk drive; a tape drive; an optical drive; a RAID device; an NAS device, a Storage Area Network, a random access memory (RAM); a read-only memory (ROM); and all forms of flash memory storage devices. IO controller 504 may be configured to couple Microprocessor 502 with various devices, such as keyboard 506, mouse 508, USB ports (not shown), and printer ports (not shown). Display adaptor 510 may be configured to couple display 512 (e.g., a CRT or LCD monitor) with microprocessor 502, while network adapter 514 (e.g., an Ethernet adapter) may be configured to couple Microprocessor 502 to network 14 (e.g., the Internet or a local area network).

As will be appreciated by one skilled in the art, the present disclosure may be embodied as a method (e.g., executing in whole or in part on computing device 12), a system (e.g., computing device 12), or a computer program product (e.g., encoded within storage device 16). Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium (e.g., storage device 16) having computer-usable program code embodied in the medium.

Any suitable computer usable or computer readable medium (e.g., storage device 16) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium may include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. The computer-usable or computer-readable medium may also be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to the Internet, wireline, optical fiber cable, RF, etc.

Computer program code for carrying out operations of the present disclosure may be written in an object oriented programming language such as Java, C#.NET, PHP, C++ or the like. However, the computer program code for carrying out operations of the present disclosure may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network/a wide area network/the Internet (e.g., network 14).

The present disclosure is described with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, may be implemented by computer program instructions. These computer program instructions may be provided to a processor (e.g., processor 502) of a general purpose computer/special purpose computer/other programmable data processing apparatus (e.g., computing device 12), such that the instructions, which execute via the processor (e.g., processor 200) of the computer or other programmable data processing apparatus, create means for implementing the functions/acts specified in the flowchart and/or block diagram block or blocks.

These computer program instructions may also be stored in a computer-readable memory (e.g., storage device 16) that may direct a computer (e.g., computing device 12) or other programmable data processing apparatus to function in a particular manner, such that the instructions stored in the computer-readable memory produce an article of manufacture including instruction means which implement the function/act specified in the flowchart and/or block diagram block or blocks.

The computer program instructions may also be loaded onto a computer (e.g., computing device 12) or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

The flowcharts and block diagrams in the figures may illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, may be implemented by special purpose hardware-based systems that perform the specified functions or acts, or combinations of special purpose hardware and computer instructions.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

Having thus described the disclosure of the present application in detail and by reference to embodiments thereof, it will be apparent that modifications and variations are possible without departing from the scope of the disclosure defined in the appended claims.

What is claimed is:

1. A computer-implemented method comprising:
   creating, by one or more processors, a digital proxy simulation for a robotic hardware wherein the digital proxy simulation and the robotic hardware share a network interface;
   providing, by one or more processors, a user with an option to switch between the robotic hardware and the digital proxy simulation; and
   upon receiving a user selection, executing, by one or more processors, the switch between the robotic hardware and the digital proxy simulation, wherein executing the switch includes transferring sensor or user-interface driven input and output signals during or before operation between the digital proxy simulation and the robotic hardware, wherein the digital proxy simulation includes receiving a plurality of channel images for multi-channel camera simulation, wherein, after the switch, the user is controlling one of the robotic hardware or the digital proxy simulation but not both at a given point in time.

2. The method of claim 1, wherein the robotic hardware is at least one of a mobile robot, a fixed base articulated serial manipulator, a moving base articulated serial manipulator, a fixed base articulated robot with branching links, and a moving base articulated robot with branching links.

3. The method of claim 1, wherein the digital proxy simulation includes, at least in part, a sensor simulation, a kinematic simulation, a dynamic simulation, and an environment simulation.

4. The method of claim 1, further includes executing, by one or more processors, the digital proxy simulation using at least one of network communications and network communications over the Internet.

5. The method of claim 4, wherein the network communications and the network communication over the Internet are provided using Data Distribution Service (DDS) for real-time systems.

6. The method of claim 1, wherein the robotic hardware and the digital proxy simulation have the same network interface.

7. The method of claim 3, wherein the environment simulation includes, at least in part, a terrain simulation and an interaction with the robotic hardware.

8. The method of claim 1, wherein the movement of the robotic hardware is rendered at least on one of a computer and a handheld electronic device.

9. The method of claim 3, wherein the dynamic simulation includes numerical integration of Newton's and Euler's dynamic equations for moving parts.

10. A computer program product comprising a non-transitory computer readable medium having a plurality of instructions stored thereon, which, when executed by a processor, cause the processor to perform operations including:
    creating a digital proxy simulation for a robotic hardware wherein the digital proxy simulation and the robotic hardware share a network interface;
    providing a user with an option to switch between the robotic hardware and the digital proxy simulation; and
    upon receiving a user selection, executing the switch between the robotic hardware and the digital proxy simulation, wherein executing the switch includes transferring sensor or user-interface driven input and output signals during or before operation between the digital proxy simulation and the robotic hardware, wherein the robotic hardware includes one or more of a stereo camera and a lidar sensor, wherein, after the switch, the user is controlling one of the robotic hardware or the digital proxy simulation but not both at a given point in time.

11. The computer program product of claim 10, wherein the robotic hardware is at least one of a mobile robot, a fixed base articulated serial manipulator, a moving base articulated serial manipulator, a fixed base articulated robot with branching links, and a moving base articulated robot with branching links.

12. The computer program product of claim 10, wherein the digital proxy simulation includes, at least in part, a sensor simulation, a kinematic simulation, a dynamic simulation, and an environment simulation.

13. The computer program product of claim 10, further includes executing, by one or more processors, the digital proxy simulation using at least one of network communications and network communications over the Internet.

14. The computer program product of claim 13, wherein the network communications and the network communication over the Internet are provided using Data Distribution Service (DDS) for real-time systems.

15. The computer program product of claim 10, wherein the robotic hardware and the digital proxy simulation have the same network interface.

16. The computer program product of claim 12, wherein the environment simulation includes, at least in part, a terrain simulation and an interaction with the robotic hardware.

17. The computer program product of claim 10, wherein the movement of the robotic hardware is rendered at least on one of a computer and a handheld electronic device.

18. The computer program product of claim 12, wherein the dynamic simulation includes numerical integration of Newton's and Euler's dynamic equations for moving parts.

19. A computing system comprising:
    at least one processor, and at least one memory architecture coupled with the at least one processor; the at least one processor configured to:
    create a digital proxy simulation for a robotic hardware wherein the digital proxy simulation and the robotic hardware share a network interface;
    provide a user with an option to switch between the robotic hardware and the digital proxy simulation; and upon receiving a user selection, execute the switch between the robotic hardware and the digital proxy simulation, wherein executing the switch includes transferring sensor or user-interface driven input and output signals during or before operation between the digital proxy simulation and the robotic hardware, wherein the robotic hardware includes one or more of a stereo camera and a lidar sensor, wherein, after the switch, the user is controlling one of the robotic hardware or the digital proxy simulation but not both at a given point in time.

20. The computing system of claim 19, wherein the robotic hardware is at least one of a mobile robot, a fixed base articulated serial manipulator, a moving base articulated serial manipulator, a fixed base articulated robot with branching links, and a moving base articulated robot with branching links.

21. The computing system of claim 19, wherein the digital proxy simulation includes, at least in part, a sensor simulation, a kinematic simulation, a dynamic simulation, and an environment simulation.

22. The computing system of claim 19, further includes executing, by one or more processors, the digital proxy simulation using at least one of network communications and network communications over the Internet.

23. The computing system of claim 22, wherein the network communications and the network communication over the Internet are provided using Data Distribution Service (DDS) for real-time systems.

24. The computing system of claim 19, wherein the robotic hardware and the digital proxy simulation have the same network interface.

25. The computing system of claim 21, wherein the environment simulation includes, at least in part, a terrain simulation and an interaction with the robotic hardware.

26. The computing system of claim 19, wherein the movement of the robotic hardware is rendered at least on one of a computer and a handheld electronic device.

27. The computing system of claim 21, wherein the dynamic simulation includes numerical integration of Newton's and Euler's dynamic equations for moving parts.

28. The method of claim 1, wherein digital proxy simulation includes:
- receiving, by one or more processors, at least one channel image for multi-channel camera simulation;
- applying, by one or more processors, one or more textures to a terrain node for each channel image; and
- viewing, by one or more processors, the one or more textures through one or more of a custom vertex shader and a custom fragment shader.

* * * * *